(12) United States Patent
Yamazaki et al.

(10) Patent No.: US 10,868,046 B2
(45) Date of Patent: Dec. 15, 2020

(54) SEMICONDUCTOR DEVICE APPLYING AN OXIDE SEMICONDUCTOR

(71) Applicant: Semiconductor Energy Laboratory Co., Ltd., Atsugi (JP)

(72) Inventors: Shunpei Yamazaki, Setagaya (JP); Jun Koyama, Sagamihara (JP); Hiroyuki Miyake, Atsugi (JP)

(73) Assignee: Semiconductor Energy Laboratory Co., Ltd., Kanagawa (JP)

( * ) Notice: Subject to any disclaimer, the term of this patent is extended or adjusted under 35 U.S.C. 154(b) by 0 days.

(21) Appl. No.: 16/277,026

(22) Filed: Feb. 15, 2019

(65) Prior Publication Data

US 2019/0181160 A1 Jun. 13, 2019

Related U.S. Application Data

(63) Continuation of application No. 14/807,168, filed on Jul. 23, 2015, now Pat. No. 10,249,647, which is a
(Continued)

(30) Foreign Application Priority Data

Nov. 6, 2009 (JP) .................................. 2009-255315

(51) Int. Cl.
*H01L 27/12* (2006.01)
*H01L 29/04* (2006.01)
(Continued)

(52) U.S. Cl.
CPC .......... *H01L 27/1229* (2013.01); *G09G 3/20* (2013.01); *G11C 19/28* (2013.01);
(Continued)

(58) Field of Classification Search
CPC ............ H01L 27/1225; H01L 27/1229; H01L 29/7869; H01L 29/78696
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

CN 001941299 A 4/2007
EP 1737044 A 12/2006
(Continued)

OTHER PUBLICATIONS

International Search Report (Application No. PCT/JP2010/068105) dated Dec. 14, 2010.
(Continued)

*Primary Examiner* — Stephen M Bradley
(74) *Attorney, Agent, or Firm* — Robinson Intellectual Property Law Office; Eric J. Robinson

(57) ABSTRACT

An object of an embodiment of the present invention is to manufacture a semiconductor device with high display quality and high reliability, which includes a pixel portion and a driver circuit portion capable of high-speed operation over one substrate, using transistors having favorable electric characteristics and high reliability as switching elements. Two kinds of transistors, in each of which an oxide semiconductor layer including a crystalline region on one surface side is used as an active layer, are formed in a driver circuit portion and a pixel portion. Electric characteristics of the transistors can be selected by choosing the position of the gate electrode layer which determines the position of the channel. Thus, a semiconductor device including a driver
(Continued)

circuit portion capable of high-speed operation and a pixel portion over one substrate can be manufactured.

33 Claims, 26 Drawing Sheets

Related U.S. Application Data continuation of application No. 14/156,845, filed on Jan. 16, 2014, now Pat. No. 9,093,544, which is a continuation of application No. 12/938,402, filed on Nov. 3, 2010, now Pat. No. 8,633,480.

(51) Int. Cl.
| | |
|---|---|
| *H01L 29/417* | (2006.01) |
| *H01L 29/423* | (2006.01) |
| *H01L 29/10* | (2006.01) |
| *H01L 29/45* | (2006.01) |
| *H01L 29/24* | (2006.01) |
| *G09G 3/20* | (2006.01) |
| *G11C 19/28* | (2006.01) |
| *H01L 29/786* | (2006.01) |
| *H01L 27/32* | (2006.01) |

(52) U.S. Cl.
CPC ...... *H01L 27/1225* (2013.01); *H01L 27/1251* (2013.01); *H01L 29/045* (2013.01); *H01L 29/1033* (2013.01); *H01L 29/24* (2013.01); *H01L 29/247* (2013.01); *H01L 29/41733* (2013.01); *H01L 29/42372* (2013.01); *H01L 29/45* (2013.01); *H01L 29/7869* (2013.01); *H01L 29/78648* (2013.01); *H01L 29/78693* (2013.01); *G09G 2310/0267* (2013.01); *G09G 2310/0275* (2013.01); *G09G 2310/0286* (2013.01); *H01L 27/3262* (2013.01)

(56) References Cited

U.S. PATENT DOCUMENTS

| | | | |
|---|---|---|---|
| 5,898,188 | A | 4/1999 | Koyama et al. |
| 6,294,274 | B1 | 9/2001 | Kawazoe et al. |
| 6,350,995 | B1 | 2/2002 | Sung et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,093,544 | B1 | 8/2006 | Allen et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,298,084 | B2 | 11/2007 | Baude et al. |
| 7,323,356 | B2 | 1/2008 | Hosono et al. |
| 7,339,187 | B2 | 3/2008 | Wager, III et al. |
| 7,348,631 | B2 | 3/2008 | Hotta |
| 7,378,711 | B2 | 5/2008 | Suh et al. |
| 7,381,579 | B2 | 6/2008 | Suh et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,432,138 | B2 | 10/2008 | Hotta |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,511,343 | B2 | 3/2009 | Li et al. |
| 7,579,199 | B2 | 8/2009 | Suh et al. |
| 7,598,520 | B2 | 10/2009 | Hirao et al. |
| 7,601,984 | B2 | 10/2009 | Sano et al. |
| 7,674,650 | B2 | 3/2010 | Akimoto et al. |
| 7,719,185 | B2 | 5/2010 | Jin et al. |
| 7,732,251 | B2 | 6/2010 | Hoffman et al. |
| 7,732,819 | B2 | 6/2010 | Akimoto et al. |
| 7,745,798 | B2 | 6/2010 | Takahashi |
| 7,749,825 | B2 | 7/2010 | Honda |
| 7,767,505 | B2 | 8/2010 | Son et al. |
| 7,791,072 | B2 | 9/2010 | Kumomi et al. |
| 7,807,515 | B2 | 10/2010 | Kato et al. |
| 7,838,328 | B2 | 11/2010 | Isa |
| 7,851,792 | B2 | 12/2010 | Aiba et al. |
| 7,884,360 | B2 | 2/2011 | Takechi et al. |
| 7,893,431 | B2 | 2/2011 | Kim et al. |
| 7,893,495 | B2 | 2/2011 | Li et al. |
| 7,907,224 | B2 | 3/2011 | Ito et al. |
| 7,910,490 | B2 | 3/2011 | Akimoto et al. |
| 7,932,521 | B2 | 4/2011 | Akimoto et al. |
| 7,935,964 | B2 | 5/2011 | Kim et al. |
| 7,977,169 | B2 | 7/2011 | Hirao et al. |
| 7,978,274 | B2 | 7/2011 | Umezaki et al. |
| 7,993,964 | B2 | 8/2011 | Hirao et al. |
| 7,994,500 | B2 | 8/2011 | Kim et al. |
| 7,998,372 | B2 | 8/2011 | Yano et al. |
| 8,013,331 | B2 | 9/2011 | Wakita |
| 8,158,974 | B2 | 4/2012 | Yano et al. |
| 8,168,544 | B2 | 5/2012 | Chang |
| 8,193,045 | B2 | 6/2012 | Omura et al. |
| 8,202,365 | B2 | 6/2012 | Umeda et al. |
| 8,207,756 | B2 | 6/2012 | Shionoiri et al. |
| 8,222,098 | B2 | 7/2012 | Honda |
| 8,232,552 | B2 | 7/2012 | Yano et al. |
| 8,236,635 | B2 | 8/2012 | Suzawa et al. |
| 8,242,494 | B2 | 8/2012 | Suzawa et al. |
| 8,274,077 | B2 | 9/2012 | Akimoto et al. |
| 8,274,078 | B2 | 9/2012 | Itagaki et al. |
| 8,304,765 | B2 | 11/2012 | Yamazaki et al. |
| 8,304,773 | B2 | 11/2012 | Shimada |
| 8,305,304 | B2 | 11/2012 | Kimura |
| 8,309,961 | B2 | 11/2012 | Yamazaki et al. |
| 8,319,215 | B2 | 11/2012 | Yamazaki et al. |
| 8,329,506 | B2 | 12/2012 | Akimoto et al. |
| 8,343,799 | B2 | 1/2013 | Ito et al. |
| 8,354,674 | B2 | 1/2013 | Kimura |
| 8,405,161 | B2 | 3/2013 | Park et al. |
| 8,420,442 | B2 | 4/2013 | Takechi et al. |
| 8,421,070 | B2 | 4/2013 | Kim et al. |
| 8,461,583 | B2 | 6/2013 | Yano et al. |
| 8,466,463 | B2 | 6/2013 | Akimoto et al. |
| 8,513,678 | B2 | 8/2013 | Yamazaki |
| 8,520,159 | B2 | 8/2013 | Umezaki et al. |
| 8,563,977 | B2 | 10/2013 | Shimada et al. |
| 8,629,069 | B2 | 1/2014 | Akimoto et al. |
| 8,633,480 | B2 | 1/2014 | Yamazaki et al. |
| 8,669,550 | B2 | 3/2014 | Akimoto et al. |
| 8,723,175 | B2 | 5/2014 | Yano et al. |
| 8,735,882 | B2 | 5/2014 | Kim et al. |
| 8,779,419 | B2 | 7/2014 | Yano et al. |
| 8,785,990 | B2 | 7/2014 | Honda |
| 8,790,959 | B2 | 7/2014 | Akimoto et al. |
| 8,791,457 | B2 | 7/2014 | Yano et al. |
| 8,791,929 | B2 | 7/2014 | Kimura |
| 8,796,069 | B2 | 8/2014 | Akimoto et al. |
| 8,889,480 | B2 | 11/2014 | Takechi et al. |
| 9,093,544 | B2 | 7/2015 | Yamazaki et al. |
| 9,099,562 | B2 | 8/2015 | Akimoto et al. |
| 9,130,049 | B2 | 9/2015 | Sano et al. |
| 9,209,026 | B2 | 12/2015 | Takechi et al. |
| 9,312,393 | B2 | 4/2016 | Honda |
| 9,431,574 | B2 | 8/2016 | Yamazaki |
| 9,583,637 | B2 | 2/2017 | Sano et al. |
| 9,824,626 | B2 | 11/2017 | Kimura |
| 10,304,962 | B2 | 5/2019 | Akimoto et al. |
| 10,615,287 | B2 | 4/2020 | Sano et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0023432 | A1 | 2/2004 | Haga |

(56) References Cited

U.S. PATENT DOCUMENTS

| | | |
|---|---|---|
| 2004/0038446 A1 | 2/2004 | Takeda et al. |
| 2004/0051109 A1 | 3/2004 | Ishizaki et al. |
| 2004/0127038 A1 | 7/2004 | Carcia et al. |
| 2004/0189373 A1 | 9/2004 | Sekigawa et al. |
| 2005/0017244 A1 | 1/2005 | Hoffman et al. |
| 2005/0017302 A1 | 1/2005 | Hoffman |
| 2005/0199959 A1 | 9/2005 | Chiang et al. |
| 2005/0199960 A1 | 9/2005 | Hoffman et al. |
| 2005/0275038 A1 | 12/2005 | Shih et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0141685 A1* | 6/2006 | Kim .................. H01L 27/1214 438/149 |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0017689 A1 | 1/2007 | Polidori |
| 2007/0024187 A1 | 2/2007 | Shin et al. |
| 2007/0046191 A1 | 3/2007 | Saito |
| 2007/0051958 A1 | 3/2007 | Yamazaki et al. |
| 2007/0052025 A1 | 3/2007 | Yabuta |
| 2007/0054507 A1 | 3/2007 | Kaji et al. |
| 2007/0057261 A1 | 3/2007 | Jeong et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0111411 A1 | 5/2007 | Hotta |
| 2007/0115219 A1 | 5/2007 | Inoue |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252147 A1 | 11/2007 | Kim et al. |
| 2007/0252928 A1 | 11/2007 | Ito et al. |
| 2007/0272922 A1 | 11/2007 | Kim et al. |
| 2007/0287221 A1* | 12/2007 | Ong .................. H01L 21/02554 438/104 |
| 2007/0287296 A1 | 12/2007 | Chang |
| 2008/0006877 A1 | 1/2008 | Mardilovich et al. |
| 2008/0023698 A1 | 1/2008 | Li et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0079001 A1 | 4/2008 | Umezaki et al. |
| 2008/0083950 A1 | 4/2008 | Pan et al. |
| 2008/0106191 A1 | 5/2008 | Kawase |
| 2008/0116457 A1 | 5/2008 | Park et al. |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0203387 A1* | 8/2008 | Kang .................. H01L 29/7869 257/43 |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0284933 A1 | 11/2008 | Ito et al. |
| 2008/0296567 A1 | 12/2008 | Irving et al. |
| 2008/0296568 A1 | 12/2008 | Ryu et al. |
| 2008/0299702 A1 | 12/2008 | Son et al. |
| 2008/0308796 A1 | 12/2008 | Akimoto et al. |
| 2008/0308797 A1 | 12/2008 | Akimoto et al. |
| 2008/0308805 A1 | 12/2008 | Akimoto et al. |
| 2008/0308806 A1 | 12/2008 | Akimoto et al. |
| 2009/0001452 A1 | 1/2009 | Takano et al. |
| 2009/0002590 A1 | 1/2009 | Kimura |
| 2009/0008638 A1 | 1/2009 | Kang et al. |
| 2009/0008639 A1 | 1/2009 | Akimoto et al. |
| 2009/0068773 A1 | 3/2009 | Lai et al. |
| 2009/0072232 A1 | 3/2009 | Hayashi et al. |
| 2009/0072233 A1 | 3/2009 | Hayashi et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0189153 A1 | 7/2009 | Iwasaki et al. |
| 2009/0189155 A1 | 7/2009 | Akimoto |
| 2009/0189156 A1 | 7/2009 | Akimoto |
| 2009/0237000 A1 | 9/2009 | Inoue |
| 2009/0239335 A1 | 9/2009 | Akimoto et al. |
| 2009/0269880 A1* | 10/2009 | Itagaki ................ H01L 29/7869 438/104 |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0051949 A1 | 3/2010 | Yamazaki et al. |
| 2010/0065839 A1 | 3/2010 | Yamazaki et al. |
| 2010/0065840 A1 | 3/2010 | Yamazaki et al. |
| 2010/0065844 A1 | 3/2010 | Tokunaga |
| 2010/0072467 A1 | 3/2010 | Yamazaki et al. |
| 2010/0079169 A1 | 4/2010 | Kim et al. |
| 2010/0084648 A1 | 4/2010 | Watanabe |
| 2010/0084650 A1 | 4/2010 | Yamazaki et al. |
| 2010/0092800 A1 | 4/2010 | Itagaki et al. |
| 2010/0102312 A1 | 4/2010 | Yamazaki et al. |
| 2010/0105163 A1 | 4/2010 | Ito et al. |
| 2010/0109002 A1* | 5/2010 | Itagaki .................. H01L 29/247 257/43 |
| 2010/0117075 A1 | 5/2010 | Akimoto et al. |
| 2010/0117999 A1 | 5/2010 | Matsunaga et al. |
| 2010/0123130 A1 | 5/2010 | Akimoto et al. |
| 2010/0123136 A1 | 5/2010 | Lee et al. |
| 2010/0136743 A1 | 6/2010 | Akimoto et al. |
| 2010/0155717 A1 | 6/2010 | Yano et al. |
| 2010/0193782 A1 | 8/2010 | Sakata |
| 2010/0193785 A1 | 8/2010 | Kimura |
| 2010/0213459 A1 | 8/2010 | Shimada et al. |
| 2010/0219411 A1 | 9/2010 | Hoffman et al. |
| 2010/0244022 A1* | 9/2010 | Takahashi ......... H01L 29/78648 257/43 |
| 2010/0264403 A1 | 10/2010 | Sirringhaus et al. |
| 2010/0276688 A1 | 11/2010 | Yano et al. |
| 2010/0295042 A1 | 11/2010 | Yano et al. |
| 2010/0301329 A1 | 12/2010 | Asano et al. |
| 2010/0320458 A1 | 12/2010 | Umeda et al. |
| 2010/0320459 A1 | 12/2010 | Umeda et al. |
| 2011/0031499 A1 | 2/2011 | Kimura et al. |
| 2011/0050733 A1 | 3/2011 | Yano et al. |
| 2011/0062433 A1 | 3/2011 | Yamazaki |
| 2011/0062436 A1 | 3/2011 | Yamazaki et al. |
| 2011/0068335 A1 | 3/2011 | Yamazaki et al. |
| 2011/0084266 A1 | 4/2011 | Yamazaki et al. |
| 2011/0084271 A1 | 4/2011 | Yamazaki et al. |
| 2011/0104851 A1 | 5/2011 | Akimoto et al. |
| 2011/0109351 A1 | 5/2011 | Yamazaki et al. |
| 2011/0117697 A1 | 5/2011 | Akimoto et al. |
| 2011/0117698 A1 | 5/2011 | Suzawa et al. |
| 2011/0121290 A1 | 5/2011 | Akimoto et al. |
| 2011/0193083 A1 | 8/2011 | Kim et al. |
| 2011/0215328 A1 | 9/2011 | Morosawa et al. |
| 2012/0119205 A1 | 5/2012 | Taniguchi et al. |

(56) References Cited

U.S. PATENT DOCUMENTS

| | | |
|---|---|---|
| 2012/0132911 A1 | 5/2012 | Shimada et al. |
| 2012/0256179 A1 | 10/2012 | Yamazaki et al. |
| 2013/0341616 A1 | 12/2013 | Umezaki et al. |
| 2014/0070211 A1 | 3/2014 | Iwasaki et al. |
| 2015/0340513 A1 | 11/2015 | Akimoto et al. |
| 2019/0051759 A1 | 2/2019 | Akimoto et al. |
| 2019/0326444 A1 | 10/2019 | Akimoto et al. |

FOREIGN PATENT DOCUMENTS

| | | |
|---|---|---|
| EP | 1770788 A | 4/2007 |
| EP | 1921681 A | 5/2008 |
| EP | 1995787 A | 11/2008 |
| EP | 1998373 A | 12/2008 |
| EP | 1998374 A | 12/2008 |
| EP | 1998375 A | 12/2008 |
| EP | 2068367 A | 6/2009 |
| EP | 2149910 A | 2/2010 |
| EP | 2149911 A | 2/2010 |
| EP | 2226847 A | 9/2010 |
| EP | 2453480 A | 5/2012 |
| EP | 2453481 A | 5/2012 |
| EP | 2455975 A | 5/2012 |
| EP | 3614442 A | 2/2020 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-249778 A | 9/1995 |
| JP | 08-023104 A | 1/1996 |
| JP | 08-264794 A | 10/1996 |
| JP | 11-054761 A | 2/1999 |
| JP | 11-121761 A | 4/1999 |
| JP | 11-505377 | 5/1999 |
| JP | 2000-026119 A | 1/2000 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-041362 A | 2/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-244240 A | 9/2005 |
| JP | 2006-165529 A | 6/2006 |
| JP | 2006-332551 A | 12/2006 |
| JP | 2007-096055 A | 4/2007 |
| JP | 2007-123861 A | 5/2007 |
| JP | 2007-134687 A | 5/2007 |
| JP | 2007-142195 A | 6/2007 |
| JP | 2007-158307 A | 6/2007 |
| JP | 2007-220820 A | 8/2007 |
| JP | 2007-281409 A | 10/2007 |
| JP | 2008-042088 A | 2/2008 |
| JP | 2008-098637 A | 4/2008 |
| JP | 2008-107807 A | 5/2008 |
| JP | 2008-243928 A | 10/2008 |
| JP | 2008-286911 A | 11/2008 |
| JP | 2009-016469 A | 1/2009 |
| JP | 2009-016844 A | 1/2009 |
| JP | 2009-021612 A | 1/2009 |
| JP | 2009-033145 A | 2/2009 |
| JP | 2009-076877 A | 4/2009 |
| JP | 2009-099847 A | 5/2009 |
| JP | 2009-099944 A | 5/2009 |
| JP | 2009-141001 A | 6/2009 |
| JP | 2009-167087 A | 7/2009 |
| JP | 2009-528670 | 8/2009 |
| JP | 2009-533884 | 9/2009 |
| JP | 2009-224479 A | 10/2009 |
| JP | 2009-237558 A | 10/2009 |
| JP | 2009-260378 A | 11/2009 |
| JP | 2010-177431 A | 8/2010 |
| KR | 2008-0033127 A | 4/2008 |
| KR | 2008-0046508 A | 5/2008 |
| KR | 2008-0101732 A | 11/2008 |
| KR | 2009-0095519 A | 9/2009 |
| TW | 200915579 | 4/2009 |
| WO | WO-2004/114391 | 12/2004 |
| WO | WO-2005/093850 | 10/2005 |
| WO | WO-2006/051993 | 5/2006 |
| WO | WO-2007/017689 | 2/2007 |
| WO | WO-2007/032294 | 3/2007 |
| WO | WO-2007/043493 | 4/2007 |
| WO | WO-2007/055256 | 5/2007 |
| WO | WO-2007/058231 | 5/2007 |
| WO | WO-2007/108293 | 9/2007 |
| WO | WO-2007/120010 | 10/2007 |
| WO | WO-2007/139009 | 12/2007 |
| WO | WO-2007/142167 | 12/2007 |
| WO | WO-2007/148601 | 12/2007 |
| WO | WO-2008/117739 | 10/2008 |
| WO | WO-2008/117810 | 10/2008 |
| WO | WO-2008/126879 | 10/2008 |
| WO | WO-2008/126884 | 10/2008 |
| WO | WO-2008/133345 | 11/2008 |
| WO | WO-2008/149873 | 12/2008 |
| WO | WO-2009/034953 | 3/2009 |
| WO | WO-2009/041544 | 4/2009 |
| WO | WO-2009/072533 | 6/2009 |
| WO | WO-2009/081885 | 7/2009 |
| WO | WO-2009/093625 | 7/2009 |
| WO | WO-2009/093722 | 7/2009 |

OTHER PUBLICATIONS

Written Opinion (Application No. PCT/JP2010/068105) dated Dec. 14, 2010.

Fortunato.E et al., "Wide-BANDGAP High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m = 3, 4, and 5), $InGaO_3(ZnO)3$, and $Ga_2O_3(ZnO)m$ (m = 7, 8, 9, and 16) in the $In_2O_3$—$ZnGa_2O_4$—ZnO System", Journal of Solid State Chemistry, Apr. 1, 1995, vol. 116, No. 1, pp. 170-178.

(56) References Cited

OTHER PUBLICATIONS

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In-Ga-Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites For Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "SPINEL,YbFe2O4, and Yb2Fe3O7 Types of Structures for Compounds in the In2O3 and Sc2O3—A2O3—BO

(56) References Cited

OTHER PUBLICATIONS

Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Kitzerow.H et al., "Observation of Blue Phases in CHIRAL Networks", Liquid Crystals, 1993, vol. 14, No. 3, pp. 911-916.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Office Action (U.S. Appl. No. 12/880,343) dated Dec. 30, 2014.
Pending Claims (U.S. Appl. No. 12/880,343) dated Mar. 27, 2013.
Office Action (U.S. Appl. No. 13/528,009) dated Nov. 10, 2014.
Pending Claims (U.S. Appl. No. 13/528,009) dated Sep. 25, 2013.
Taiwanese Office Action (Application No. 099136529) dated Jul. 21, 2015.
U.S. Appl. No. 12/880,343, filed Sep. 13, 2010.
Pending Claims (U.S. Appl. No. 13/528,009).
Korean Office Action (Application No. 2012-7014533) dated Sep. 22, 2016.
Korean Office Action (Application No. 2017-7020469) dated Oct. 18, 2017.
Taiwanese Office Action (Application No. 106109751) dated Jan. 11, 2018.

* cited by examiner

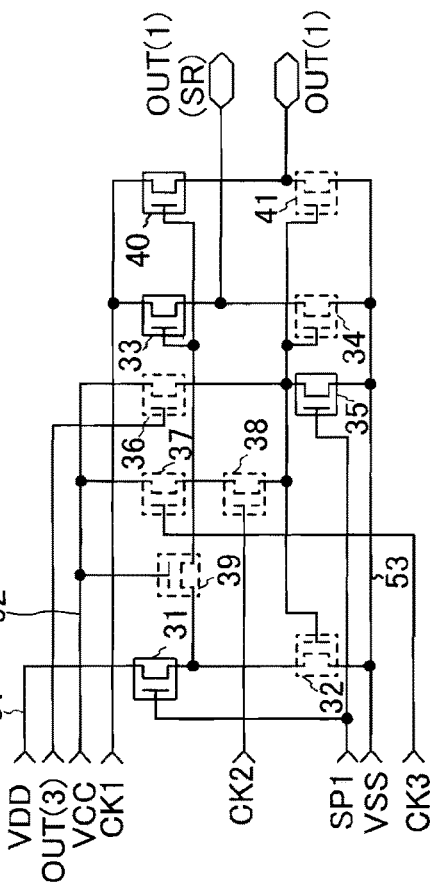
FIG. 5A the first period
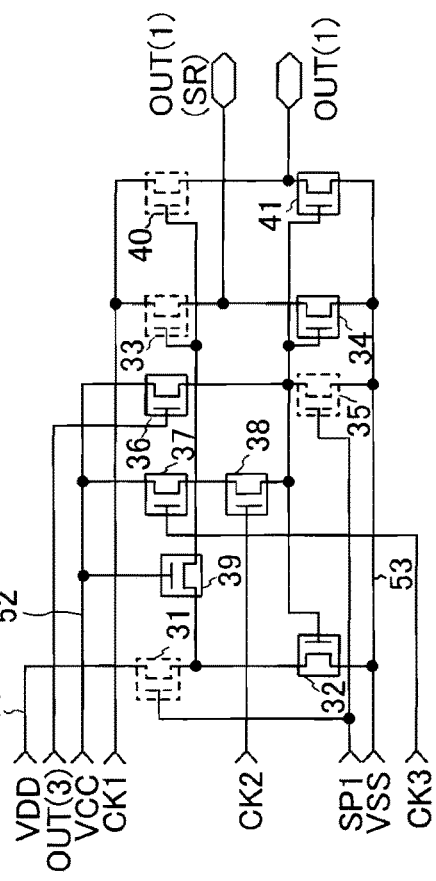
FIG. 5B the second period
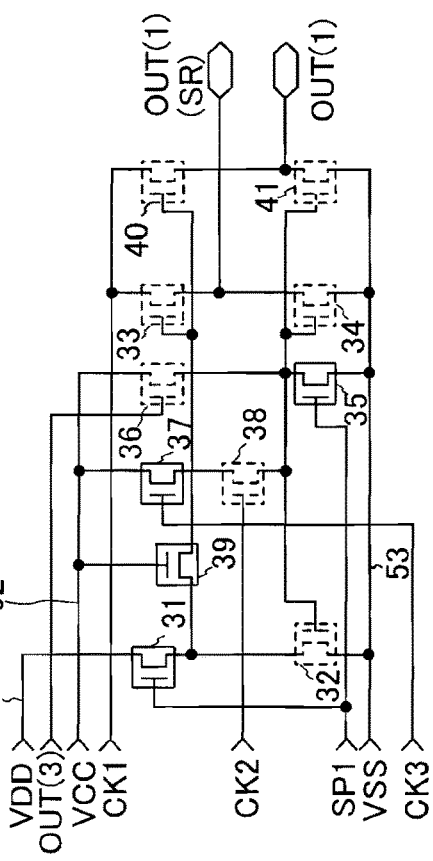
FIG. 5C the first half of the third period
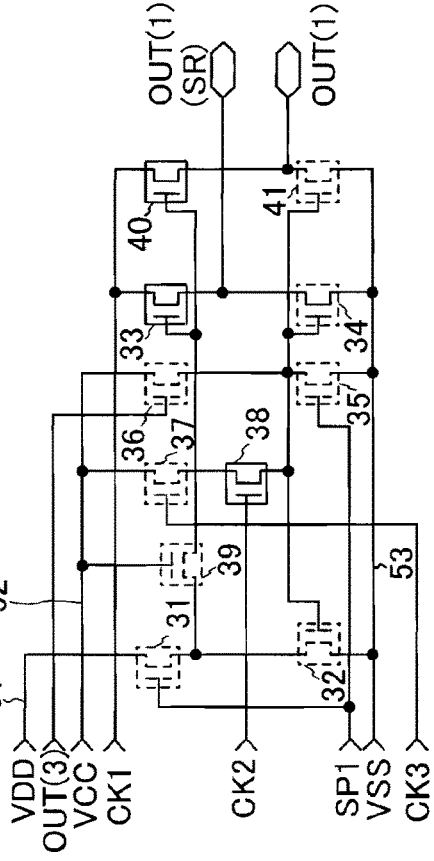
FIG. 5D the latter half of the third period

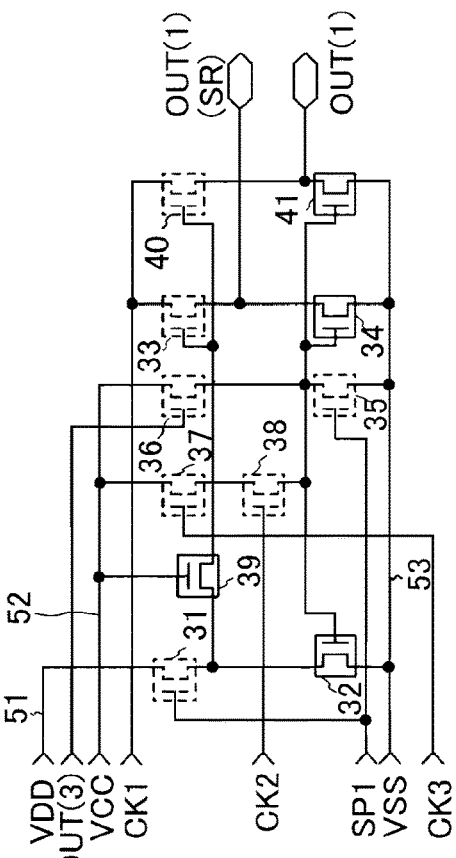
FIG. 6A the first half of the fourth period
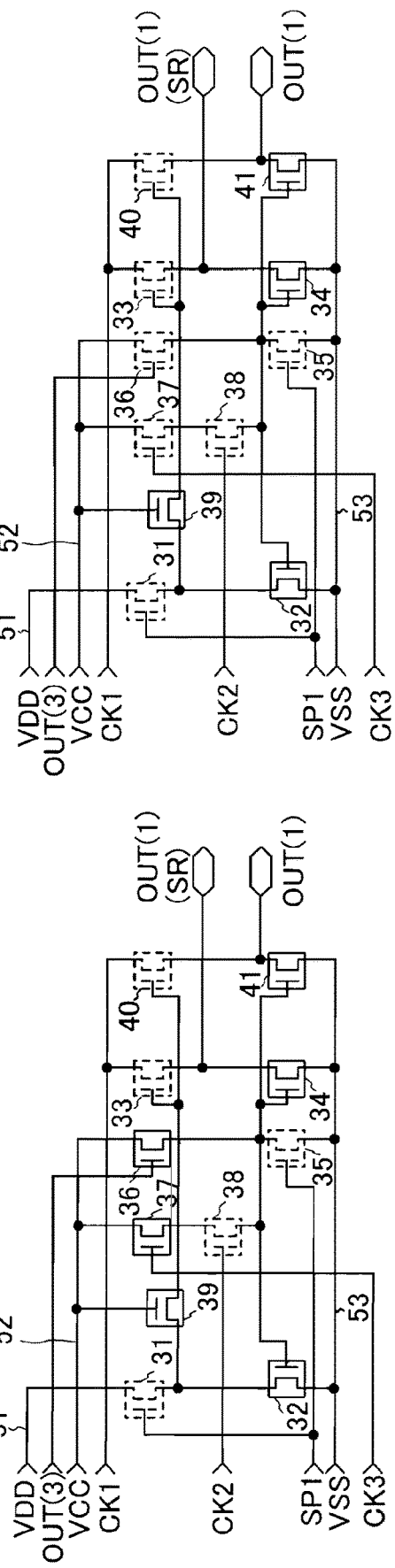
FIG. 6B the latter half of the fourth period
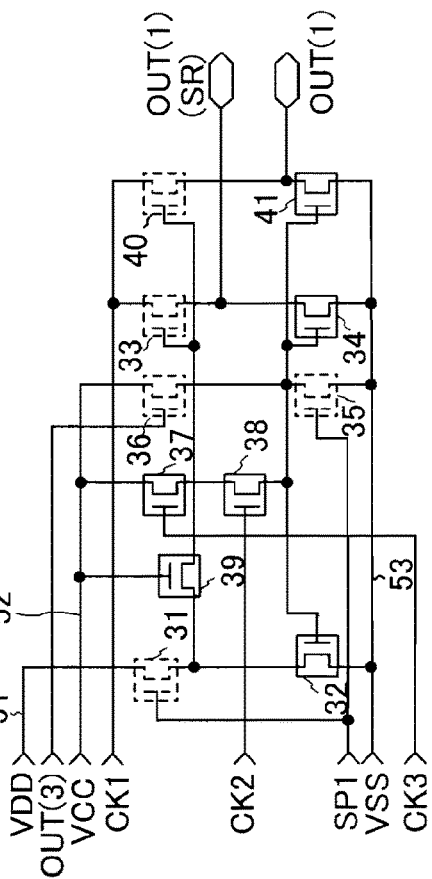
FIG. 6C the fifth period (a)
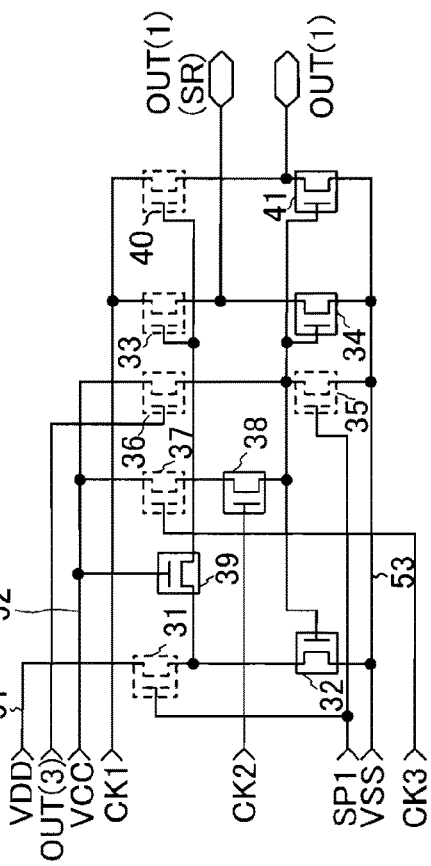
FIG. 6D the fifth period (b)

FIG. 10A1
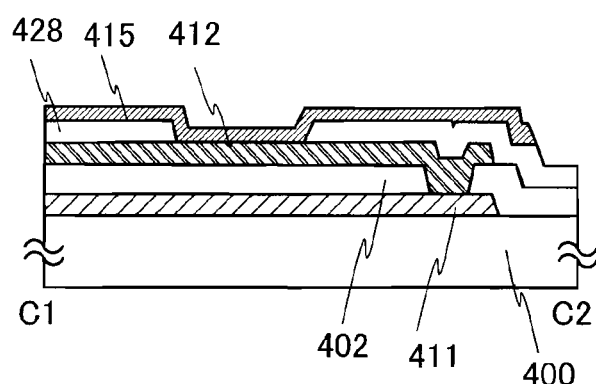
FIG. 10A2
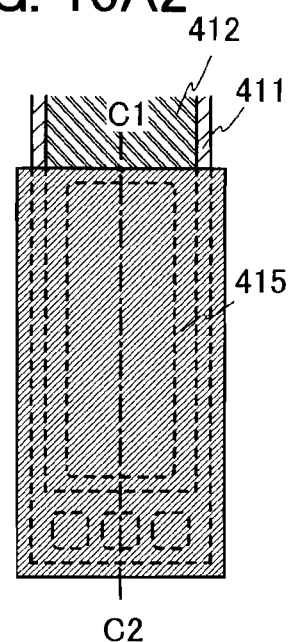
FIG. 10B1
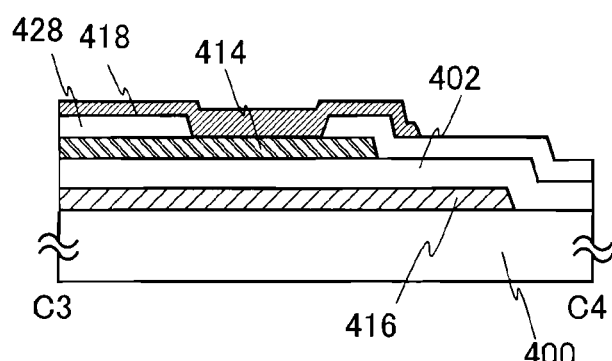
FIG. 10B2
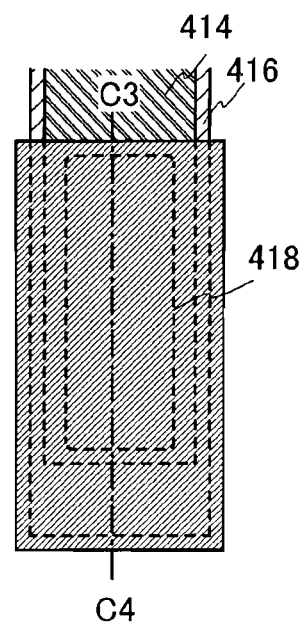

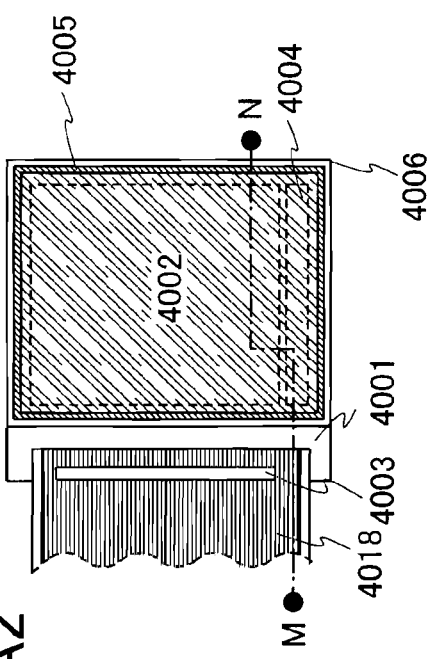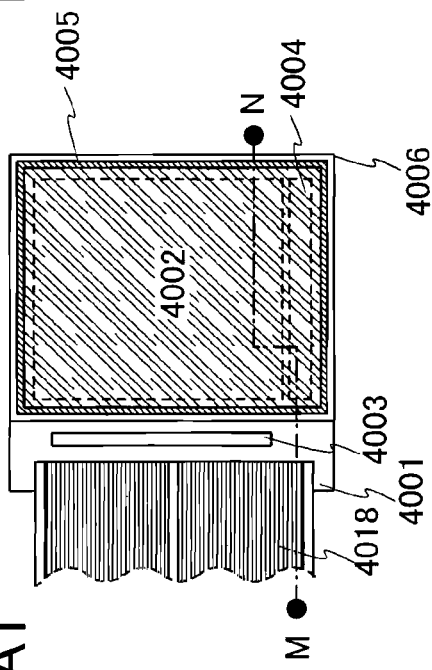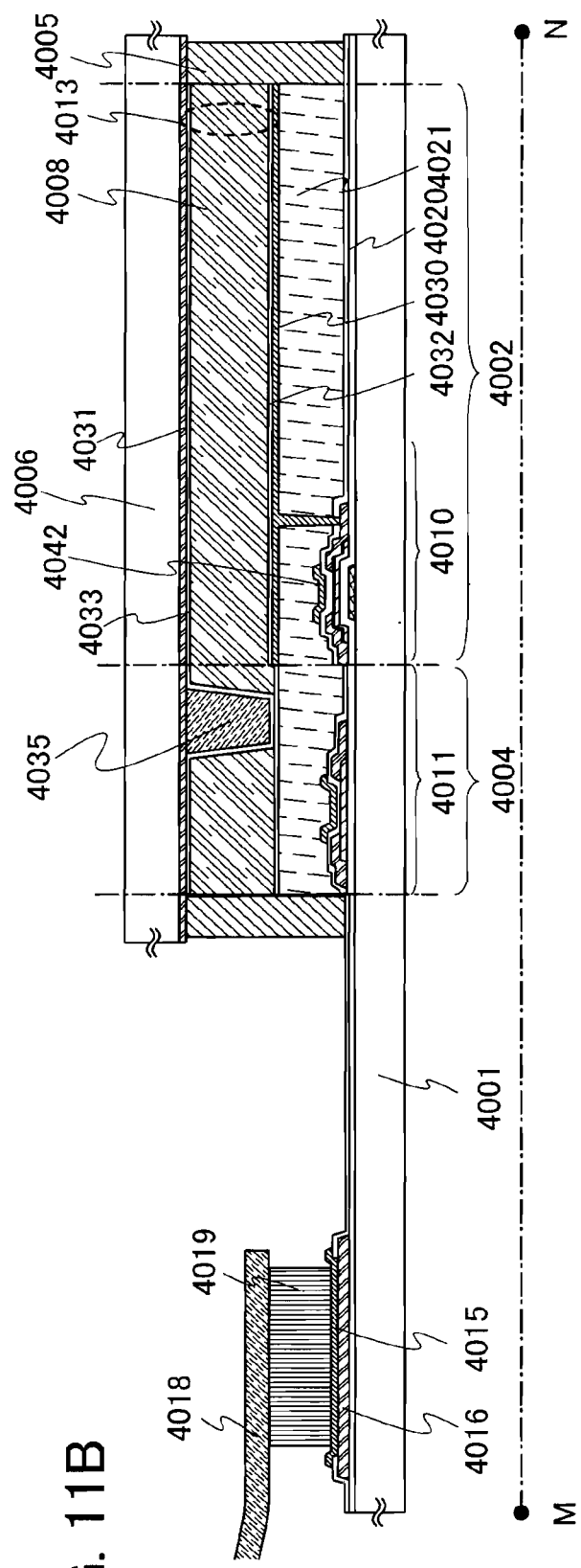
FIG. 11A1
FIG. 11A2
FIG. 11B

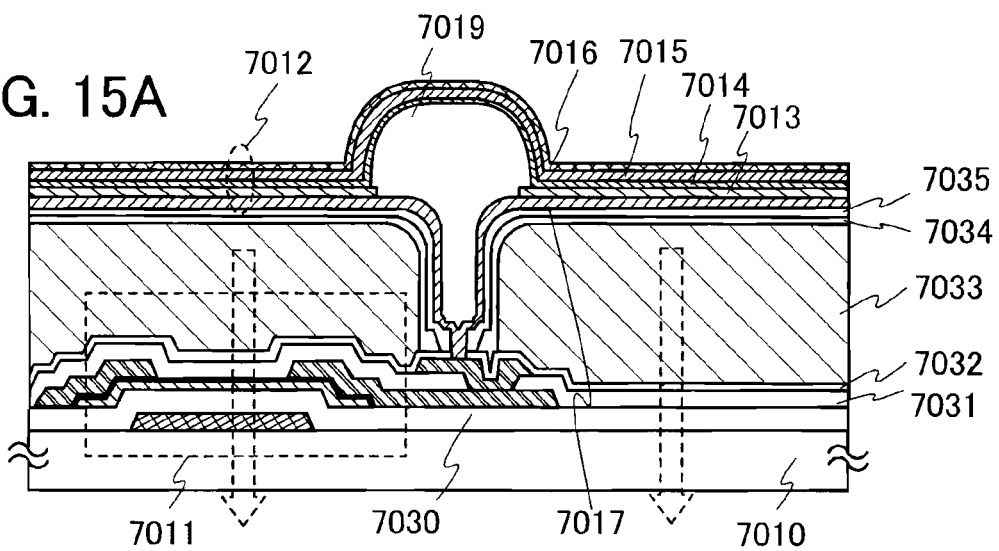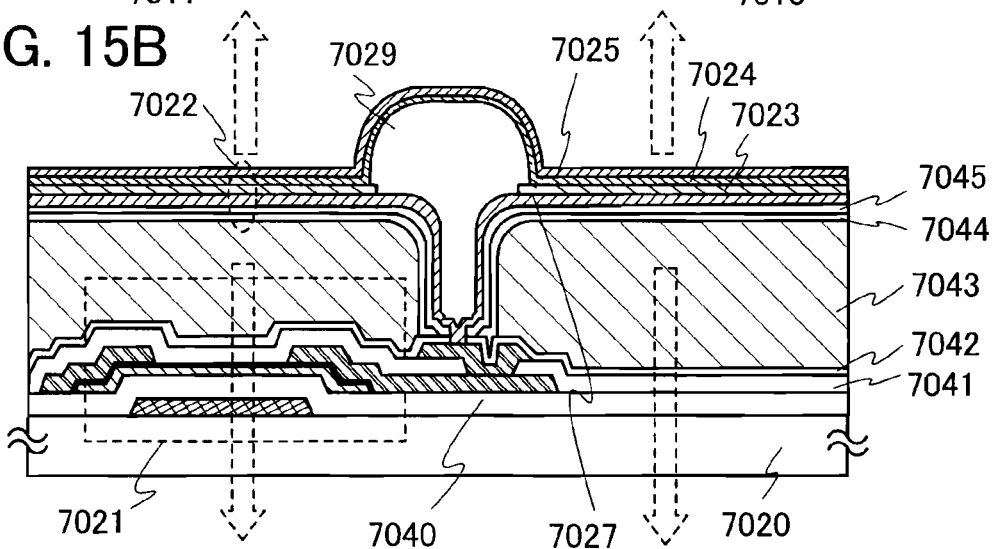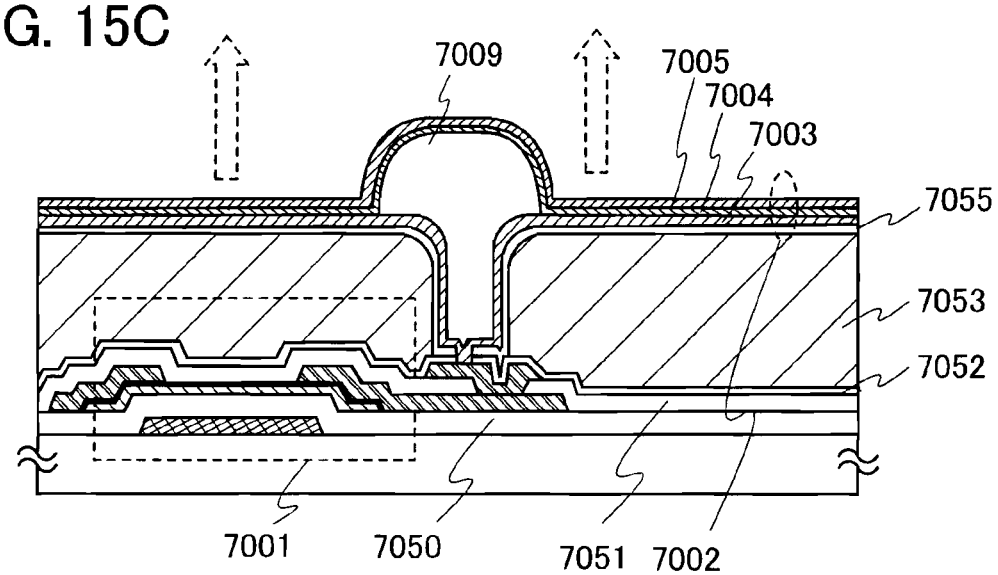

SEMICONDUCTOR DEVICE APPLYING AN OXIDE SEMICONDUCTOR

TECHNICAL FIELD

The present invention relates to a semiconductor device and a manufacturing method thereof.

In this specification, a semiconductor device means all types of devices that can function by utilizing semiconductor characteristics, and an electro-optical device such as a liquid crystal display device and a light-emitting device, a semiconductor circuit, and an electronic device are all semiconductor devices.

BACKGROUND ART

In recent years, a technique for forming a transistor by using a semiconductor film formed over a substrate having an insulating surface has attracted attention. Transistors have been applied to a wide range of electronic devices such as ICs and electro-optical devices, and transistors that are used as switching elements in image display devices are, in particular, urgently developed.

Metal oxides have been known as materials having semiconductor characteristics. Examples of the metal oxides having semiconductor characteristics are tungsten oxide, tin oxide, indium oxide, zinc oxide, and the like. Transistors in which a channel formation region is formed using such a metal oxide having semiconductor characteristics are already known (Patent Document 1 and Patent Document 2).

Furthermore, the transistors including oxide semiconductors have a high field-effect mobility. Thus, with use of the transistors, a driver circuit in a display device or the like can be formed.

REFERENCE

Patent Document

[Patent Document 1] Japanese Published Patent Application No. 2007-123861

[Patent Document 2] Japanese Published Patent Application No. 2007-96055

DISCLOSURE OF INVENTION

In the case of forming a plurality of different circuits over an insulating surface, for example, in the case of forming a pixel portion and a driver circuit over one substrate, excellent switching characteristics such as a high on/off ratio is needed in a transistor used for the pixel portion, while high operation speed is needed in a transistor used for the driver circuit. In particular, as the definition of a display portion is higher, writing time of a display image is shortened. Therefore, it is preferable that the transistor used for the driver circuit operate at high speed. The display quality can be improved by increasing the aperture ratio: higher aperture ratio and high definition are mutually contradictory.

It is an object of an embodiment of the present invention to manufacture a semiconductor device with high display quality and high reliability, which includes a pixel portion and a driver circuit portion capable of high-speed operation over one substrate, using transistors having favorable electric characteristics and high reliability as switching elements.

An embodiment of the present invention relates to a semiconductor device in which a driver circuit portion including a transistor and a pixel portion including a transistor are formed over one substrate, and a manufacturing method thereof. In the semiconductor device, two kinds of transistors each of which includes an oxide semiconductor layer including a crystalline region on one surface side (in a superficial portion) are formed. The position of the channel is selected by choosing the position of the gate electrode layer. Specifically, the following structure can be employed for example.

A semiconductor device of an embodiment of the present invention includes a pixel portion including a first transistor and a driver circuit portion including a second transistor over one substrate. The first transistor includes a first gate electrode layer over the substrate, a first insulating layer functioning as a gate insulating layer over the first gate electrode layer, a first oxide semiconductor layer including a crystalline region including nanocrystals in a superficial portion of the first oxide semiconductor layer, over the first insulating layer, a first source electrode layer and a first drain electrode layer each of which overlaps with part of the first oxide semiconductor layer, and a second insulating layer over the first source electrode layer and the first drain electrode layer and in contact with part of the first oxide semiconductor layer. The second transistor includes the first insulating layer over the substrate, a second oxide semiconductor layer including a crystalline region including nanocrystals in a superficial portion of the second oxide semiconductor layer, over the first insulating layer, a second source electrode layer and a second drain electrode layer each of which overlaps with part of the second oxide semiconductor layer, the second insulating layer over the second source electrode layer and the second drain electrode layer and in contact with part of the second oxide semiconductor layer, and a second gate electrode layer over the second insulating layer.

In the above-described semiconductor device, the crystalline regions each include nanocrystals whose c-axes are oriented in a direction perpendicular to a surface of the first oxide semiconductor layer or a surface of the second oxide semiconductor layer.

The above-described semiconductor device may further include an oxide conductive layer between the second oxide semiconductor layer and the second source electrode layer, and an oxide conductive layer between the second oxide semiconductor layer and the second drain electrode layer.

In the above-described semiconductor device, the second transistor is preferably used in a shift register in the driver circuit portion.

As the oxide semiconductor layer, an In—Sn—Ga—Zn—O-based oxide semiconductor layer which is a four-component metal oxide; an In—Ga—Zn—O-based oxide semiconductor layer, an In—Sn—Zn—O-based oxide semiconductor layer, an In—Al—Zn—O-based oxide semiconductor layer, a Sn—Ga—Zn—O-based oxide semiconductor layer, an Al—Ga—Zn—O-based oxide semiconductor layer, or a Sn—Al—Zn—O-based oxide semiconductor layer which are three-component metal oxides; or an In—Zn—O-based oxide semiconductor layer, a Sn—Zn—O-based oxide semiconductor layer, an Al—Zn—O-based oxide semiconductor layer, a Zn—Mg—O-based oxide semiconductor layer, a Sn—Mg—O-based oxide semiconductor layer, or an In—Mg—O-based oxide semiconductor layer which are two-component metal oxides; or an In—O-based oxide semiconductor layer, a Sn—O-based oxide semiconductor layer, or a Zn—O-based oxide semiconductor layer can be used. Further, $SiO_2$ may be contained in the above oxide semiconductor layer.

As the oxide semiconductor layer, a thin film represented by $InMO_3 (ZnO)_m$ (m>0) can be used. Here, M represents one or more metal elements selected from Ga, Al, Mn, and Co. For example, M can be Ga, Ga and Al, Ga and Mn, Ga and Co, or the like. An oxide semiconductor whose composition formula is represented by $InMO_3 (ZnO)_m$ (m>0) where at least Ga is included as M is referred to as the In—Ga—Zn—O-based oxide semiconductor, and a thin film thereof is also referred to as an In—Ga—Zn—O-based film.

As the oxide semiconductor layer, the one which is subjected to dehydration or dehydrogenation at high temperature in a short time by an RTA (rapid thermal annealing) method or the like is used. Through this heating step, a superficial portion of the oxide semiconductor layer comes to include a crystalline region formed of a microcrystal group including nanocrystals and the rest of the oxide semiconductor layer comes to be amorphous or be formed of a mixture of amorphousness and microcrystals, where an amorphous region is dotted with microcrystals, or be formed of a microcrystal group.

With the use of a transistor which is an embodiment of the present invention, a semiconductor device can be manufactured by forming a driver circuit portion and a pixel portion over one substrate and using an EL element, a liquid crystal element, an electrophoretic element, or the like.

Note that a gate electrode layer in this specification refers to not only a gate electrode but also part or all of a gate wiring. The gate wiring is a wiring for electrically connecting a gate electrode of at least one transistor to another electrode or another wiring, and includes a scan line in a display device in its meaning, for example.

Further, a source electrode layer refers to not only a source electrode but also part or all of a source wiring. The source wiring is a wiring for electrically connecting a source electrode of at least one transistor to another electrode or another wiring. In the case where a signal line in a display device is electrically connected to a source electrode for example, the source wiring includes the signal line in its meaning.

Further, a drain electrode layer refers to not only a drain electrode but also part or all of a drain wiring. The drain wiring is a wiring for electrically connecting a drain electrode of at least one transistor to another electrode or another wiring. In the case where a signal line in a display device is electrically connected to a drain electrode for example, the drain wiring includes the signal line in its meaning.

In this specification, the claims, the drawings, and the like, since a source and a drain of a transistor may interchange depending on the structure, the operating condition, and the like of the transistor, it is difficult to define which is the source or the drain. Therefore, in this specification, the claims, the drawings, and the like, one terminal arbitrarily selected from the source and the drain is referred to as one of the source and the drain, while the other terminal is referred to as the other of the source and the drain.

Note that a light-emitting device in this specification refers to an image display device, a light-emitting device, or a light source (including a lighting device). In addition, the light-emitting device includes any of the following modules in its category: a module in which a connector such as an FPC (flexible printed circuit), a TAB (tape automated bonding) tape, or a TCP (tape carrier package) is attached to a light-emitting device; a module having a TAB tape or a TCP provided with a printed wiring board at the end thereof; and a module having an IC (integrated circuit) directly mounted over a substrate over which a light-emitting element is formed by a COG (chip on glass) method.

Note that ordinal numbers such as "first" and "second" are used for convenience. Therefore, they do not denote the order of steps, the stacking order of layers, and particular names which specify the invention.

With an embodiment of the present invention, a semiconductor device in which a driver circuit portion capable of high-speed operation and a pixel portion are formed over one substrate can be manufactured.

BRIEF DESCRIPTION OF DRAWINGS

In the accompanying drawings:

FIGS. 5A to 5D are diagrams showing operation of a pulse output circuit;

FIGS. 6A to 6D are diagrams showing operation of a pulse output circuit;

FIGS. 10A1 and 10B1 are cross-sectional views and FIGS. 10A2 and 10B2 are plan views illustrating an embodiment of the present invention;

FIGS. 11A1 and 11A2 are cross-sectional views and FIG. 11B is a plan view each illustrating an embodiment of the present invention;

FIGS. 15A to 15C are cross-sectional views each illustrating an embodiment of the present invention;

BEST MODE FOR CARRYING OUT THE INVENTION

Figure 1A:
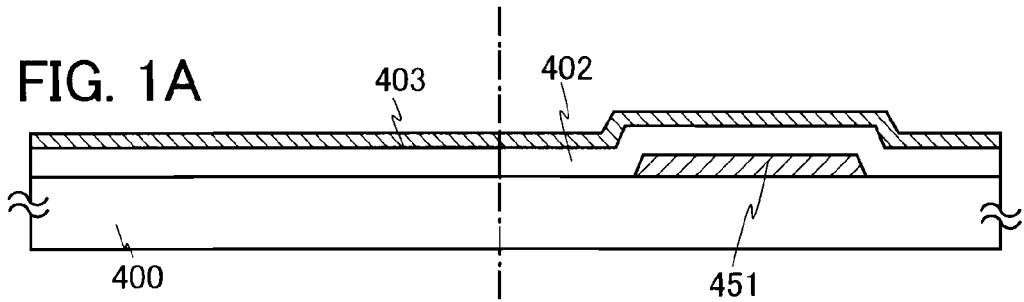
FIGS. 1A to 1E are cross-sectional process views illustrating an embodiment of the present invention.

Hereinafter, embodiments of the present invention will be described in detail with reference to the accompanying drawings. However, the present invention is not limited to the following description, and it is easily understood by those skilled in the art that modes and details disclosed herein can be modified in various ways. Therefore, the present invention is not construed as being limited to description of the embodiments below. Note that common portions and portions having a similar function are denoted by the same reference numeral in the drawings in this specification, and description thereof may be omitted.

Embodiment 1

In this embodiment, a semiconductor device and a manufacturing method of the semiconductor device each of which is an embodiment of the present invention will be described with reference to FIGS. 1A to 1E. FIG. 1E illustrates an example of a cross-sectional structure of two transistors 440 and 450 having different structures manufactured over one substrate. The transistor 440 illustrated in FIG. 1E has a bottom-gate structure called a channel-etched structure, and the transistor 450 has a top-gate structure.

The transistor 440 disposed in a pixel includes, over a substrate 400 having an insulating surface, a gate electrode layer 451, a first insulating layer 402 functioning as a gate insulating layer, an oxide semiconductor layer 404b including a channel formation region, a source electrode layer 455c, and a drain electrode layer 455d. A second insulating layer 428 which covers the transistor 440 and is in contact with part of the oxide semiconductor layer 404b is provided.

Although the transistor 440 disposed in the pixel has a single-gate structure here, the transistor 440 may have a multi-gate structure or a dual-gate structure where a gate electrode layer is provided over a channel formation region with an insulating film interposed therebetween and another gate electrode layer is provided below the channel formation region with an insulating film interposed therebetween, as necessary.

The source electrode layer 455c and the drain electrode layer 455d are provided over the oxide semiconductor layer 404b so that part of the source electrode layer 455c and part of the drain electrode layer 455d overlap with the oxide semiconductor layer 404b. The oxide semiconductor layer 404b overlaps with the gate electrode layer 451 with the first insulating layer 402 interposed therebetween. The channel formation region of the transistor 440 disposed in the pixel is a region in the oxide semiconductor layer 404b, which is located between a region in contact with the source electrode layer 455c and a region in contact with the drain electrode layer 455d, is in contact with the first insulating layer 402, and overlaps with the gate electrode layer 451.

A semiconductor device with a high aperture ration can be realized when the gate electrode layer 451, the source electrode layer 455c, and the drain electrode layer 455d in the transistor 440 are formed using a light-transmitting conductive film. As a light-transmitting material, a conductive material that transmits visible light, for example, an In—Sn—O-based oxide conductive material, an In—Sn—Zn—O-based oxide conductive material, an In—Al—Zn—O-based oxide conductive material, an Sn—Ga—Zn—O-based oxide conductive material, an Al—Ga—Zn—O-based oxide conductive material, an Sn—Al—Zn—O-based oxide conductive material, an In—Zn—O-based oxide conductive material, an Sn—Zn—O-based oxide conductive material, an Al—Zn—O-based oxide conductive material, an In—O-based oxide conductive material, an Sn—O-based oxide conductive material, or a Zn—O-based oxide conductive material can be employed. In the case of using a sputtering method, deposition may be performed using a target including $SiO_2$ at greater than or equal to 2 wt % and less than or equal to 10 wt % so that the light-transmitting conductive film may include $SiO_x$ (X>0) and be amorphous.

The transistor 450 disposed in a driver circuit portion includes, over the substrate 400 having an insulating surface, the first insulating layer 402, an oxide semiconductor layer 404a including a channel formation region, a source electrode layer 455a, a drain electrode layer 455b, the second insulating layer 428 functioning as a gate insulating layer, and a gate electrode layer 421.

The gate electrode layer 421, the source electrode layer 455a, and the drain electrode layer 455b of the transistor 450 (including a wiring formed in the same layer as these layers) are formed using a metal material such as Al, Cu, Cr, Ta, Ti, Mo, or W or an alloy material including the metal material. Further, a structure may be employed in which a layer of a high-melting point metal such as Cr, Ta, Ti, Mo, or W is stacked over one or both sides of a metal layer of Al, Cu, or the like. Furthermore, an Al material to which an element which prevents generation of hillocks or whisker in an Al film, such as Si, Ti, Ta, W, Mo, Cr, Nd, Sc, or Y is added may be used, leading to improvement in heat resistance.

The source electrode and the drain electrode (including a wiring formed in the same layer as these layers) may be formed using a conductive metal oxide. As a conductive metal oxide, indium oxide ($In_2O_3$), tin oxide ($SnO_2$), zinc oxide (ZnO), an alloy of indium oxide and tin oxide ($In_2O_3$—$SnO_2$, abbreviated to ITO), an alloy of indium oxide and zinc oxide ($In_2O_3$—ZnO), or the metal oxide material to which silicon or silicon oxide is added can be used.

The source electrode layer 455a and the drain electrode layer 455b are provided over the oxide semiconductor layer 404a so that part of the source electrode layer 455a and part of the drain electrode layer 455b overlap with the oxide semiconductor layer 404a. The oxide semiconductor layer 404a overlaps with the gate electrode layer 421 with the second insulating layer 428 interposed therebetween. The channel formation region of the transistor 450 disposed in the driver circuit portion is located between a region in contact with the source electrode layer 455a of the oxide semiconductor layer 404a and a region in contact with the drain electrode layer 455b of the oxide semiconductor layer 404a, is in contact with the second insulating layer 428, and overlaps with the gate electrode layer 421.

As the oxide semiconductor layer, an In—Sn—Ga—Zn—O-based oxide semiconductor layer which is a four-component metal oxide; an In—Ga—Zn—O-based oxide semiconductor layer, an In—Sn—Zn—O-based oxide semiconductor layer, an In—Al—Zn—O-based oxide semiconductor layer, a Sn—Ga—Zn—O-based oxide semiconductor layer, an Al—Ga—Zn—O-based oxide semiconductor layer, or a Sn—Al—Zn—O-based oxide semiconductor layer which are three-component metal oxides; or an In—Zn—O-based oxide semiconductor layer, a Sn—Zn—O-based oxide semiconductor layer, an Al—Zn—O-based oxide semiconductor layer, a Zn—Mg—O-based oxide semiconductor layer, a Sn—Mg—O-based oxide semiconductor layer, or an In—Mg—O-based oxide semiconductor layer which are two-component metal oxides; or an In—O-based oxide semiconductor layer, a Sn—O-based oxide semiconductor layer, or a Zn—O-based oxide semiconductor layer can be used. Further, $SiO_2$ may be contained in the above oxide semiconductor layer.

As the oxide semiconductor layer, a thin film represented by $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like. An oxide semiconductor whose composition formula is represented by $InMO_3(ZnO)_m$ (m>0) where at least Ga is included as M is referred to as the In—Ga—Zn—O-based oxide semiconductor, and a thin film thereof is also referred to as an In—Ga—Zn—O-based film.

As the oxide semiconductor layer, the one which is subjected to dehydration or dehydrogenation at high temperature in a short time by a rapid thermal annealing (RTA) method or the like is used. This heating process makes a superficial portion of the oxide semiconductor layer have a crystalline region including so-called nanocrystals with a grain size of greater than or equal to 1 nm and less than or equal to 20 nm, and the rest of the oxide semiconductor layer is amorphous or is formed of a mixture of amorphousness and microcrystals, where an amorphous region is dotted with microcrystals. Note that the above-described size of the nanocrystal is just an example, and the present invention is not construed as being limited to the above range.

By using an oxide semiconductor layer having such a structure, deterioration of electric characteristics due to a change to an n-type which is caused by entry of moisture to the superficial portion or elimination of oxygen from the superficial portion can be prevented because a dense crystalline region including nanocrystals exists in the superficial portion. In the bottom-gate transistor 440, the superficial portion of the oxide semiconductor layer is located on the opposite side to the channel; accordingly, preventing the oxide semiconductor layer from being changed to an n-type is also effective for suppression of generation of a parasitic channel. Furthermore, contact resistance between the superficial portion where conductivity is increased owing to the crystalline region and the source electrode layer or the drain electrode layer can be reduced.

The crystalline region in the superficial portion of the oxide semiconductor layer includes crystal grains in which c-axes are oriented in a direction substantially perpendicular to a surface of the oxide semiconductor layer. For example, in the case of using an In—Ga—Zn—O-based oxide semiconductor material, the c-axes of the crystal grains of $In_2Ga_2ZnO_7$ in the crystalline region are oriented in a direction substantially perpendicular to the surface of the oxide semiconductor layer. For example, in the case where an In—Ga—Zn—O-based oxide semiconductor material is used for the oxide semiconductor layer, nanocrystals are arranged so that c-axes of the crystal grains of $In_2Ga_2ZnO_7$ are oriented in a direction substantially perpendicular to a substrate plane (or the surface of the oxide semiconductor layer), whereby the direction of current flow in the transistor is b-axes direction (or a-axes direction) of the crystal grains of $In_2Ga_2ZnO_7$.

Note that the crystalline region may include a portion other than the crystal grains. The crystal structure of the crystal grains is not limited to the above structure, and the crystalline region may include crystal grains of another structure. For example, in the case of using an In—Ga—Zn—O-based oxide semiconductor material, crystal grains of $InGaZnO_4$ may be included in addition to the crystal grains of $In_2Ga_2ZnO_7$.

Hereinafter, a manufacturing process of the transistor 440 and the transistor 450 over one substrate will be described with reference to FIGS. 1A to 1E.

First, a conductive film is formed over the substrate 400 having an insulating surface and a first photolithography step is performed thereon, so that the gate electrode layer 451 is formed. At this time, etching is preferably performed so that at least an end portion of the gate electrode layer 451 be tapered in order to prevent disconnection.

Note that a resist mask may be formed by an ink-jet method. Formation of the resist mask by an ink-jet method needs no photomask; therefore, manufacturing cost can be reduced. Needless to say, an ink-jet method can be applied not only to the first photolithography step but also to another photolithography step.

As the substrate 400, any of the following substrates can be used: non-alkaline glass substrates formed using barium borosilicate glass, aluminoborosilicate glass, aluminosilicate glass, and the like by a fusion process or a float process; ceramic substrates; plastic substrates having heat resistance enough to withstand a process temperature of this manufacturing process; and the like. Alternatively, a metal substrate such as a stainless steel alloy substrate which is provided with an insulating film over the surface may also be used.

Note that as the above glass substrate, a substrate formed of an insulator such as a ceramic substrate, a quartz substrate, or a sapphire substrate may be used. Alternatively, crystallized glass or the like may be used.

It is preferable to form the gate electrode layer 451 using a light-transmitting oxide conductive layer in order to improve the aperture ratio of the pixel portion. For example, indium oxide, an alloy of indium oxide and tin oxide, an alloy of indium oxide and zinc oxide, zinc oxide, zinc aluminum oxide, zinc aluminum oxynitride, zinc gallium oxide, or the like can be used for the oxide conductive layer.

As the conductive film for forming the gate electrode layer 451, a film including an element selected from Al, Cr, Ta, Ti, Mo, and W, an alloy including the above element as a component, or an alloy including any of the above elements in combination, a stacked film including the above film, or the like can be used.

An insulating layer serving as a base film may be provided between the substrate 400 and the gate electrode layer 451. The base film has a function of preventing diffusion of an impurity element from the substrate 400, and can be formed to have a single-layer structure or a stacked structure including one or more of a silicon nitride film, a silicon oxide film, a silicon nitride oxide film, and a silicon oxynitride film.

Next, the first insulating layer 402 is formed over the gate electrode layer 451. As the first insulating layer 402, a single-layer film or a stacked-layer film of any of silicon oxide, silicon oxynitride, silicon nitride oxide, silicon nitride, aluminum oxide, tantalum oxide, and the like formed by a CVD method, a sputtering method, or the like can be used. The thickness of the first insulating layer 402 is greater than or equal to 50 nm and less than or equal to 250 nm. Note that the first insulating layer 402 functions as a gate insulating layer in the transistor 440 and also functions as a base insulating layer in the transistor 450.

The first insulating layer 402 can also be formed using a high-density plasma apparatus. Here, a high-density plasma apparatus refers to an apparatus which can realize a plasma density higher than or equal to $1 \times 10^{11}/cm^3$. For example, plasma is generated by applying a microwave power higher than or equal to 3 kW and lower than or equal to 6 kW to form the first insulating layer 402.

A monosilane gas ($SiH_4$), nitrous oxide ($N_2O$), and a rare gas are introduced into a chamber as a source gas to generate high-density plasma at a pressure higher than or equal to 10 Pa and lower than or equal to 30 Pa so that an insulating layer is formed over a substrate having an insulating surface, such as a glass substrate. After that, the supply of a monosilane gas may be stopped, and nitrous oxide ($N_2O$) and a rare gas may be introduced without exposure to the air to perform plasma treatment on a surface of the insulating layer. The plasma treatment performed on the surface of the insulating layer by introducing nitrous oxide ($N_2O$) and a rare gas is performed at least after the formation of the insulating layer. The insulating layer formed through the above process procedure has a small thickness and is an insulating layer whose reliability can be ensured even though it has a thickness less than 100 nm, for example.

In forming the first insulating layer 402, the flow ratio of a monosilane gas ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

In addition, since the insulating layer formed using the high-density plasma apparatus can have a uniform thickness, the insulating layer has excellent step coverage. Further, with the high-density plasma apparatus, the thickness of a thin insulating film can be controlled precisely.

The insulating layer formed through the above process procedure is greatly different from the insulating layer formed using a conventional parallel-plate PCVD apparatus. The etching rate of the insulating layer formed through the above process procedure is lower than that of the insulating layer formed using the conventional parallel-plate PCVD apparatus by greater than or equal to 10% or greater than or equal to 20% in the case where the etching rates with the same etchant are compared to each other. Thus, it can be said that the insulating layer formed using the high-density plasma apparatus is a dense film.

Alternatively, a silicon oxide layer formed by a CVD method using an organosilane gas can be used as the first insulating layer 402. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

Alternatively, the first insulating layer 402 may be formed using one kind of oxide, nitride, oxynitride, and nitride oxide of aluminum, yttrium, or hafnium; or a compound including at least two or more kinds of the above.

Note that in this specification, oxynitride refers to a substance that contains more oxygen atoms than nitrogen atoms and nitride oxide refers to a substance that contains more nitrogen atoms than oxygen atoms. For example, a "silicon oxynitride film" means a film that contains more oxygen atoms than nitrogen atoms, and contains oxygen, nitrogen, silicon, and hydrogen at concentrations ranging from 50 atomic % to 70 atomic %, from 0.5 atomic % to 15 atomic %, from 25 atomic % to 35 atomic %, and from 0.1 atomic % to 10 atomic %, respectively, when they are measured by Rutherford backscattering spectrometry (RBS) and hydrogen forward scattering (HFS). Further, a "silicon nitride oxide film" means a film that contains more nitrogen atoms than oxygen atoms, and contains oxygen, nitrogen, silicon, and hydrogen at concentrations ranging from 5 atomic % to 30 atomic %, from 20 atomic % to 55 atomic %, from 25 atomic % to 35 atomic %, and from 10 atomic % to 30 atomic %, respectively, when they are measured by RBS and HFS. Note that percentages of nitrogen, oxygen, silicon, and hydrogen fall within the ranges given above when the total number of atoms contained in the silicon oxynitride film or the silicon nitride oxide film is defined as 100 atomic %.

Next, over the first insulating layer 402, an oxide semiconductor film 403 is formed to a thickness greater than or equal to 5 nm and less than or equal to 200 nm, preferably greater than or equal to 10 nm and less than or equal to 20 nm (see FIG. 1A).

Note that before the oxide semiconductor film 403 is formed, dust on a surface of the first insulating layer 402 is preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, $N_2O$, or the like is added may be used. Further alternatively, an argon atmosphere to which $Cl_2$, $CF_4$, or the like is added may be used. After the reverse sputtering, the oxide semiconductor film is formed without being exposed to air, whereby dust or moisture can be prevented from attaching to an interface between the first insulating layer 402 and the oxide semiconductor film 403.

As the oxide semiconductor film, any of the following oxide semiconductor films can be used: an In—Ga—Zn—O-based oxide semiconductor film; an In—Sn—Zn—O-based oxide semiconductor film; an In—Al—Zn—O-based oxide semiconductor film; a Sn—Ga—Zn—O-based oxide semiconductor film; an Al—Ga—Zn—O-based oxide semiconductor film; a Sn—Al—Zn—O-based oxide semiconductor film; an In—Zn—O-based oxide semiconductor film; a Sn—Zn—O-based oxide semiconductor film; an Al—Zn—O-based oxide semiconductor film; an In—O-based oxide semiconductor film; a Sn—O-based oxide semiconductor film; and a Zn—O-based oxide semiconductor film. The oxide semiconductor film can be formed using a sputtering method in a rare gas (typically argon) atmosphere, an oxygen atmosphere, or an atmosphere of a rare gas (typically argon) and oxygen. In the case of using a sputtering method, film deposition may be performed using a target containing $SiO_2$ at greater than or equal to 2 wt % and less than or equal to 10 wt % and SiOx (x>0) which inhibits crystallization may be contained in the oxide semiconductor film.

Here, film formation is performed using a target for forming an oxide semiconductor including In, Ga, and Zn (the composition ratio of $In_2O_3:Ga_2O_3:ZnO=1:1:1$ [molar ratio] or $In_2O_3:Ga_2O_3:ZnO=1:1:2$ [molar ratio]) under the following conditions: the distance between a substrate and a target is 100 mm, the pressure is 0.6 Pa, the direct-current (DC) power supply is 0.5 kW, and the atmosphere is oxygen (the proportion of the oxygen flow is 100%). Note that a pulse direct current (DC) power source is preferable because powder substances (also referred to as particles or dust) generated in film formation can be reduced and the film thickness distribution can be uniform. In this embodiment, as the oxide semiconductor film, an In—Ga—Zn—O-based film having a thickness of 15 nm is formed by a sputtering method using a target for forming an In—Ga—Zn—O-based oxide semiconductor.

The oxide semiconductor film preferably has a thickness of greater than or equal to 5 nm and less than or equal to 30 nm. Note that appropriate thickness of the oxide semiconductor film varies depending on the material; therefore, the thickness may be determined as appropriate depending on the material.

In addition, it is preferable that the oxide semiconductor film be successively formed over the first insulating layer 402. The multi-chamber sputtering apparatus used here is provided with the target of silicon or silicon oxide (artificial quarts), and the target for forming an oxide semiconductor film. The deposition chamber provided with the target for forming an oxide semiconductor film is at least provided with a cryopump as an evacuation unit. Note that a turbo molecular pump may be used instead of the cryopump, and a cold trap may be provided above an inlet of the turbo molecular pump so that moisture or the like may be adsorbed.

From the deposition chamber which is evacuated using the cryopump, a hydrogen atom, a compound containing a hydrogen atom such as $H_2O$, a carbon atom, a compound containing a carbon atom, and the like are removed, whereby the concentration of an impurity in the oxide semiconductor film formed in the deposition chamber can be reduced.

The oxide semiconductor film may be formed in the state where the substrate is heated. At that time, the substrate is heated at higher than or equal to 100° C. and lower than or equal to 600° C., preferably, higher than or equal to 200° C. and lower than or equal to 400° C. By heating the substrate during deposition, the impurity concentration in the oxide semiconductor film can be reduced.

Examples of a sputtering method include an RF sputtering method in which a high-frequency power source is used as a sputtering power source, a DC sputtering method in which a direct-current power source is used, and a pulsed DC sputtering method in which a bias is applied in a pulsed manner. An RF sputtering method is mainly used in the case of forming an insulating film, and a DC sputtering method is mainly used in the case of forming a metal conductive film.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there is a sputtering apparatus provided with a magnet system inside the chamber and used for magnetron sputtering, and a sputtering apparatus used for ECR sputtering in which plasma generated with the use of microwaves is used without using glow discharge.

Furthermore, as a deposition method using sputtering, there are also a reactive sputtering method in which a target substance and a sputtering gas component are chemically reacted with each other during deposition to form a thin compound film thereof, and a bias sputtering method in which a voltage is also applied to a substrate during deposition.

Next, through a second photolithography step, a resist mask is formed. Then, the In—Ga—Zn—O-based film is etched. In etching, organic acid such as citric acid or oxalic acid can be used as an etchant, for example. By performing etching so that the end portions of the oxide semiconductor layers 404a and 404b have tapered shapes, breakage of a wiring due to a step shape can be prevented. Note that etching here is not limited to wet etching and dry etching may also be used.

Next, dehydration or dehydrogenation of the oxide semiconductor layers 404a and 404b is performed. First heat treatment for the dehydration or dehydrogenation can be performed with the use of resistance heating, lamp irradiation, or the like in an inert gas atmosphere through RTA treatment at a temperature higher than or equal to 500° C. and lower than or equal to 750° C. (or a temperature lower than or equal to the strain point of a glass substrate) for approximately one minute to ten minutes, preferably at 650° C. for approximately greater than or equal to three minutes and less than or equal to six minutes. With an RTA method, dehydration or dehydrogenation can be performed in a short time; therefore, treatment can be performed even at a temperature higher than the strain point of a glass substrate. Note that the timing of heat treatment is not limited to this timing and may be performed plural times, for example, before and after a photolithography step or a deposition step.

Note that in this specification, heat treatment in the atmosphere of an inert gas such as nitrogen or a rare gas is referred to as heat treatment for dehydration or dehydrogenation. In this specification, dehydrogenation does not refer to only elimination in the form of $H_2$ by the heat treatment, and dehydration or dehydrogenation also refers to elimination of H, OH, and the like for convenience.

It is important that the temperature be decreased from the heating temperature T at which the oxide semiconductor layer is dehydrated or dehydrogenated, in the same furnace used for the dehydration or dehydrogenation, with the oxide semiconductor layer prevented from being exposed to the air so that entry of water or hydrogen into the oxide semiconductor layer is prevented. When a transistor is formed using an i-type oxide semiconductor layer which is obtained by changing an oxide semiconductor layer into a low-resistance oxide semiconductor layer in an oxygen-deficient state, i.e., an n-type (e.g., $n^-$-type or $n^+$-type) oxide semiconductor layer through dehydration or dehydrogenation and by changing the low-resistance oxide semiconductor layer into a high-resistance oxide semiconductor layer through supply of oxygen, the threshold voltage of the transistor can be positive, so that a switching element having so-called normally-off characteristics can be realized. It is preferable that a channel in a transistor of a display device be formed at a positive threshold voltage which is as close to 0 V as possible. If the threshold voltage of the transistor is negative, it tends to be normally on; in other words, current flows between the source electrode and the drain electrode even when the gate voltage is 0 V. In an active matrix display device, electric characteristics of a transistor included in a circuit are important and the performance of the display device depends on the electric characteristics. In particular, of the electric characteristics of the transistor, the threshold voltage ($V_{th}$) is important. In the case where the threshold voltage value is large or is on the minus side even when the field effect mobility is high, it is difficult to control the circuit. In the case where a transistor has a large threshold voltage value and a large absolute value of the threshold voltage, the transistor cannot perform a switching function as a transistor and might be a load when a transistor is driven at low voltage. In the case of an n-channel transistor, it is desirable that only after a positive voltage is applied as a gate voltage, a channel be formed and a drain current flows. A transistor in which a channel is not formed unless driving voltage is raised and a transistor in which a channel is formed and drain current flows even when negative voltage is applied are unsuitable for a transistor used in a circuit.

In addition, when the temperature is decreased from the heating temperature T, the gas atmosphere may be switched to a gas atmosphere which is different from that used when the temperature is raised to the heating temperature T. For example, cooling is performed using the same furnace that is used for the dehydration or dehydrogenation and by filling the furnace with a high-purity oxygen gas, a high-purity $N_2O$ gas, or ultra-dry air (having a dew point of −40° C. or lower, preferably −60° C. or lower) without exposure to the air.

Note that in the first heat treatment, it is preferable that water, hydrogen, and the like be not contained in the atmosphere. Alternatively, the purity of an inert gas which is introduced into a heat treatment apparatus is preferably 6N (99.9999%) or more, more preferably 7N (99.99999%) or more (that is, the impurity concentration is 1 ppm or less, preferably 0.1 ppm or less).

In the case where heat treatment is performed under an inert gas atmosphere, an oxide semiconductor layer is changed into an oxygen-deficient oxide semiconductor layer by the heat treatment to be a low-resistant oxide semiconductor layer, i.e. an n-type (e.g., n⁻-type) oxide semiconductor layer. After that, the oxygen-deficient portion of the oxide semiconductor layer is compensated by the formation of an oxide insulating layer which is in contact with the oxide semiconductor layer. Thus, the oxide semiconductor layer is made to be i-type; that is, the oxide semiconductor layer is changed into a high-resistance oxide semiconductor layer. Accordingly, it is possible to form a highly reliable transistor having favorable electric characteristics.

In the oxide semiconductor layer which is sufficiently dehydrated or dehydrogenated under the above conditions, at least a peak at around higher than or equal to 250° C. and lower than or equal to 300° C. of two peaks in spectra which show discharge of moisture is not detected in thermal desorption spectroscopy (TDS) even when the temperature of the dehydrated or dehydrogenated oxide semiconductor layer is increased to 450° C.

Figure 1B:
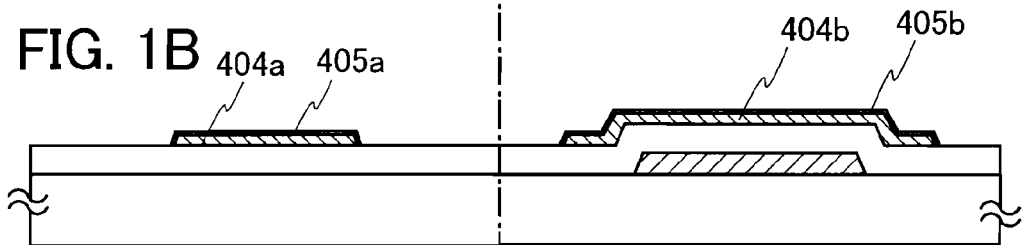

Note that the oxide semiconductor layer 404a and the oxide semiconductor layer 404b are each an amorphous layer having many dangling bonds at the stage where the oxide semiconductor film 403 is formed. Through a first heating step for the dehydration or dehydrogenation, dangling bonds that exist close to each other are bonded, so that the oxide semiconductor layers can have an ordered amorphous structure. When the ordering proceeds, the oxide semiconductor layers 404a and 404b are formed of a mixture of amorphousness and microcrystals, where an amorphous region is dotted with microcrystals, or are formed of amorphousness. A crystalline region 405a including nanocrystals and a crystalline region 405b including nanocrystals are formed in superficial portions of the oxide semiconductor layer 404a and the oxide semiconductor layer 404b (FIG. 1B). The rest of the oxide semiconductor layer 404a and the oxide semiconductor layer 404b come to be amorphous or be formed of a mixture of amorphousness and microcrystals, where an amorphous region is dotted with microcrystals. Note that the crystalline region 405a and the crystalline region 405b are part of the oxide semiconductor layer 404a and the oxide semiconductor layer 404b respectively, and hereinafter, the "the oxide semiconductor layer 404a" and "the oxide semiconductor layer 404b" include the crystalline region 405a and the crystalline region 405b, respectively. Here, the microcrystal is a so-called nanocrystal with a particle size greater than or equal to 1 nm and less than or equal to 20 nm, which is smaller than that of a microcrystalline particle generally called a microcrystal.

It is preferable that nanocrystals whose c-axes are oriented in a direction perpendicular to a surface of the layer be formed in the crystalline regions 405a and 405b. In that case, it is preferable that the long axis of the crystal be in the c-axis direction and the size in the short-axis direction be greater or equal to 1 nm and less or equal to 20 nm.

Note that, the crystalline region is not formed in a side surface portion of the oxide semiconductor layer depending on the order of steps, and in such a case, the crystalline region is formed only in a superficial portion except for the side surface portion. However, the area of the side surface portion is small, and the effect of suppressing the deterioration of electric characteristics can be maintained in that case as well.

The oxide semiconductor layers 404a and 404b after the first heat treatment are oxygen-deficient oxide semiconductor layers having a carrier concentration increased from the carrier concentration right after the film formation, preferably having a carrier concentration higher than or equal to $1 \times 10^{18}/cm^3$, that is, the low-resistant oxide semiconductor layers 404a and 404b are formed.

Depending on the conditions of the first heat treatment or a material, the gate electrode layer 421 may be crystallized and changed to a microcrystalline film or a polycrystalline film in some cases. For example, in the case where an indium tin oxide is used for the gate electrode layer 421, the gate electrode layer is crystallized by the first heat treatment at 450° C. for one hour, whereas in the case where an indium tin oxide containing silicon oxide is used for the gate electrode layer 421, the gate electrode layer is not easily crystallized.

The first heat treatment for the oxide semiconductor layers can be performed before the oxide semiconductor film is processed into the island-shaped oxide semiconductor layers. In that case, after the first heat treatment, the substrate is taken out of the heating apparatus and subjected to a photolithography step to form the island-shaped oxide semiconductor layers.

Then, although not illustrated, an opening (also referred to as a contact hole) for connecting the gate electrode layer to the source electrode layer or the drain electrode layer which will be described later is formed in the first insulating layer 402. The contact hole is formed by forming a mask over the first insulating layer 402 by a photolithography technique, an ink-jet method, or the like, and then selectively etching the first insulating layer 402 using the mask. Note that the contact hole may be formed after the formation of the first insulating layer 402 and before the formation of the oxide semiconductor film 403.

Then, a conductive film of W, Ta, Mo, Ti, Cr, or the like or a conductive film of an alloy or the like including a combination of any of the above-described elements is formed with a thickness greater than or equal to 100 nm and less than or equal to 500 nm, preferably greater than or equal to 200 nm and less than or equal to 300 nm by a sputtering method, a vacuum evaporation method, or the like over the oxide semiconductor layers 404a and 404b. The conductive film is not limited to a single layer containing the above-described element and may have two or more layers. However, a material of the conductive film preferably has heat resistance that can withstand at least second heat treatment performed later.

Further, a transparent conductive oxide including any of indium, tin, or zinc may be used for the conductive film. For example, indium oxide ($In_2O_3$) or an indium oxide-tin oxide alloy ($In_2O_3$—$SnO_2$, abbreviated to ITO) is preferably used. Alternatively, a transparent conductive oxide to which an insulating oxide such as silicon oxide is added may be used. When a transparent conductive oxide is used for the conductive film, the aperture ratio of the display device can be improved.

For the conductive film which is in contact with the oxide semiconductor layers 404a and 404b, a material including metal with high oxygen affinity is preferable. As the metal with high oxygen affinity, one or more materials selected from titanium (Ti), manganese (Mn), magnesium (Mg), zirconium (Zr), beryllium (Be), and thorium (Th) are preferable. In this embodiment, a titanium film is used.

When the oxide semiconductor layer and the conductive film with high oxygen affinity are formed in contact with each other, the carrier density in the vicinity of the interface is increased and a low-resistance region is formed, whereby the contact resistance between the oxide semiconductor and the conductive film can be reduced. This is because the conductive film with high oxygen affinity extracts oxygen from the oxide semiconductor layer and thus either or both a layer which includes an excessive amount of metal in the oxide semiconductor layer (such a layer is referred to as a composite layer) and an oxidized conductive film are formed in the interface between the oxide semiconductor layer and the conductive film. For example, in a structure where an In—Ga—Zn—O-based oxide semiconductor layer is in contact with a titanium film, an indium-excess layer and a titanium oxide layer are formed in the vicinity of the interface where the oxide semiconductor layer is in contact with the titanium film in some cases. In other cases, either one of the indium-excess layer and the titanium oxide layer is formed in the vicinity of the interface where the oxide semiconductor layer is in contact with the titanium film. The indium-excess layer which is an oxygen-deficient In—Ga—Zn—O-based oxide semiconductor layer has high electric conductivity; therefore, the contact resistance between the oxide semiconductor layer and the conductive film can be reduced.

Note that a titanium oxide film having conductivity may be used as the conductive film in contact with the oxide semiconductor layer. In that case, in the structure where the In—Ga—Zn—O-based oxide semiconductor layer is in contact with the titanium oxide film, an indium-excess layer might be formed in the vicinity of the interface where the oxide semiconductor layer is in contact with the titanium oxide film.

As a formation method of the conductive film, an arc discharge ion plating method or a spray method may be employed. Alternatively, the conductive film may be formed by discharging a conductive nanopaste of silver, gold, copper, or the like using a screen printing method, an ink-jet method, or the like and baking the nanopaste.

Figure 1C:
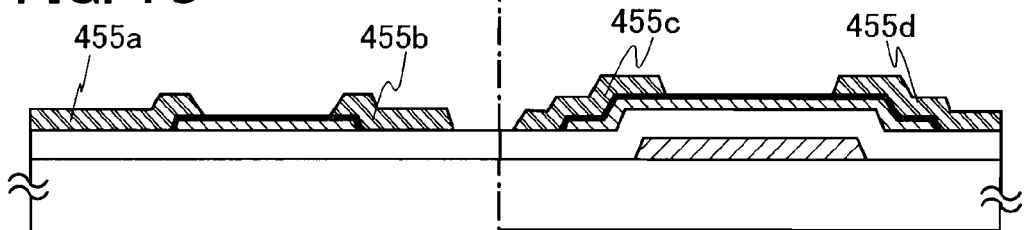

Then, a mask is formed over the conductive film by a photolithography method, an ink-jet method, or the like and the conductive film is etched using the mask; thus, the source electrode layers 455a and 455c and the drain electrode layers 455b and 455d are formed (FIG. 1C). In this embodiment, a 200-nm-thick Ti film is formed by a sputtering method as the conductive film, and the conductive film is selectively etched by a wet etching method or a dry etching method using a resist mask, to form the source electrode layers 455a and 455c and the drain electrode layers 455b and 455d.

Figure 1D:
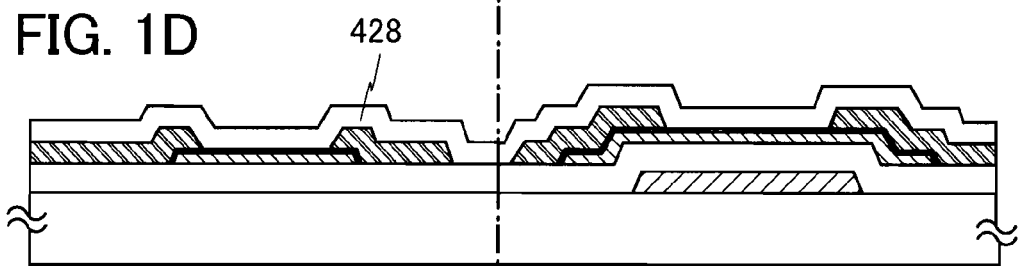
Figure 1E:
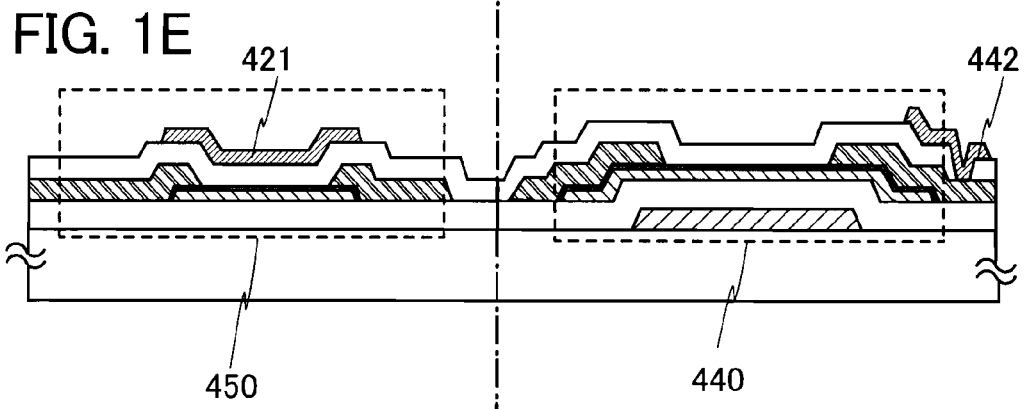

Next, the second insulating layer 428 which covers the source electrode layers 455a and 455c, the drain electrode layers 455b and 455d, and the exposed oxide semiconductor layers 404a and 404b is formed (FIG. 1D). As the second insulating layer 428, an oxide insulating film such as a silicon oxide film, a silicon oxynitride film, an aluminum oxide film, or a tantalum oxide film can be used. Note that the second insulating layer 428 functions as a gate insulating layer in the transistor 450.

The second insulating layer 428 functioning as a gate insulating layer of the transistor 450 may be formed to have a stacked structure. In the case of forming the second insulating layer having a stacked structure, an oxide insulating film such as a silicon oxide film, a silicon oxynitride film, an aluminum oxide film, or a tantalum oxide film is formed as a first layer (a layer in contact with the oxide semiconductor layer), and a film containing a material similar to that of the first insulating layer 402 such as silicon nitride oxide, silicon nitride, aluminum oxide, or tantalum oxide, without limitation to an oxide, can be formed as a second (or more) layer.

The second insulating layer 428 can be formed appropriately using a sputtering method or the like, i.e. a method in which impurities such as moisture or hydrogen are not mixed into the oxide insulating film. In this embodiment, a silicon oxide film is formed as the second insulating layer by a sputtering method. The substrate temperature in the deposition may be higher than or equal to room temperature and lower than or equal to 300° C. and in this embodiment, the substrate temperature in film formation is 100° C. In order to prevent entry of impurities such as water or hydrogen in the deposition, it is preferable to perform pre-baking under reduced pressure at a temperature higher than or equal to 150° C. and lower than or equal to 350° C. for greater than or equal to two minutes and less than or equal to ten minutes before the deposition, and to form a second insulating layer without exposure to the air. The silicon oxide film can be formed by a sputtering method under a rare gas (typically, argon) atmosphere, an oxygen atmosphere, or a mixed atmosphere of a rare gas (typically, argon) and oxygen. As a target, a silicon oxide target or a silicon target may be used. For example, with the use of a silicon target, a silicon oxide film can be formed by a sputtering method in an atmosphere of oxygen and a rare gas. The oxide insulating film which is formed in contact with the low-resistant oxide semiconductor layer is preferably formed using an inorganic insulating film that does not contain impurities such as moisture, a hydrogen ion, and OH and blocks entry of such impurities from the outside.

In this embodiment, deposition is performed by a pulsed DC sputtering method with the use of a columnar polycrystalline, boron-doped silicon target having a purity of 6N (with a resistivity of 0.01 Ω·cm) under conditions where the distance between the substrate and the target (T-S distance)

is 89 mm, the pressure is 0.4 Pa, the direct current (DC) power is 6 kW, and the atmosphere is an oxygen atmosphere (the proportion of the oxygen flow is 100%). The film thickness is 300 nm.

Next, second heat treatment is performed in an inert-gas atmosphere or a nitrogen atmosphere (preferably at a temperature higher than or equal to 200° C. and lower than or equal to 400° C., e.g., higher than or equal to 250° C. and lower than or equal to 350° C.). For example, the second heat treatment is performed in a nitrogen atmosphere at 250° C. for one hour. Alternatively, RTA treatment may be performed at high temperature for a short time as in the first heat treatment. In the second heat treatment, heating is performed in the state where the oxide insulating layer and the oxide semiconductor layer are in contact with each other. By the second heat treatment, oxygen is supplied to the oxide semiconductor layers 404a and 404b whose resistance is reduced by the first heat treatment and the oxygen-deficient portions are compensated; thus, the oxide semiconductor layers can be changed into a high-resistance oxide semiconductor layers (i-type oxide semiconductor layers).

In this embodiment, the second heat treatment is performed after formation of the silicon oxide film; however, the timing of the heat treatment is not limited to the timing immediately after formation of the silicon oxide film as long as it is after deposition of the silicon oxide film.

Next, by a photolithography step, a resist mask is formed, and the second insulating layer 428 is etched to form a contact hole reaching the drain electrode layer 455d. A conductive film is formed over the second insulating layer 428, and then the conductive film is subjected to a photolithography step, so that the gate electrode layer 421 and a connection electrode layer 442 which is connected to a pixel electrode layer in a later step are formed (FIG. 1E). As the conductive film, a single-layer film including an element selected from Al, Cr, Cu, Ta, Ti, Mo, and W or a stacked film including the above film can be used. Note that in the case where the drain electrode layer 455d and the pixel electrode layer are directly connected, the connection electrode layer 442 may be omitted.

Although not illustrated, in this step, a conductive layer may be formed in a position overlapping with the channel formation region of the oxide semiconductor layer 404b. The conductive layer in a position overlapping with the channel formation region of the oxide semiconductor layer 404b can increase reliability of the transistor. Specifically, in a bias-temperature stress test (hereinafter referred to as BT test) for examining reliability of the transistor 440, the amount of shift in threshold voltage of the transistor between before and after the BT test can be reduced. The electric potential of the conductive layer may be the same as or different from that of the gate electrode layer 451. The conductive layer can also function as a second gate electrode layer. The potential of the conductive layer may be GND, 0V, or in a floating state.

Note that a protective insulating layer may be formed so as to cover the transistors 440 and 450. The protective insulating layer is formed using a silicon nitride film, a silicon nitride oxide film, an aluminum nitride film, or the like.

A planarization insulating layer may be formed over the transistors 440 and 450. The planarization insulating layer can be formed of a heat-resistant organic material such as an acrylic resin, polyimide, benzocyclobutene, polyamide, or an epoxy resin. Other than such organic materials, it is also possible to use a low-dielectric constant material (a low-k material), a siloxane-based resin, PSG (phosphosilicate glass), BPSG (borophosphosilicate glass), or the like. Note that the planarization insulating layer may be formed by stacking a plurality of insulating films formed of these materials. Further, a color filter layer may be used as a planarization insulating layer.

A storage capacitor in which a dielectric including the insulating layer 402 or the second insulating layer 428 is arranged between a capacitor wiring which can be formed using the same material by the same step as the gate electrode layer 451 and a capacitor electrode which can be formed using the same material by the same step as the gate electrode layer 421 may be formed over the same substrate. The transistor 440 and the storage capacitor are arranged in matrix corresponding to respective pixels to form a pixel portion, and the driver circuit portion including the transistor 450 is arranged in the periphery of the pixel portion. In this way, one of the substrates for forming an active matrix display device can be obtained.

Further, in the case where a display device is manufactured using the transistors 440 and 450, a power source supply line which is electrically connected to the source electrode layer of the driving transistor is provided. The power source supply line intersects with a gate wiring and is formed using the same material by the same step as the connection electrode layer 442 formed using a metal conductive film.

Furthermore, in the case where a light-emitting device is manufactured, one electrode of the light-emitting element is electrically connected to the source electrode layer or the drain electrode layer of the driving transistor, and a common potential line which is electrically connected to the other electrode of the light-emitting element is provided. Note that the common potential line is formed using the same material and through the same process as the connection electrode layer 442 formed using a metal conductive film. Alternatively, the common potential line is formed using the same material by the same step as the gate electrode layer 451.

When the transistors are manufactured in the above-described manner, the hydrogen concentration of the oxide semiconductor layers 404a and 404b is reduced and the off-state current of the transistors is smaller than or equal to $1 \times 10^{-13}$ A. The transistors with excellent characteristics can be obtained by applying the purified oxide semiconductor layers 404a and 404b in which the hydrogen concentration is sufficiently reduced.

Silicon carbide (e.g., 4H—SiC) is a semiconductor material that can be compared to an oxide semiconductor. There are some commonalities between an oxide semiconductor and 4H—SiC. The carrier concentration is one example of the commonalities between the oxide semiconductor and 4H—SiC. In accordance with Fermi-Dirac distribution at room temperature, the minority carrier density in an oxide semiconductor is estimated to be approximately $10^{-7}/cm^3$. This value of the minority carrier density is extremely small similarly to that of 4H—SiC, which is $6.7 \times 10^{11}/cm^3$. When the minority carrier density of an oxide semiconductor is compared with the intrinsic carrier density of silicon (approximately $1.4 \times 10^{10}/cm^3$), it can be understood well that the minority carrier density of an oxide semiconductor is significantly low.

In addition, the energy band gap of the oxide semiconductor is greater than or equal to 3.0 eV and less than or equal to 3.5 eV, and the energy band gap of 4H—SiC is 3.26 eV. Therefore, an oxide semiconductor has in common with silicon carbide in being a wide band-gap semiconductor.

On the other hand, there is a major difference between an oxide semiconductor and silicon carbide, that is, the process temperature. In general, a process for activating a dopant in silicon carbide requires a heat treatment at higher than or equal to 1500° C. and lower than or equal to 2000° C. At such a high temperature, a semiconductor substrate, a semiconductor element, or the like using a material other than silicon carbide is damaged, and thus, it is difficult to form a semiconductor element using silicon carbide over a semiconductor element using a semiconductor material other than silicon carbide. On the other hand, an oxide semiconductor can be deposited through heat treatment at higher than or equal to 300° C. and lower than or equal to 500° C. (at a temperature lower than or equal to the glass transition temperature, approximately 700° C. at a maximum). Therefore, it is possible to form a semiconductor element using an oxide semiconductor after forming an integrated circuit using another semiconductor material.

In the case of using an oxide semiconductor, there is an advantage that it is possible to use a substrate having low heat resistance such as a glass substrate, which is different from the case where silicon carbide is used. Moreover, an oxide semiconductor can be deposited without high-temperature heat treatment so that energy cost can be reduced sufficiently as compared with the case of using silicon carbide.

In general, an oxide semiconductor is an n-type semiconductor; however, in one embodiment of the present invention, an impurity especially water or hydrogen is removed so that an i-type oxide semiconductor is obtained. In this respect, it can be said that one embodiment of the disclosed invention includes a novel technical idea because it is different from an i-type semiconductor such as silicon added with an impurity.

<Conduction Mechanism of Transistor Including Oxide Semiconductor>

The conduction mechanism of a transistor including an oxide semiconductor will be described with reference to FIG. 22, FIGS. 23A and 23B, FIG. 24, FIG. 25, and FIGS. 26A and 26B. Note that the following description is just a consideration and does not deny the validity of the invention.

Figure 22:
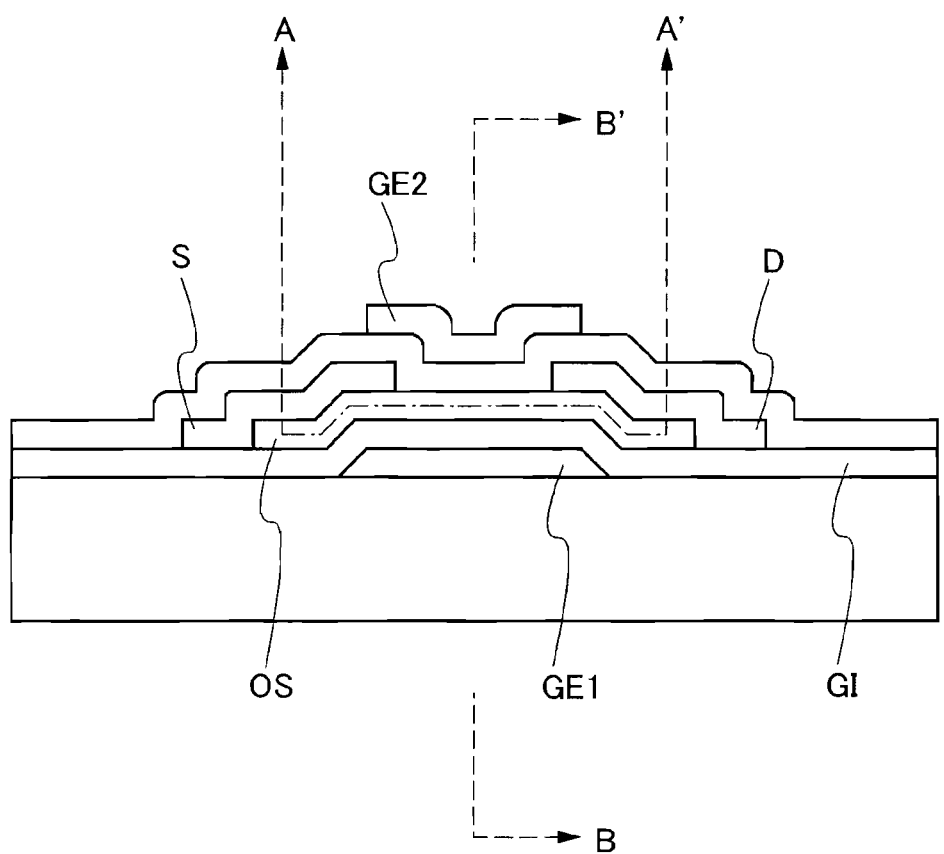
FIG. 22 is a longitudinal cross-sectional view of an inverted staggered transistor in which an oxide semiconductor is used.

FIG. 22 is a cross-sectional view of an inverted staggered transistor including an oxide semiconductor. An oxide semiconductor layer (OS) is provided over a gate electrode (GE1) with a gate insulating film (GI) provided therebetween, and a source electrode (S) and a drain electrode (D) are provided over the oxide semiconductor layer. Furthermore, a back gate (GE2) is provided over the source electrode and the drain electrode with an insulating layer provided therebetween.

Figure 23A:
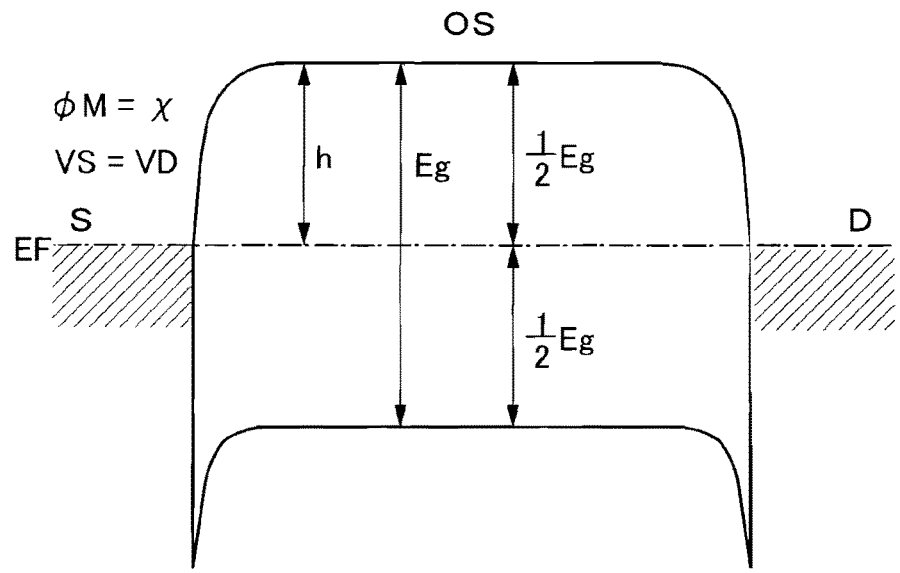
FIG. 23A shows an energy band diagram (a schematic diagram) along A-A' illustrated in FIG. 22 in the case in which the potential of the source and the potential of the drain are the same ($V_D=0$)
Figure 23B:
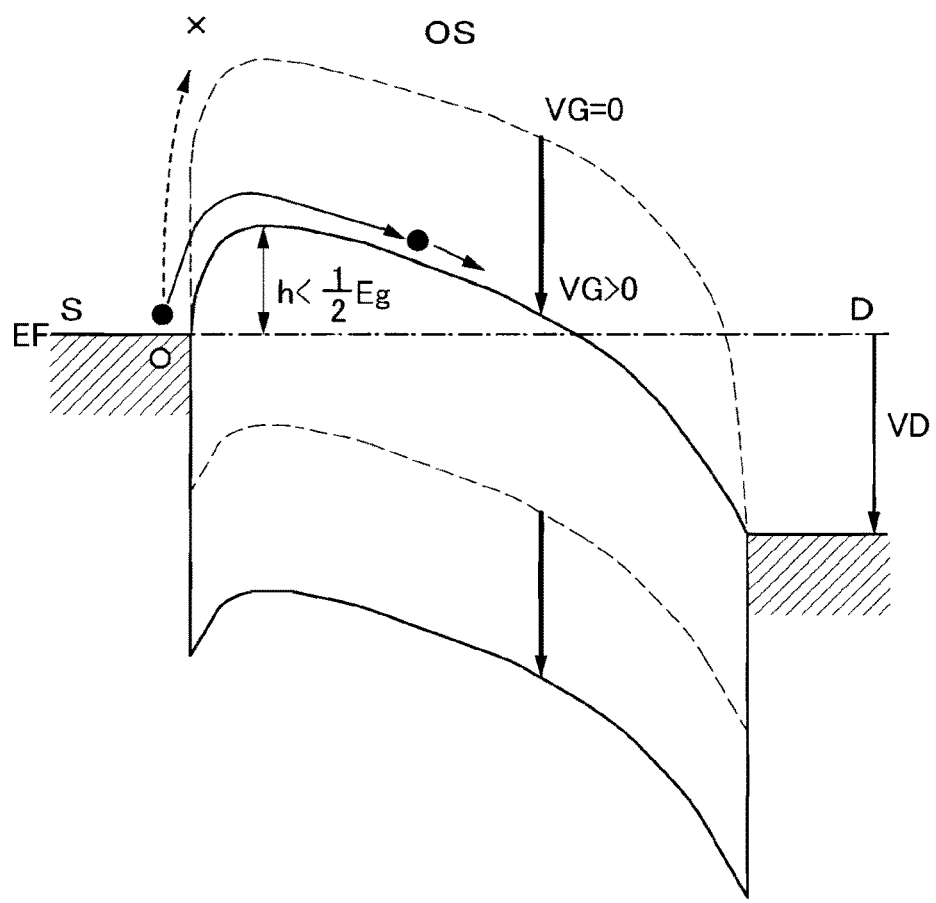
FIG. 23B shows an energy band diagram (a schematic diagram) along A-A' illustrated in FIG. 22 in the case in which positive potential is applied to the drain ($V_D$>0) with respect to the source.

FIGS. 23A and 23B are energy band diagrams (schematic diagrams) along A-A' in FIG. 22. FIG. 23A shows a case where the voltage between the source and the drain is zero ($V_D=0$, the potential of the source and the potential of the drain are the same). FIG. 23B shows a case where positive potential is applied to the drain ($V_D>0$) with respect to the source.

Figure 25:
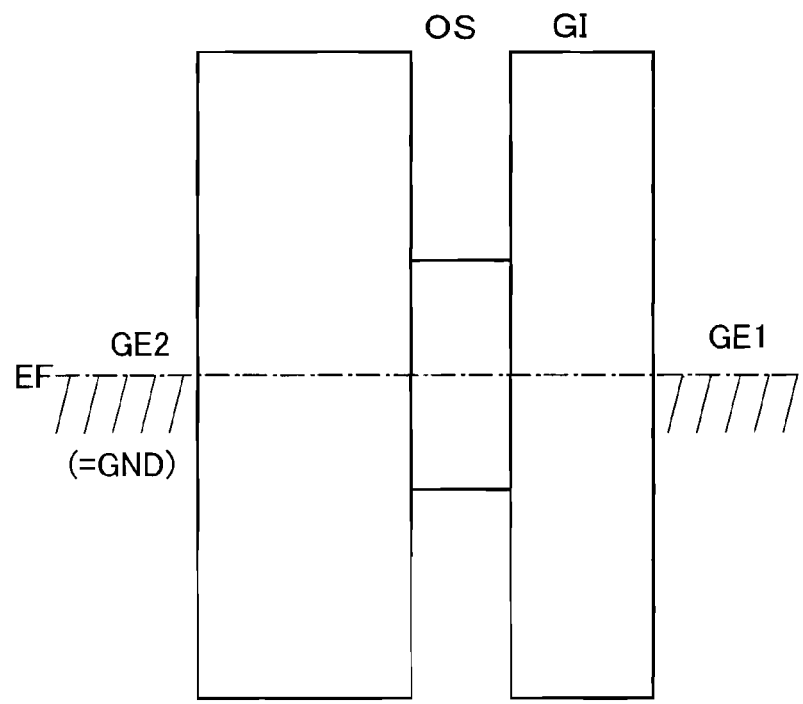
FIG. 25 shows an energy band diagram (a schematic diagram) along B-B' illustrated in FIG. 22 in the case in which the gate voltage is 0 V.
Figure 26A:
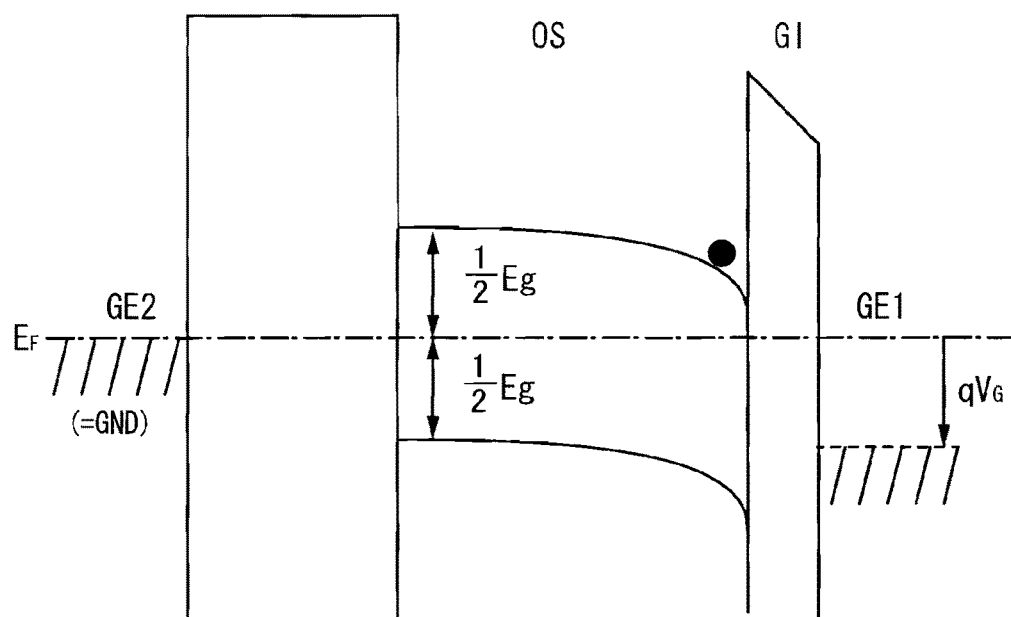
FIG. 26A shows an energy band diagram (a schematic diagram) along B-B' illustrated in FIG. 22 in the case in which a positive potential ($V_G$>0) is applied to a gate (GE1)
Figure 26B:
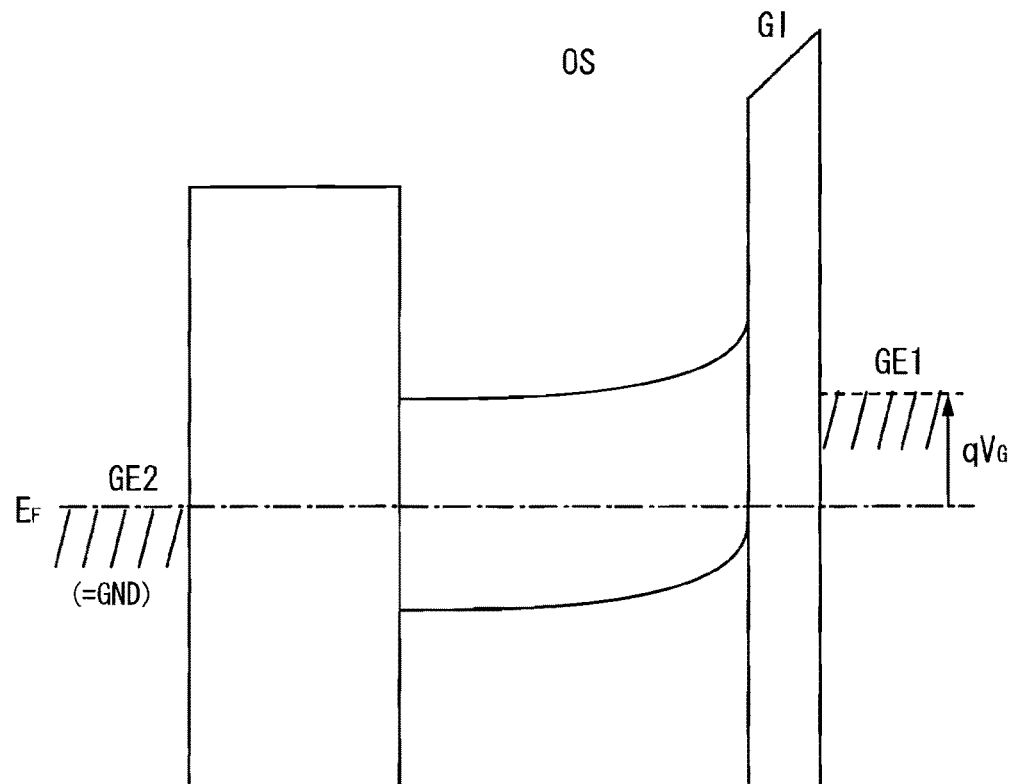
FIG. 26B shows an energy band diagram (a schematic diagram) along B-B' illustrated in FIG. 22 in the case in which a negative potential ($V_G$<0) is applied to the gate (GE1).

FIG. 25 and FIGS. 26A and 26B are energy band diagrams (schematic diagrams) along B-B' in FIG. 22. FIG. 25 shows a case where the gate voltage is 0 V. FIG. 26A shows a state where a positive potential ($V_G>0$) is applied to the gate (GE1), that is, a case where the transistor is in an ON state where carriers (electrons) flow between the source and the drain. FIG. 26B shows a state where a negative potential ($V_G<0$) is applied to the gate (GE1), that is, a case where the transistor is in an OFF state (where minority carriers do not flow).

In the state where the oxide semiconductor has a thickness of approximately 50 nm and the donor concentration in the purified oxide semiconductor is lower than or equal to $1\times10^{18}/cm^3$, a depletion layer expands to the entire oxide semiconductor in the off state. That is, the transistor can be regarded as a complete depletion transistor.

Figure 24:
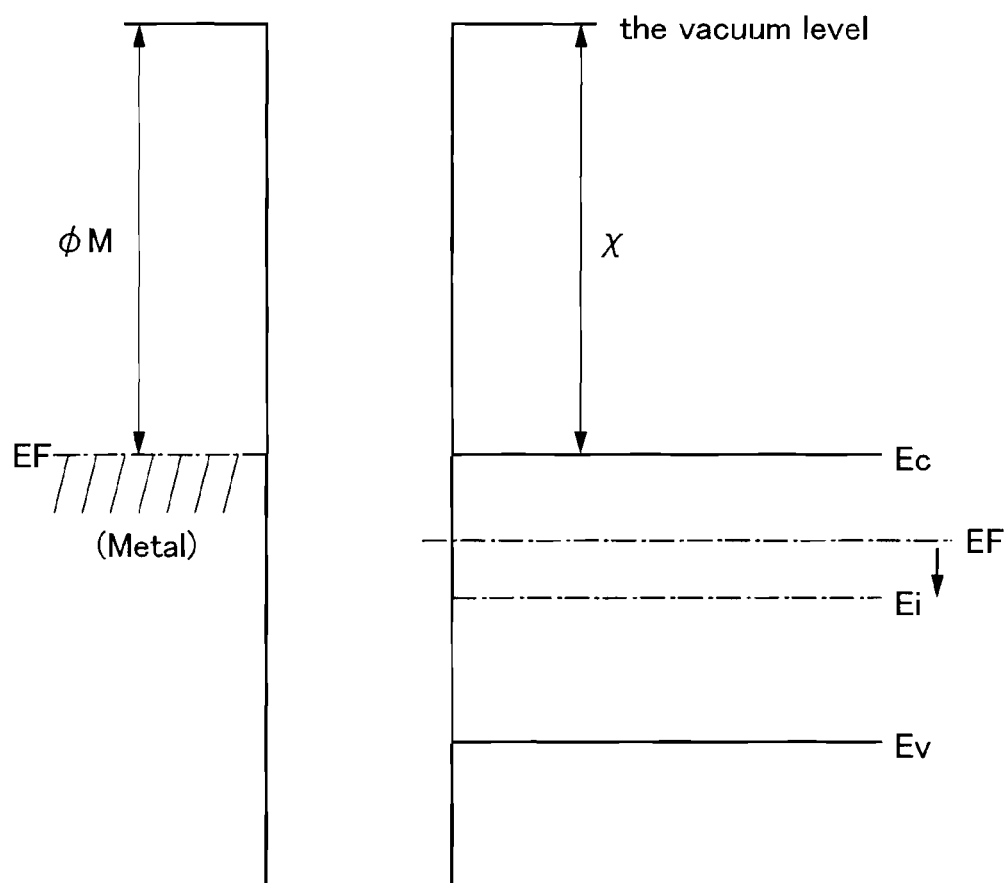
FIG. 24 shows a relation between the vacuum level and the work function of a metal ($\phi M$), and between the vacuum level and the electron affinity of an oxide semiconductor ($\chi$)

FIG. 24 shows a relation between the vacuum level and the work function of a metal ($\phi_M$) and a relation between the vacuum level and the electron affinity of an oxide semiconductor ($\chi$).

A conventional oxide semiconductor is of n-type in general, and the Fermi level ($E_f$) in that case is located closer to the conduction band and is away from the intrinsic Fermi level ($E_i$) that is located in the middle of the band gap. Note that it is known that part of hydrogen contained in the oxide semiconductor forms a donor and might be a factor that causes an oxide semiconductor to be an n-type oxide semiconductor.

On the other hand, an oxide semiconductor of the present invention is an intrinsic (i-type) or a substantially intrinsic oxide semiconductor which is obtained by removing hydrogen that is an n-type impurity from the oxide semiconductor and purifying the oxide semiconductor so that an impurity other than main components of the oxide semiconductor is prevented from being contained therein as much as possible. In other words, a feature is that a purified i-type (intrinsic) semiconductor or a semiconductor close thereto is obtained not by adding an impurity but by removing an impurity such as hydrogen or water as much as possible. This enables the Fermi level ($E_f$) to be at the same level as the intrinsic Fermi level ($E_i$).

It is said that in the case where the band gap ($E_g$) of the oxide semiconductor is 3.15 eV, electron affinity ($\chi$) is 4.3 eV. The work function of titanium (Ti) used for forming the source and drain electrodes is substantially equal to the electron affinity ($\chi$) of the oxide semiconductor. In that case, a Schottky barrier for electrons is not formed at an interface between the metal and the oxide semiconductor.

In other words, in the case where the work function of metal ($\phi M$) and the electron affinity ($\chi$) of the oxide semiconductor are equal to each other and the metal and the oxide semiconductor are in contact with each other, an energy band diagram (a schematic diagram) as illustrated in FIG. 23A is obtained.

In FIG. 23B, black circles (•) represent electrons. A dashed line indicates movement of electrons when a voltage is not applied to a gate ($V_G=0$) in the state where a positive voltage is given to a drain ($V_D>0$), and a solid line indicates movement of electrons when a positive voltage is applied to a gate ($V_G>0$) in the state where a positive voltage is given to a drain ($V_D>0$). In the case where a positive voltage is applied to the gate ($V_G>0$), on application of a positive potential to the drain, an electron is injected into the oxide semiconductor over the barrier (h) and flows toward the drain. In that case, the height of the barrier (h) changes depending on the gate voltage and the drain voltage; in the case where a positive voltage is applied to the gate ($V_G>0$) and a positive drain voltage is applied, the height of the barrier (h) is smaller than the height of the barrier in FIG. 23A where no voltage is applied, i.e., ½ of the band gap ($E_g$). In the case where a voltage is not applied to the gate, a carrier (electron) is not injected to the oxide semiconductor side from an electrode because of high potential barrier, so that a current does not flow, which means an off state. On the other hand, when a positive voltage is applied to the gate, potential barrier is reduced, and an on state where current flows is shown.

The electron injected into the oxide semiconductor at this time flows in the oxide semiconductor as illustrated in FIG. 26A. In FIG. 26B, when a negative potential is applied to the gate (GE1), the number of holes that are minority carriers is substantially zero; thus, the value of current becomes a value as close to zero as possible.

As described above, an oxide semiconductor is made to be an intrinsic (i-type) semiconductor or made to be a substantially intrinsic semiconductor by being purified so as not to contain impurities which are not main components of the oxide semiconductor as much as possible. Therefore, interface characteristics between the gate insulating film and the oxide semiconductor become obvious, and it is necessary to consider the interface characteristics and the bulk characteristics separately. Therefore, it is necessary to use a gate insulating film which can form a favorable interface with the oxide semiconductor. For example, it is preferable to use an insulating film which is formed by a CVD method using high-density plasma generated at a power supply frequency from the VHF band to the microwave band or an insulating film formed by a sputtering method.

When the oxide semiconductor is purified and the interface between the oxide semiconductor and the gate insulating film is favorable, even when the thin film transistor has a channel width W of $1 \times 10^4$ μm and a channel length of 3 μm, an off-state current of $10^{-13}$ A or lower at room temperature and a subthreshold value (S value) of 0.1 V/dec. (the thickness of the gate insulating film: 100 nm) are greatly expected.

As described above, the oxide semiconductor is purified so as to minimize the amount of impurities that are not main components of the oxide semiconductor but contained in the oxide semiconductor, whereby favorable operation of the transistor can be obtained.

In this embodiment, the channel formation region of the transistor 450 is a region which is located between a region in the oxide semiconductor layer 404*a*, which is in contact with the source electrode layer 455*a*, and a region in the oxide semiconductor layer 404*a*, which is in contact with the drain electrode layer 455*b*; which is in contact with the second insulating layer 428; and which overlaps with the gate electrode layer 421. In the oxide semiconductor layer of the transistor 450, a region in contact with the first insulating layer 402 is amorphous, or is formed of a mixture of amorphousness and microcrystals, and a superficial portion in contact with the second insulating layer 428 includes a crystalline region. Accordingly, the channel formation region is also the crystalline region of the oxide semiconductor layer 404*a*, and includes crystal grains in which c-axes are oriented in a direction substantially perpendicular to the surface of the oxide semiconductor layer 404*a*. For example, in the case of using an In—Ga—Zn—O-based oxide semiconductor material, nanocrystals are arranged so that c-axes of crystal grains are oriented in a direction perpendicular to the substrate plane (or a surface of the oxide semiconductor layer), whereby the direction of current flow in the transistor 450 is b-axes direction (or a-axes direction) of crystal grains. Therefore, high dynamic characteristics (on characteristics or frequency characteristics (referred to as f characteristics)) of the transistor 450 are realized, and the transistor 450 is suitably used in a driver circuit portion for which high-speed operation is needed, for example.

The channel formation region of the transistor 440 is a region which is located between a region in the oxide semiconductor layer 404*b*, which is in contact with the source electrode layer 455*c*, and a region in the oxide semiconductor layer 404*b*, which is in contact with the drain electrode layer 455*d*; which is in contact with the first insulating layer 402; and which overlaps with the gate electrode layer 451. Note that in the oxide semiconductor layer which becomes i-type or becomes substantially i-type (an oxide semiconductor layer which is purified) due to removal of an impurity, the carrier concentration is suppressed. In addition, a dense crystalline region including nanocrystals exists on the side opposite to a channel formation region of the oxide semiconductor layer, and thus, a change to an n-type, which is caused by entry of moisture from the superficial portion or elimination of oxygen, can be prevented. Therefore, the transistor 440 including the oxide semiconductor layer has an extremely small off-state current and excellent reliability, and thus can favorably be used as a transistor for a pixel portion to which a reduction of a leakage current is required.

In the above-described manner, in a driver circuit portion and a pixel portion, two kinds of transistors in each of which an oxide semiconductor layer including a crystalline region on one surface side (in a superficial portion) is used as an active layer are formed. Therefore, electric characteristics of the transistors can be selected by choosing the position of the gate electrode layer which determines the position of the channel. Further, a semiconductor device including a driver circuit portion capable of high-speed operation and a pixel portion over one substrate can be manufactured.

Note that this embodiment can be implemented in combination with any of the other embodiments as appropriate.

Embodiment 2

In this embodiment, an embodiment of a semiconductor device and a manufacturing method thereof, which are different from those in Embodiment 1, will be described with reference to FIGS. 2A to 2D. In this embodiment, as for the same portions as or portions having functions similar to those described in Embodiment 1 and steps, Embodiment 1 can be referred to and repetitive description is omitted.

Figure 2A:
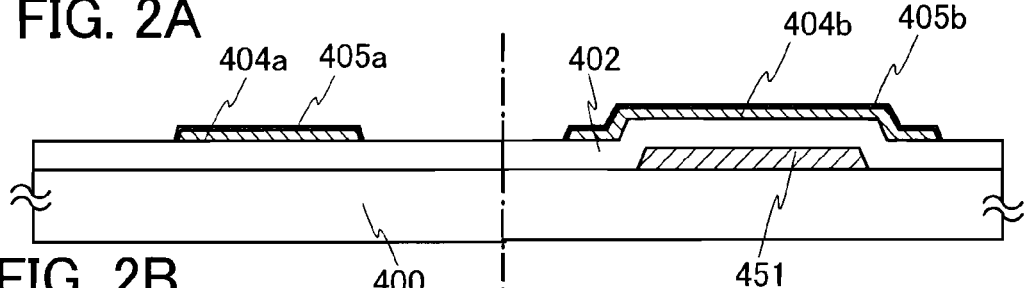
FIGS. 2A to 2D are cross-sectional process views illustrating an embodiment of the present invention.
Figure 2B:
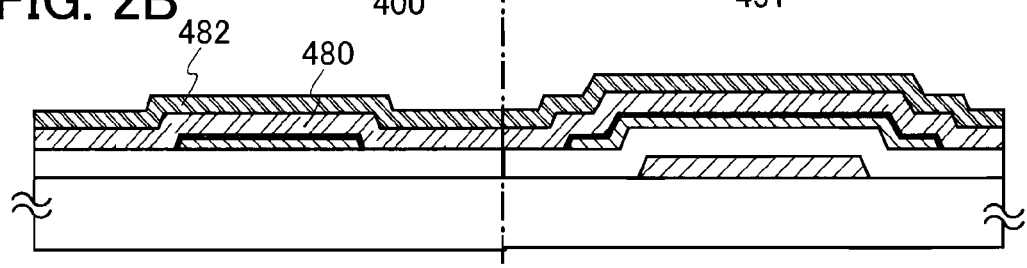
Figure 2C:
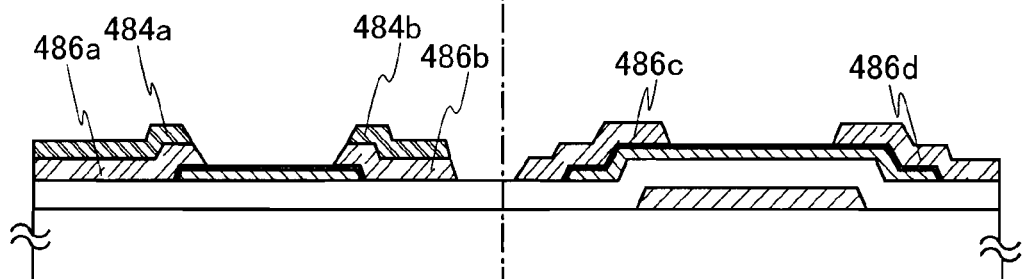

First, in accordance with the process illustrated in FIGS. 1A and 1B of Embodiment 1, the gate electrode layer 451, the first insulating layer 402, and the island-shaped oxide semiconductor layers 404*a* and 404*b* are formed over the substrate 400 having an insulating surface (see FIG. 2A). The superficial portions of the oxide semiconductor layers 404*a* and 404*b* illustrated in FIG. 2A are crystallized by the first heat treatment to become the crystalline regions 405*a* and 405*b* including nanocrystals. The rest of the region in the oxide semiconductor layers 404*a* and 404*b* is amorphous, or is formed of a mixture of amorphousness and microcrystals where an amorphous region is dotted with microcrystals. Note that the crystalline regions 405*a* and 405*b* are part of the oxide semiconductor layers 404*a* and 404*b* respectively, and hereinafter the oxide semiconductor layers 404*a* and 404*b* indicate portions including the crystalline regions 405*a* and 405*b*.

The oxide semiconductor layers 404*a* and 404*b* after the first heat treatment are oxygen-deficient oxide semiconductor layers having a carrier concentration increased from the carrier concentration right after the film formation, preferably having a carrier concentration higher than or equal to $1 \times 10^{18}/\text{cm}^3$, that is, the low-resistant oxide semiconductor layers 404*a* and 404*b* are formed.

Depending on the conditions of the first heat treatment or a material, the gate electrode layer 451 may be crystallized and changed to a microcrystalline film or a polycrystalline film in some cases. For example, in the case where an indium tin oxide is used for the gate electrode layer 451, the gate electrode layer is crystallized by the first heat treatment at 450° C. for one hour, whereas in the case where an indium tin oxide containing silicon oxide is used for the gate electrode layer 451, the gate electrode layer is not easily crystallized.

Next, although not illustrated, an opening (also referred to as a contact hole) for connection between the gate electrode layer and a source or drain electrode layer that is to be described later is formed in the first insulating layer 402. The contact hole is formed in such a manner that a mask is formed over the first insulating layer 402 by a photolithography technique, an ink-jet method, or the like and the first insulating layer 402 is selectively etched using the mask. Note that the contact hole may be formed after the formation of the first insulating layer 402 and before the formation of the oxide semiconductor film 403.

Then, an oxide conductive layer 480 and a metal conductive film 482 are stacked over the first insulating layer 402 and the oxide semiconductor layers 404a and 404b. By using a sputtering method, the oxide conductive layer 480 and the metal conductive film 482 can be formed in succession without being exposed to the air (see FIG. 2B).

It is preferable that the oxide conductive layer 480 be formed using a conductive material having a light-transmitting property to visible light among the above-described materials which can be applied to the gate electrode layer 451. In this embodiment, indium tin oxide containing silicon oxide is used.

As a material of the metal conductive film 482, an element selected from Ti, Mo, W, Al, Cr, Cu, and Ta, an alloy containing any of these elements as a component, an alloy containing these elements in combination, or the like is used. The metal conductive film is not limited to a single-layer structure including the above-described element and may have a stacked structure including two or more layers. The conductive film is formed by a sputtering method, a vacuum evaporation method (e.g., an electron beam evaporation method, or the like), an arc discharge ion plating method, or a spray method. In this embodiment, a titanium film formed by a sputtering method is used.

Next, by a photolithography step, a resist mask is formed and the metal conductive film 482 is selectively etched, so that a source electrode layer 484a and a drain electrode layer 484b of a transistor 470 that is disposed in a driver circuit portion are formed. Then, the resist mask is removed. The metal conductive film 482 is etched without any portion left over a transistor 460 that is disposed in a pixel portion.

Next, by a photolithography step, a resist mask is formed and the oxide conductive layer 480 is selectively etched. Thus, an oxide conductive layer 486a overlapping with the source electrode layer 484a and an oxide conductive layer 486b overlapping with the drain electrode layer 484b of the transistor 470 disposed in the driver circuit portion are formed, and a source electrode layer 486c and a drain electrode layer 486d of the transistor 460 disposed in the pixel portion are formed. Then, the resist mask is removed (see FIG. 2C).

Here, a mixed acid containing phosphoric acid, acetic acid, and nitric acid is used for etching of the oxide conductive layer 480. For example, a mixed acid containing phosphoric acid at 72.3%, acetic acid at 9.8%, nitric acid at 2.0%, and water at 15.9% can be used. Since the compositions of the oxide conductive layer 480 and the oxide semiconductor layers 404a and 404b are similar to each other, etching selectivity is low in many cases. However, the oxide conductive layers in this embodiment (indium tin oxide containing silicon oxide) are amorphous and a crystal group of nanocrystals is formed in the superficial portions of the oxide semiconductor layers (the In—Ga—Zn—O-based film); accordingly, a relatively high etching selectivity can be obtained. In the case of using the above-described mixed acid, the etching rate of the oxide conductive layer was 18.6 nm/sec., whereas the etching rate of the oxide semiconductor layer in which a crystal group including nanocrystals is formed was 4.0 nm/sec. Therefore, in the case where the oxide conductive layer is etched using the mixed acid with time controlled, the crystal group including nanocrystals in the superficial layer of the oxide semiconductor layers provided below the oxide conductive layer can be left without being etched.

By providing the oxide conductive layers between the oxide semiconductor layer and the source and drain electrode layers, contact resistance can be reduced, so that a transistor capable of high-speed operation can be realized. In this embodiment, in the transistor 470 disposed in the driver circuit portion, the oxide conductive layer 486a provided between the source electrode layer 484a and the oxide semiconductor layer 404a functions as a source region, and the oxide conductive layer 486b provided between the drain electrode layer 484b and the oxide semiconductor layer 404a functions as a drain region, which are effective in improving frequency characteristics of a peripheral circuit (a driver circuit).

Meanwhile, the source electrode layer 486c and the drain electrode layer 486d of the transistor 460 disposed in the pixel portion are formed using the light-transmitting oxide conductive layer, so that the aperture ratio can be improved.

Next, the second insulating layer 428 which covers the source electrode layers 484a and 486c, the drain electrode layers 484b and 486d, and the exposed oxide semiconductor layers 404a and 404b is formed. The second insulating layer 428 can be formed using an oxide insulating layer such as a silicon oxide film, a silicon oxynitride film, an aluminum oxide film, or a tantalum oxide film. The second insulating layer 428 functions as a gate insulating layer of the transistor 470.

The second insulating layer 428 functioning as a gate insulating layer of the transistor 470 may be formed to have a stacked structure. In the case of forming the second insulating layer 428 having a stacked structure, an oxide insulating film such as a silicon oxide film, a silicon oxynitride film, an aluminum oxide film, or a tantalum oxide film is formed as a first layer (a layer in contact with the oxide semiconductor layer), and a film containing a material similar to that of the first insulating layer 402 such as silicon nitride oxide, silicon nitride, aluminum oxide, or tantalum oxide, without limitation to an oxide, can be formed as a second (or more) layer.

The second insulating layer 428 can be formed using a method by which impurities such as water or hydrogen are not mixed into the oxide insulating film, such as a sputtering method, as appropriate. In this embodiment, a silicon oxide film is formed by a sputtering method as the second insulating layer. The substrate temperature in film formation may be higher than or equal to room temperature and lower than or equal to 300° C. and, in this embodiment, is 100° C. In order to prevent entry of impurities such as water or hydrogen in the film formation, pre-baking is preferably performed under reduced pressure at a temperature higher than or equal to 150° C. and lower than or equal to 350° C. for more than or equal to two minutes and less than or equal to ten minutes before the film formation, to form the second insulating layer without exposure to the air. The formation of the silicon oxide film by a sputtering method can be performed in a rare gas (typically, argon) atmosphere, an oxygen atmosphere, or an atmosphere including a rare gas (typically, argon) and oxygen. As a target, a silicon oxide target or a silicon target may be used. For example, a silicon oxide film can be formed by a sputtering method with use of a silicon target in an atmosphere of oxygen and a rare gas. It is preferable that the oxide insulating film formed in contact with the low-resistant oxide semiconductor layers be formed using an inorganic insulating film that does not contain impurities such as moisture, a hydrogen ion, and OH⁻ and blocks entry of such impurities from the outside.

In this embodiment, the film formation is performed by a pulsed DC sputtering method using a columnar polycrystalline silicon target which is doped with boron and has a purity of 6N (the resistivity is 0.01 Ω·cm), under the conditions where the distance between the substrate and the target (T-S distance) is 89 mm, the pressure is 0.4 Pa, the direct-current (DC) power source is 6 kW, and the atmosphere is oxygen (the proportion of the oxygen flow is 100%). The film thickness thereof is 300 nm.

Then, second heat treatment is performed in an inert gas atmosphere or a nitrogen gas atmosphere (preferably at a temperature higher than or equal to 200° C. and lower than or equal to 400° C., e.g., at a temperature higher than or equal to 250° C. and lower than or equal to 350° C.). For example, the second heat treatment is performed in a nitrogen atmosphere at 250° C. for one hour. Alternatively, RTA treatment may be performed at high temperature for a short time as in the first heat treatment. The second heat treatment is performed in the state that the oxide insulating layer and the oxide semiconductor layer are in contact with each other. By the second heat treatment, oxygen is supplied to the oxide semiconductor layers 404a and 404b which have a resistance reduced by the first heat treatment, so that the oxygen-deficient portions can be compensated and the oxide semiconductor layers 404a and 404b can have higher resistance (become i-type semiconductor layers).

Although the second heat treatment is performed after the formation of the silicon oxide film in this embodiment, the second heat treatment can be performed anytime after the formation of the silicon oxide film. The timing of the second heat treatment is not limited to right after the formation of the silicon oxide film.

Figure 2D:
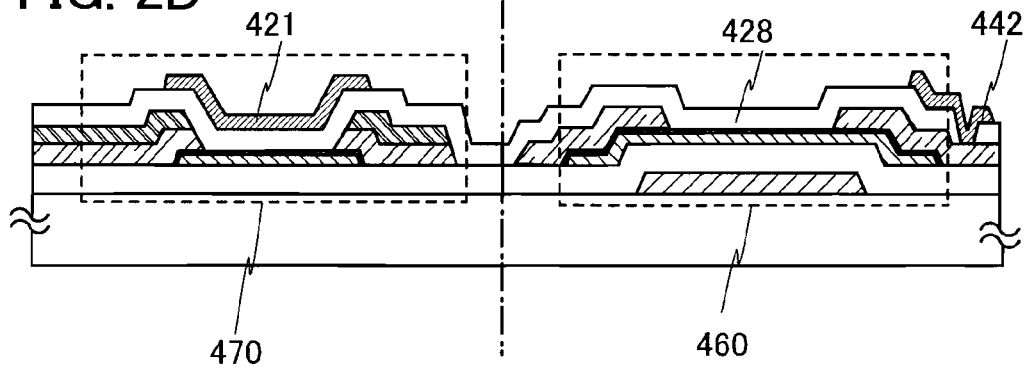

Next, by a photolithography step, a resist mask is formed, and the second insulating layer 428 is etched to form a contact hole reaching the drain electrode layer 486d. A conductive film is formed over the second insulating layer 428, and then the conductive film is subjected to a photolithography step, so that the gate electrode layer 421 and the connection electrode layer 442 which is connected to a pixel electrode layer in a later step are formed (FIG. 2D). As the conductive film, a single-layer film including an element selected from Al, Cr, Cu, Ta, Ti, Mo, and W or a stacked film including the above film can be used. Note that in the case where the drain electrode layer 486d and the pixel electrode layer are directly connected, the connection electrode layer 442 may be omitted.

Although not illustrated, in this step, a conductive layer may be formed in a position overlapping with the channel formation region of the oxide semiconductor layer 404b. The conductive layer in a position overlapping with the channel formation region of the oxide semiconductor layer 404b can increase reliability of the transistor 460. Specifically, in a BT test for examining reliability of a transistor, the amount of shift in threshold voltage of the transistor between before and after the BT test can be reduced. The electric potential of the conductive layer may be the same as or different from that of the gate electrode layer 451. The conductive layer can also function as a second gate electrode layer. Alternatively, the potential of the conductive layer may be GND, 0V, or in a floating state.

In this embodiment, the channel formation region of the transistor 470 is a region which is located between a region in the oxide semiconductor layer 404a, which is in contact with the oxide conductive layer 486a, and a region in the oxide semiconductor layer 404a, which is in contact with the oxide conductive layer 486b; which is in contact with the second insulating layer 428; and which overlaps with the gate electrode layer 421. In the oxide semiconductor layer of the transistor 470, a region in contact with the first insulating layer 402 is amorphous, or is formed of a mixture of amorphousness and microcrystals, and a superficial portion in contact with the second insulating layer 428 includes a crystalline region. Accordingly, the channel formation region is also the crystalline region of the oxide semiconductor layer 404a, and includes crystal grains in which c-axes are oriented in a direction substantially perpendicular to the surface of the oxide semiconductor layer 404a. For example, in the case of using an In—Ga—Zn—O-based oxide semiconductor material, nanocrystals are arranged so that c-axes of crystal grains are oriented in a direction perpendicular to the substrate plane (or a surface of the oxide semiconductor layer), whereby the direction of current flow in the transistor 470 is b-axes direction (or a-axes direction) of crystal grains. Therefore, high dynamic characteristics (on characteristics or frequency characteristics (referred to as f characteristics)) of the transistor 470 are realized, and the transistor 470 is suitably used in a driver circuit portion for which high-speed operation is needed, for example.

In the transistor 470, the oxide conductive layer 486a provided between the source electrode layer 484a and the oxide semiconductor layer 404a functions as a source region, and the oxide conductive layer 486b provided between the drain electrode layer 484b and the oxide semiconductor layer 404a functions as a drain region, which are effective in improving frequency characteristics of a peripheral circuit (a driver circuit).

The channel formation region of the transistor 460 is a region which is located between a region in the oxide semiconductor layer 404b, which is in contact with the source electrode layer 486c, and a region in the oxide semiconductor layer 404b, which is in contact with the drain electrode layer 486d; which is in contact with the first insulating layer 402; and which overlaps with the gate electrode layer 451. Note that in the oxide semiconductor layer which becomes i-type or becomes substantially i-type (an oxide semiconductor layer which is purified) due to removal of an impurity, the carrier concentration is suppressed. In addition, a dense crystalline region including nanocrystals exists on the side opposite to a channel formation region of the oxide semiconductor layer, and thus, a change to an n-type, which is caused by entry of moisture from the superficial portion or elimination of oxygen, can be prevented. Therefore, the transistor 460 including the oxide semiconductor layer has an extremely small off-state current and excellent reliability, and thus can favorably be used as a transistor for a pixel portion to which a reduction of a leakage current is required.

Further, in the transistor 460, the gate electrode layer 451, the source electrode layer 486c, and the drain electrode layer 486d are formed using a light-transmitting conductive layer, whereby the aperture ratio can be improved.

In the above-described manner, in a driver circuit portion and a pixel portion, two kinds of transistors in each of which an oxide semiconductor layer including a crystalline region on one surface side (in a superficial portion) is used as an active layer are formed. Therefore, electric characteristics of the transistors can be selected by choosing the position of the gate electrode layer which determines the position of the channel. Further, a semiconductor device including a driver circuit portion capable of high-speed operation and a pixel portion over one substrate can be manufactured.

Note that this embodiment can be implemented in combination with any of the other embodiments as appropriate.

Embodiment 3

In this embodiment, an example of a structure of a terminal portion provided over the same substrate as the transistors will be described with reference to FIGS. 10A1 to 10B2. Note that in FIGS. 10A1 to 10B2, components common to those of FIGS. 1A to 1E maintain the same reference numerals.

FIGS. 10A1 and 10A2 respectively illustrate a cross-sectional view and a top view of the terminal portion of the gate wiring. FIG. 10A1 is the cross-sectional view taken along line C1-C2 of FIG. 10A2. In FIG. 10A1, a conductive layer 415 formed over the second insulating layer 428 is a terminal electrode for connection which functions as an input terminal. Furthermore, in a terminal portion of FIG. 10A1, a first terminal 411 formed using the same material as the gate wiring of the transistor 440 and a connection electrode 412 formed using the same material as the source wiring overlap each other with the first insulating layer 402 interposed therebetween, and are in direct contact with each other so as to be electrically connected to each other. In addition, the connection electrode 412 and the conductive layer 415 are directly connected to each other through a contact hole formed in the second insulating layer 428 so as to be electrically connected to each other.

FIGS. 10B1 and 10B2 respectively illustrate a cross-sectional view and a top view of a source wiring terminal portion. FIG. 10B1 is the cross-sectional view taken along line C3-C4 of FIG. 10B2. In FIG. 10B1, a conductive layer 418 formed over the second insulating layer 428 is a terminal electrode for connection which functions as an input terminal. Further in a terminal portion of FIG. 10B1, an electrode layer 416 formed using the same material as the gate wiring of the transistor 440 is located below and overlapped with a second terminal 414 electrically connected to the source wiring with the first insulating layer 402 interposed therebetween. The electrode layer 416 is not electrically connected to the second terminal 414, and a capacitor for preventing noise or static electricity can be formed if the potential of the electrode layer 416 is set to a potential different from that of the second terminal 414, such as floating, GND, or 0 V. The second terminal 414 is electrically connected to the conductive layer 418, and the second insulating layer 428 is provided therebetween.

A plurality of gate wirings, source wirings, common potential lines, and power supply lines is provided depending on the pixel density. In the terminal portion, a plurality of first terminals at the same potential as the gate wiring, a plurality of second terminals at the same potential as the source wiring, a plurality of third terminals at the same potential as the power supply line, a plurality of fourth terminals at the same potential as the common potential line, and the like are arranged. There is no particular limitation on the number of each of the terminals, and the number of such terminals may be determined by a practitioner as appropriate. Note that the connection in the terminal portion is not limited to the structures illustrated in FIGS. 10A1 to 10B2.

This embodiment can be freely combined with any of the other embodiments.

Embodiment 4

In this embodiment, an example of manufacturing a pulse output circuit, which is a semiconductor device according to an embodiment of the present invention, using two kinds of transistors over one substrate and further forming a shift register by connecting a plurality of such pulse output circuits will be described with reference to FIGS. 3A to 3C and FIGS. 4A and 4B.

Note that a transistor is an element having at least three terminals of a gate, a drain, and a source. The transistor has a channel region between a drain region and a source region, and current can flow through the drain region, the channel region, and the source region. Here, since the source and the drain of the transistor may change depending on the structure, the operating condition, and the like of the transistor, it is difficult to define which is a source or a drain. Therefore, regions functioning as source and drain are not called the source and the drain in some cases. In such a case, for example, one of the source and the drain may be referred to as a first terminal and the other may be referred to as a second terminal.

Figure 3A:
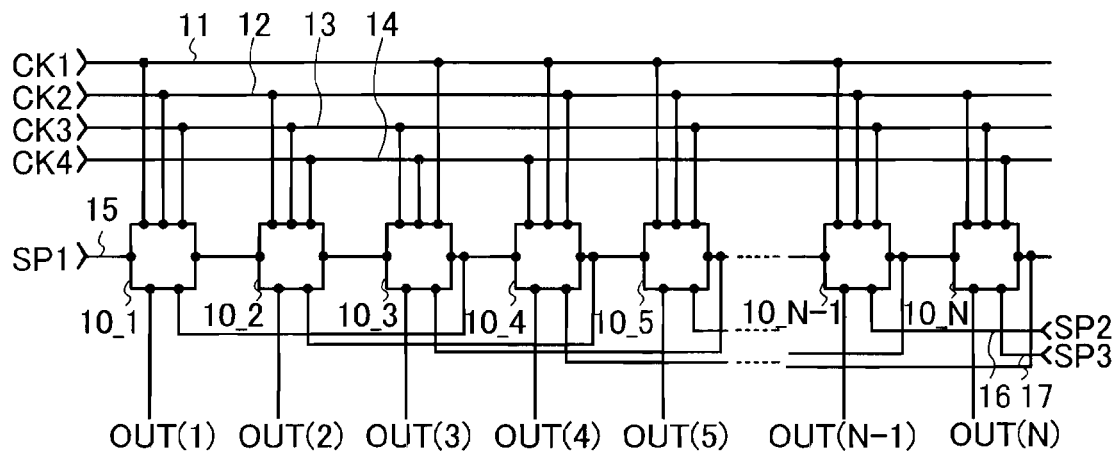
FIGS. 3A to 3C are circuit diagrams illustrating a structure of a shift register.

FIG. 3A illustrates a structure of a shift register. The shift register includes a first to N-th pulse output circuits 10_1 to 10_N (N is a natural number greater than or equal to 3).

The first to N-th pulse output circuits 10_1 to 10_N are connected to a first wiring 11, a second wiring 12, a third wiring 13, and a fourth wiring 14. A first clock signal CK1, a second clock signal CK2, a third clock signal CK3, and a fourth clock signal CK4 are supplied from the first wiring 11, the second wiring 12, the third wiring 13, and the fourth wiring 14, respectively.

Note that a clock signal (CK) is a signal that alternates between an H level (also referred to as an H signal or a signal at high power supply potential level) and an L level (also referred to as an L signal or a signal at low power supply potential level) at regular intervals. Here, the first to fourth clock signals (CK1) to (CK4) are delayed by ¼ period sequentially. In this embodiment, driving or the like of the pulse output circuits is controlled with the first to fourth clock signals (CK1) to (CK4). Note that the clock signal is also referred to as GCK or SCK in some cases depending on a driver circuit to which the clock signal is input; the clock signal is referred to as CK in the following description.

Figure 3B:
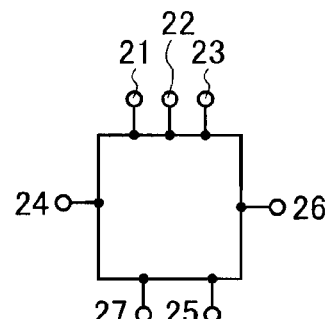

Each of the first to N-th pulse output circuits 10_1 to 10_N includes a first input terminal 21, a second input terminal 22, a third input terminal 23, a fourth input terminal 24, a fifth input terminal 25, a first output terminal 26, and a second output terminal 27 (see FIG. 3B). Although not illustrated, each of the first to N-th pulse output circuits 10_1 to 10_N is connected to a power supply line 51, a power supply line 52, and a power supply line 53.

The first input terminal 21, the second input terminal 22, and the third input terminal 23 of each of the pulse output circuits are electrically connected to any of the first to fourth wirings 11 to 14. For example, in the first pulse output circuit 10_1 in FIG. 3A, the first input terminal 21 is electrically connected to the first wiring 11, the second input terminal 22 is electrically connected to the second wiring 12, and the third input terminal 23 is electrically connected to the third wiring 13. In the second pulse output circuit 10_2, the first input terminal 21 is electrically connected to the second wiring 12, the second input terminal 22 is electrically connected to the third wiring 13, and the third input terminal 23 is electrically connected to the fourth wiring 14.

A start pulse SP1 (a first start pulse) is input from a fifth wiring 15 to the first pulse output circuit 10_1. To the n-th pulse output circuit 10_n of the second or subsequent stage (n is a natural number greater than or equal to 2 and less than or equal to N), a signal from the pulse output circuit of the preceding stage (such a signal is referred to as a preceding-stage signal OUT(n−1)) (n is a natural number greater than or equal to 2) is input.

In addition, a signal from the third pulse output circuit 10_3 is input to the first pulse output circuit 10_1 in the two stages before the third pulse output circuit 10_3. In a similar manner, a signal from the (n+2)-th pulse output circuit 10_(n+2) in two stages after the n-th pulse output circuit 10_n (such a signal is referred to as a subsequent-stage signal OUT(n+2)) is input to the n-th pulse output circuit 10_n in the second or subsequent stage. Therefore, from the pulse output circuit in each stage, a first output signal (OUT(1)(SR) to OUT(N)(SR)) to be input to a pulse output circuit in the next stage and/or in two stages before the pulse output circuit and a second output signal (OUT(1) to OUT(N)) for electrical connection to another wiring or the like are output.

That is, in the first pulse output circuit 10_1, the first clock signal CK1 is input to the first input terminal 21; the second clock signal CK2 is input to the second input terminal 22; the third clock signal CK3 is input to the third input terminal 23; a start pulse is input to the fourth input terminal 24; a subsequent-stage signal OUT(3) is input to the fifth input terminal 25; the first output signal OUT(1)(SR) is output from the first output terminal 26; and the second output signal OUT(1) is output from the second output terminal 27.

As illustrated in FIG. 3A, the subsequent-stage signal OUT(n+2) is not input to the last two stages of the shift register (10_N−1, 10_N). For example, a second start pulse SP2 from a sixth wiring 16 and a third start pulse SP3 from a seventh wiring 17 may be input to the pulse output circuits 10_N−1 and 10_N, respectively. Alternatively, a signal which is additionally generated in the shift register may be input. For example, an (N+1)-th pulse output circuit 10_(N+1) and an (N+2)-th pulse output circuit 10_(N+2) which do not contribute to output of pulses to the pixel portion (such circuits are also referred to as dummy stages) may be provided so that signals corresponding to the second start pulse (SP2) and the third start pulse (SP3) are generated in the dummy stages.

Next, a structure of a pulse output circuit of an embodiment of the present invention will be described with reference to FIG. 3C.

The first to N-th pulse output circuits 10_1 to 10_N are connected to the power supply line 51, the power supply line 52, and the power supply line 53. A first high power supply potential VDD, a second high power supply potential VCC, and a low power supply potential VSS are supplied through the power supply line 51, the power supply line 52, and the power supply line 53, respectively. Here, the relation of the power supply potentials of the power supply lines 51 to 53 is for example as follows: the first high power supply potential VDD is higher than or equal to the second high power supply potential VCC, and the second high power supply potential VCC is higher than the low power supply potential VSS. By making the potential VCC of the power supply line 52 lower than the potential VDD of the power supply line 51, a potential applied to a gate electrode of a transistor can be lowered, shift in threshold voltage of the transistor can be reduced, and deterioration of the transistor can be suppressed without an adverse effect on the operation of the transistor.

Note that the first to fourth clock signals (CK1) to (CK4) each alternate between an H level and an L level at regular intervals; the clock signal at the H level is VDD and the clock signal at the L level is VSS.

Figure 3C:
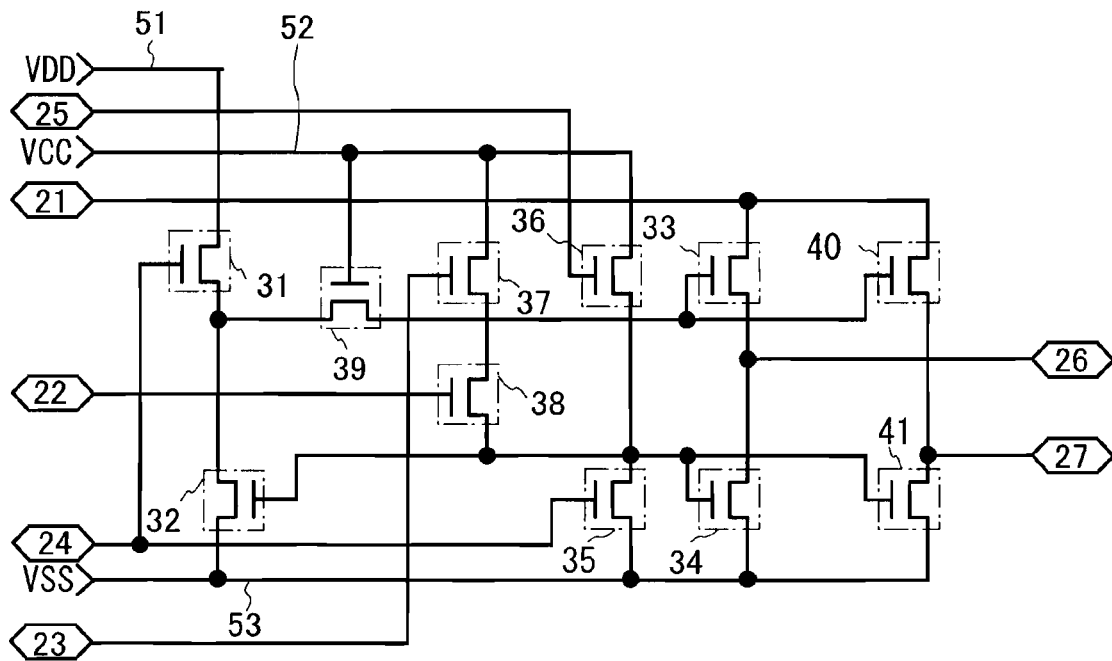

The first to N-th pulse output circuits 10_1 to 10_N each include a first to eleventh transistors 31 to 41 (see FIG. 3C). In this embodiment, a pulse output circuit is formed by forming two kinds of transistors over one substrate. Since the first to N-th pulse output circuits 10_1 to 10_N included in the shift register exemplified in this embodiment have the same configuration, the structure and operation of the first pulse output circuit 10_1 are described here.

The first pulse output circuit 10_1 includes a first to eleventh transistors 31 to 41. The first to eleventh transistors 31 to 41 are n-channel transistors each including a purified oxide semiconductor layer. In particular, a bottom-gate transistor having a positive threshold voltage and an extremely small off-state current, in which a purified oxide semiconductor layer having a reduced carrier concentration is used for a channel formation region, is employed as the second transistor 32 and the fifth transistor 35.

Note that the bottom-gate transistor is also suitable for transistors, to a gate electrode of which signals are directly input from the outside, in a pulse output circuit and a shift register formed by connecting a plurality of such pulse output circuits. For example, in the case of the first pulse output circuit 10_1, the bottom-gate transistor can be suitably applied to the first transistor 31 and the fifth transistor 35 which are connected to the fourth input terminal 24, to which a start pulse is input from the outside. The bottom-gate transistor has a high withstand voltage between the gate and the source and between the gate and the drain; therefore, problems such as the shift in threshold value of the transistor caused by abnormal input such as static electricity can be reduced.

As the third transistor 33, the sixth transistor 36, the tenth transistor 40, and the eleventh transistor 41, top-gate transistors having a high field-effect mobility and excellent f characteristics, in each of which a crystalline region formed in a superficial portion of a purified oxide semiconductor layer is used as a channel formation region, are used.

Since the top-gate transistors and the bottom-gate transistors can be manufactured in accordance with the methods for manufacturing the top-gate transistors 450 and 470 and the bottom-gate transistors 440 and 460 described in Embodiments 1 and 2, description of the manufacturing method thereof is omitted in this embodiment.

The first transistor 31, the fourth transistor 34, the seventh to ninth transistors 37 to 39 may have either a top-gate structure or a bottom-gate structure, but have a bottom-gate structure in this embodiment.

In FIG. 3C, a first terminal of the first transistor 31 is electrically connected to the power supply line 51, a second terminal of the first transistor 31 is electrically connected to a first terminal of the ninth transistor 39, and a gate electrode of the first transistor 31 is electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, and a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and a gate electrode of the sixth transistor 36 is electrically connected to the fifth input terminal 25. A first terminal of the seventh transistor 37 is electrically connected to the power supply line 52, a second terminal of the seventh transistor 37 is electrically connected to a second terminal of the eighth transistor 38, and a gate electrode of the seventh transistor 37 is electrically connected to the third input terminal 23. A first terminal of the eighth transistor 38 is electrically connected to the gate electrode of the second transistor 32 and the gate electrode of the fourth transistor 34, and a gate electrode of the eighth transistor 38 is electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to a gate electrode of the third transistor 33 and a gate electrode of the tenth transistor 40, and a gate electrode of the ninth transistor 39 is electrically connected to the power supply line 52. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34.

In FIG. 3C, the point at which the gate electrode of the third transistor 33, the gate electrode of the tenth transistor 40, and the second terminal of the ninth transistor 39 are connected is referred to as a node A. Further, the point at which the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 are connected is referred to as a node B. A capacitor having one electrode electrically connected to the node B may be additionally provided in order to hold a potential of the node B. Specifically, a capacitor having one electrode electrically connected to the node B and the other electrode electrically connected to the power supply line 53 may be provided.

Next, operation of a pulse output circuit illustrated in FIG. 4A will be described with reference to FIG. 4B, FIGS. 5A to 5D, FIGS. 6A to 6D, and FIGS. 7A and 7B. Specifically, operation of the pulse output circuit will be described in separate periods: a first period 61, a second period 62, a third period 63, a fourth period 64, and a fifth period 65 in a timing chart of FIG. 4B. In FIGS. 5A to 5D and FIGS. 6A to 6D, transistors indicated by a solid line is in an ON state (a conductive state) and transistors indicated by a broken line is in an OFF state (a non-conductive state).

Here, the output of the first pulse output circuit 10_1 is described. The first input terminal 21 of the first pulse output circuit 10_1 is electrically connected to the first wiring 11 through which the first clock signal (CK1) is supplied, the second input terminal 22 is electrically connected to the second wiring 12 through which the second clock signal (CK2) is supplied, and the third input terminal 23 is electrically connected to the third wiring 13 through which the third clock signal (CK3) is supplied.

In the following description, the first to eleventh transistors 31 to 41 are n-channel transistors and are turned on when the gate-source voltage (Vgs) exceeds the threshold voltage (Vth).

Further, for simplicity, description is made under the assumption that VSS is 0 here; however, the present invention is not limited thereto. A difference between VDD and VCC and a difference between VCC and VSS (in the case where the following relation is satisfied: VDD>VCC) are each higher than the threshold voltages of the transistors, that is, such differences can make the transistors in an ON state (a conductive state). When the potential of the power supply line 52 is lower than the potential of the power supply line 51, a potential applied to the gate electrodes of the second transistor 32, the fourth transistor 34, the ninth transistor 39, and the eleventh transistor 41 can be suppressed to be low; the shift of the threshold value of the second transistor 32, the fourth transistor 34, the ninth transistor 39, and the eleventh transistor 41 in the pulse output circuit can be reduced; and deterioration can be suppressed.

In the first period 61, the first start pulse (SP1) changes into an H level, so that the first transistor 31 and the fifth transistor 35, which are electrically connected to the fourth input terminal 24 of the first pulse output circuit 10_1 to which the first start pulse (SP1) is input, change into a conductive state. Since the third clock signal (CK3) is also at an H level, the seventh transistor 37 is also turned on. In addition, the second high power supply potential VCC is applied to the gate of the ninth transistor 39, thereby turning on the ninth transistor 39 (see FIG. 5A).

At this time, since the first transistor 31 and the ninth transistor 39 are on, the potential of the node A is increased. Meanwhile, since the fifth transistor 35 is on, the potential of the node B decreases.

The second terminal of the first transistor 31 serves as a source, and the potential of the second terminal of the first transistor 31 has such a value that is obtained by subtracting the threshold voltage of the first transistor 31 from the potential of the first power supply line 51, which can be expressed by VDD−Vth31 (Vth31 is a threshold voltage of the first transistor 31). When (VDD−Vth31) is higher than or equal to (VCC−Vth39) where Vth39 is a threshold voltage of the ninth transistor 39, the potential of the node A is (VCC−Vth39), whereby the ninth transistor 39 is turned off. The node A is in a floating state, maintaining the potential (VCC−Vth39). When (VDD−Vth31) is lower than (VCC−Vth39), the ninth transistor 39 is not turned off and the potential of the node A is increased to (VDD−Vth31).

In this embodiment, since the first transistor 31 to the eleventh transistor 41 all have the same threshold voltage Vth0, the potential of the node A is (VCC−Vth0) and the ninth transistor 39 is turned off. The node A is in a floating state, maintaining the potential (VCC−Vth0).

Here, the potential of the gate electrode of the third transistor 33 is (VCC−Vth0). The gate-source voltage of the third transistor 33 is higher than the threshold voltage thereof, that is, the following relation is obtained: VCC−Vth0>Vth33 (Vth33 is a threshold voltage of the third transistor 33 and is, in this embodiment, Vth0). Accordingly, the third transistor 33 is turned on.

In the second period 62, the first clock signal (CK1) supplied to the first input terminal 21 of the first pulse output circuit 10_1 is changed from an L level to an H level. Since the third transistor 33 has already been on, current flows between the source and the drain, and the potential of the output signal (OUT(1)(SR)) output from the output terminal 26, that is, the potential of the second electrode (the source electrode in this case) of the third transistor 33 starts increasing. There exists capacitive coupling due to parasitic capacitance between the gate and the source of the third transistor 33, and with the increase in the potential of the output terminal 26, the potential of the gate electrode of the third transistor 33 which is in a floating state is increased (bootstrap operation). Finally, the potential of the gate electrode of the third transistor 33 becomes higher than (VDD+Vth33) and the potential of the output terminal 26 becomes equal to VDD (see FIG. 4B and FIG. 5B).

At this time, since the fourth input terminal 24 of the first pulse output circuit 10_1 has an H level due to the supply of the first start pulse (SP1), the fifth transistor 35 is on, and the L level is maintained at the node B. Accordingly, when the potential of the output terminal 26 rises from an L level to an H level, a malfunction due to capacitive coupling between the output terminal 26 and the node B can be suppressed.

Next, in the first half of the third period 63, the first start pulse (SP1) changes into an L level, so that the first transistor 31 and the fifth transistor 35 are turned off. The first clock signal (CK1) keeps the H level from the second period 62, and the potential of the node A does not change as well; therefore, an H level signal is supplied to the first electrode of the third transistor 33 (see FIG. 5C). In the first half of the third period 63, each transistor connected to the node B is turned off, so that the node B is in a floating state. However, the potential of the output terminal 26 does not change, so that the influence from a malfunction due to capacitive coupling between the node B and the output terminal 26 is negligible.

Figure 4A:
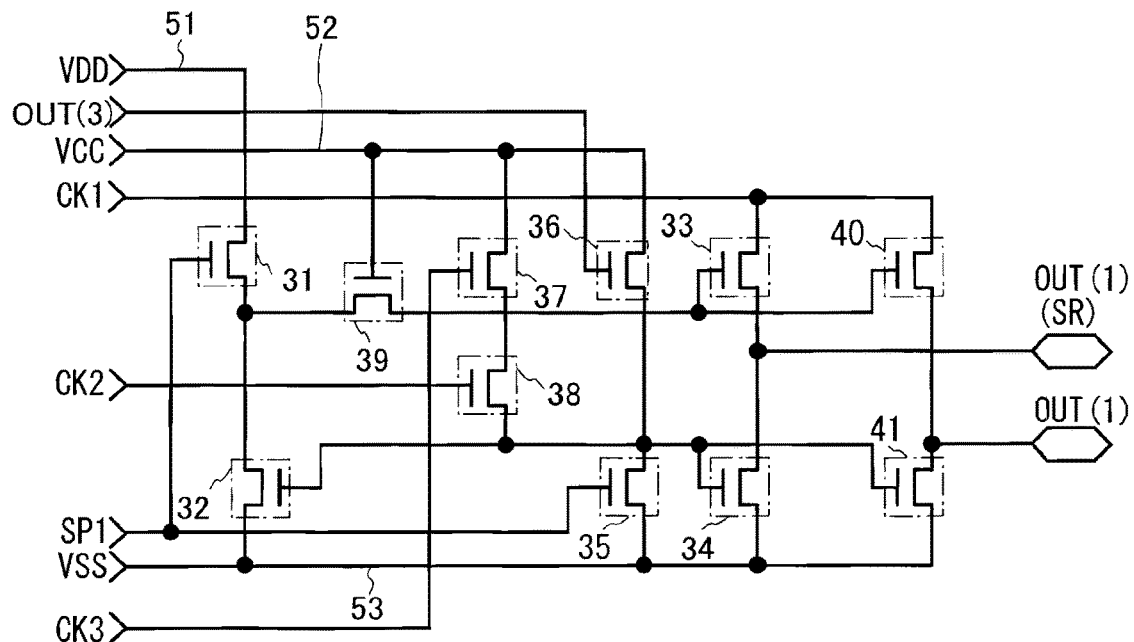
FIGS. 4A and 4B are a circuit diagram and a timing chart of operation of the shift register, respectively.

Note that by providing the ninth transistor 39 having the gate to which the second high power supply potential VCC is applied as illustrated in FIG. 4A, the following advantages before and after the bootstrap operation are obtained.

Without the ninth transistor 39 having the gate electrode to which the second high power supply potential VCC is applied, if the potential of the node A is raised by the bootstrap operation, the potential of the source which is the second terminal of the first transistor 31 rises to a value higher than the first high power supply potential VDD. Then, the first terminal of the first transistor 31, that is, the terminal on the power supply line 51 side, comes to serve as a source of the first transistor 31. Consequently, in the first transistor 31, a high bias voltage is applied and thus significant stress is applied between the gate and the source and between the gate and the drain, which might cause deterioration of the transistor.

On the other hand, with the ninth transistor 39 having the gate electrode to which the second high power supply potential VCC is applied, increase in the potential of the second terminal of the first transistor 31 can be prevented even when the potential of the node A is raised by the bootstrap operation. In other words, provision of the ninth transistor 39 can lower the level of negative bias voltage applied between the gate and the source of the first transistor 31. Thus, the circuit configuration in this embodiment can reduce negative bias voltage applied between the gate and the source of the first transistor 31, so that deterioration of the first transistor 31 due to stress can be reduced.

Note that the ninth transistor 39 can be provided anywhere as long as the first terminal and the second terminal of the ninth transistor 39 are connected between the second terminal of the first transistor 31 and the gate of the third transistor 33. Note that when the shift register including a plurality of pulse output circuits in this embodiment is included in a signal line driver circuit for which higher dynamic characteristics are required than a scan line driver circuit, the ninth transistor 39 may be omitted, which is advantageous in that the number of transistors is reduced.

In the latter half of the third period 63, the third clock signal (CK3) is changed into an H level, whereby the seventh transistor 37 is turned on. The second clock signal (CK2) keeps the H level from the first half of the third period 63, and the eighth transistor 38 is on, so that the potential of the node B is increased to VCC.

Since the potential of the node B is increased, the second transistor 32, the fourth transistor 34, and the eleventh transistor 41 change into an ON state, so that the potential of the output terminal 27 (OUT(1)) becomes an L level.

In the latter half of the third period 63, the second transistor 32 is turned on and an L level signal is supplied to the first terminal of the ninth transistor 39; thus, the ninth transistor 39 changes into an ON state and the potential of the node A is decreased.

Since the fourth transistor 34 changes into an ON state, the potential of the output terminal 26 is decreased (see FIG. 5D).

In the first half of the fourth period 64, the second clock signal (CK2) is changed from an H level to an L level, whereby the eighth transistor 38 changes into an OFF state. However, because the fifth input terminal 25 (OUT(3)) keeps the H level to keep the sixth transistor 36 in an ON state, the node B maintains VCC (see FIG. 6A).

Figure 4B:
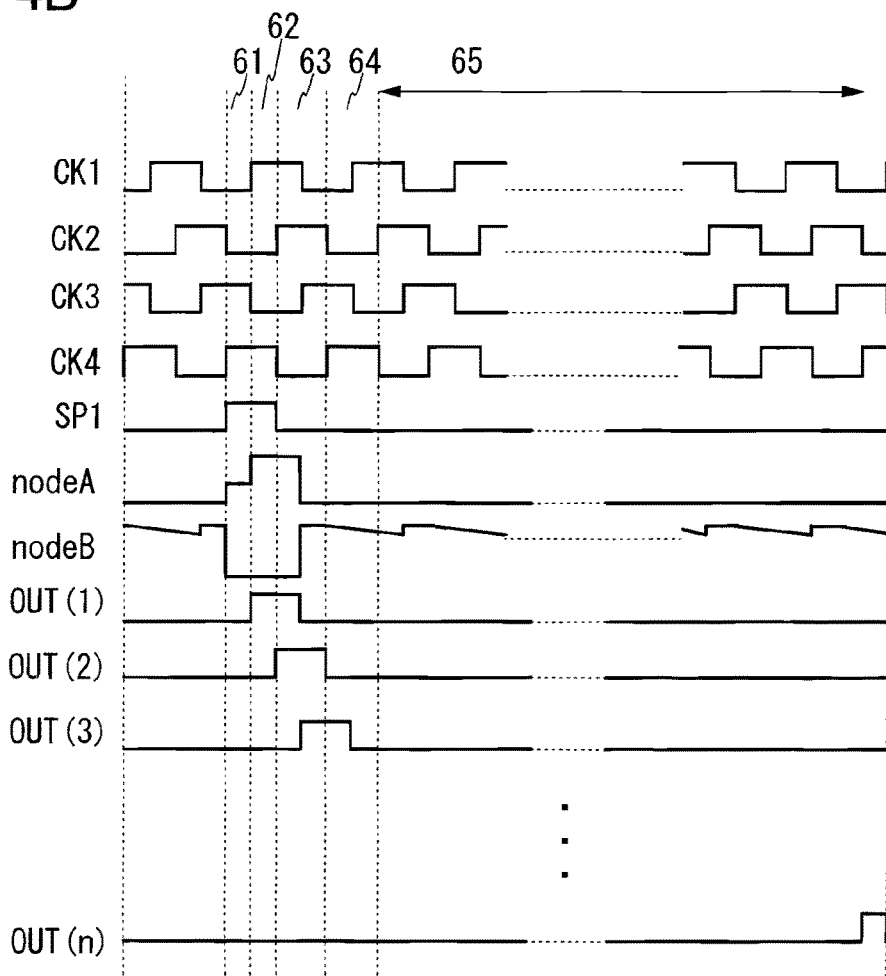

In the latter half of the fourth period 64, the fifth input terminal 25 (OUT(3)) of the first pulse output circuit 10_1 changes into an L level, whereby the sixth transistor 36 is turned off (see FIG. 6B). At this time, the node B changes from a state of holding a VCC level into a floating state. Accordingly, the second transistor 32, the fourth transistor 34, and the eleventh transistor 41 keep an ON state. Note that as illustrated in FIG. 4B, the potential of the node B is decreased from the VCC level due to an off-state current of a transistor or the like.

Then, the circuit cyclically repeats the operation. Such a period is referred to as a fifth period (see FIG. 6C and FIG. 6D). In a certain period in the fifth period 65 (a period when the second clock signal (CK2) and the third clock signal (CK3) are both at an H level), the seventh transistor 37 and the eighth transistor 38 are turned on and a signal at a VCC level is regularly supplied to the node B (see FIG. 6D).

With the structure in which a signal at a VCC level is regularly supplied to the node B in the fifth period 65, a malfunction of the pulse output circuit can be suppressed. In addition, by regularly turning on or off the seventh transistor 37 and the eighth transistor 38, a shift of a threshold value of the transistor can be reduced.

In the fifth period 65, in the case where the potential of the node B is decreased during the time when the signal at a VCC level is not supplied from the power supply line 52 to the node B, the node B may be provided with a capacitor in advance to reduce the decrease in the potential of the node B.

Although the second input terminal 22 is connected to the gate electrode of the eighth transistor 38 and the third input terminal 23 is connected to the seventh transistor 37 in the drawing, the connection relation may be changed so that the clock signal that has been supplied to the gate electrode of the eighth transistor 38 is supplied to the gate electrode of the seventh transistor 37 and the clock signal that has been supplied to the gate electrode of the seventh transistor 37 is supplied to the gate electrode of the eighth transistor 38. Even with this structure, a similar effect can be obtained.

In the pulse output circuit illustrated in FIG. 4A, if potentials of the second input terminal 22 and the third input terminal 23 are controlled so that the state is changed from the state where the seventh transistor 37 and the eighth transistor 38 are both on, to the state where the seventh transistor 37 is off and the eighth transistor 38 is still on, and then to the state where the seventh transistor 37 and the eighth transistor 38 are both off, a fall in the potential of the node B occurs twice because of the fall in the potential of the gate electrode of the seventh transistor 37 and the fall in the potential of the gate electrode of the eighth transistor 38.

On the other hand, in the pulse output circuit illustrated in FIG. 4A, when the state is changed from the state where the seventh transistor 37 and the eighth transistor 38 are both on, to the state where the seventh transistor 37 is still on and the eighth transistor 38 is off, and then to the state where the seventh transistor 37 and the eighth transistor 38 are both off as illustrated in FIG. 4B, the fall in the potential of the node B occurs only once because of the fall in the potential of the gate electrode of the eighth transistor 38. Thus, the number of falls in the potential can be reduced to one.

In other words, it is preferable that the clock signal is supplied from the third input terminal 23 to the gate electrode of the seventh transistor 37 and the clock signal is supplied from the second input terminal 22 to the gate electrode of the eighth transistor 38 because the fluctuation in the potential of the node B can be reduced and therefore noise can be reduced.

In such a manner, a signal at a VCC level is regularly supplied to the node B in a period during which the potentials of the first output terminal 26 and the second output terminal 27 are held at an L level; thus, a malfunction of the pulse output circuit can be suppressed.

In the latter half of the fourth period 64, the node B in the pulse output circuit described in this embodiment changes from a state of holding a VCC level into a floating state. There is a fear that the potential of the node B in the floating state may be decreased from the VCC level due to an off-state current or the like of the fifth transistor 35. However, the fifth transistor 35 of the pulse output circuit of this embodiment is a bottom-gate transistor having an extremely small off-state current, in which a purified oxide semiconductor layer is used for a channel formation region. Therefore, the potential of the node B in the floating state is maintained stably and a reduction from the VCC level is small. Accordingly, a malfunction of the semiconductor device is suppressed and reliability is increased.

In addition, there is no need to employ a multi-gate structure such as a double-gate structure or a triple-gate structure for suppression of an off-state current of a transistor; therefore, the transistor can be miniaturized. Further, a capacitor for maintaining the potential of the node B is unnecessary or can be miniaturized. In this manner, the total size of the semiconductor device can be reduced by using a pulse output circuit including a miniaturized element or a shift register including a miniaturized pulse output circuit.

The bottom-gate transistor in which a purified oxide semiconductor layer is used for a channel formation region has not only an off-state current that is reduced to be extremely small but also a positive threshold voltage. In the pulse output circuit of this embodiment, a bottom-gate transistor in which a purified oxide semiconductor layer is used is employed as the second transistor 32. Thus, the potential of the node A can be increased speedily by the bootstrap operation without much loss. Therefore, a malfunction of the semiconductor device is suppressed and reliability is increased.

In the pulse output circuit of this embodiment, top-gate transistors in each of which a crystalline region of a purified oxide semiconductor layer is used for a channel formation region are used as the third transistor 33, the sixth transistor 36, the tenth transistor 40, and the eleventh transistor 41. The top-gate transistor in which a crystalline region of a purified oxide semiconductor layer is used for a channel formation region has excellent f characteristics and a high field-effect mobility. Therefore, switching operation of the third transistor 33, the sixth transistor 36, the tenth transistor 40, and the eleventh transistor 41 can be made faster. In addition, the transistors can be miniaturized.

Thus, the semiconductor device can operate at high speed by using a pulse output circuit including an element which operates at high speed or a shift register including a pulse output circuit which operates at high speed.

Figure 7A:
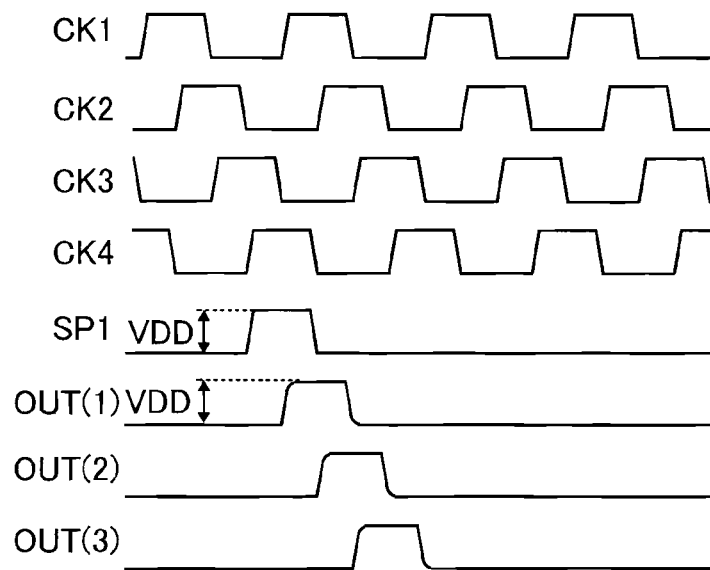
FIGS. 7A and 7B are diagrams each showing operation of a pulse output circuit.
Figure 7B:
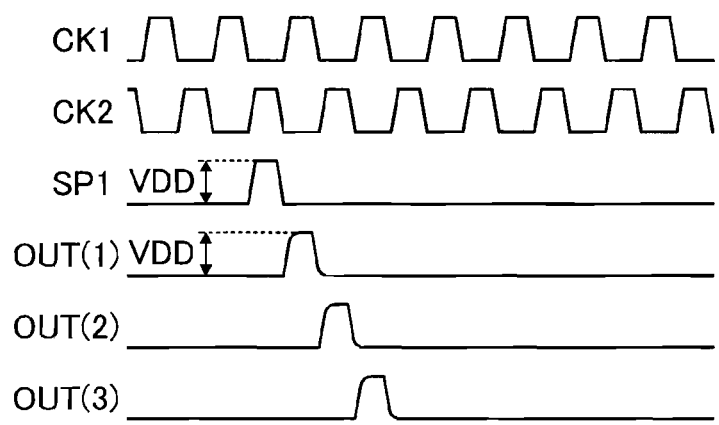

In addition, the shift register described in this embodiment uses a driving method in which a pulse that is output from the m-th pulse output circuit overlaps with half (¼ period) of a pulse that is output from the (m+1)-th pulse output circuit, as shown in FIG. 7A. This can make the time of charging a wiring with electricity twice as long as that in a driving method in which a pulse that is output from the m-th pulse output circuit does not overlap with a pulse that is output from the (m+1)-th pulse output circuit in a conventional shift register (see FIG. 7B). In this way, by using a driving method in which a pulse that is output from the m-th pulse output circuit overlaps with half (¼ period) of a pulse that is output from the (m+1)-th pulse output circuit, a pulse output circuit which can withstand large load and operate at a high frequency can be provided. In addition, an operating condition of a pulse output circuit can be improved.

Note that the shift register and the pulse output circuit described in this embodiment can be combined with any structure of a shift register and a pulse output circuit described in the other embodiments of this specification. This embodiment of the present invention can also be applied to a semiconductor device. A semiconductor device in this specification means a device that can function by utilizing semiconductor characteristics.

Embodiment 5

In this embodiment, an example of forming a driver circuit of an active matrix display device by combining a switching circuit using a transistor in which a purified oxide semiconductor layer is used for a channel formation region, with the shift register described in Embodiment 4 manufactured using two kinds of transistors over one substrate will be described. First, an overview of the active matrix display device is described with reference to block diagrams, and then a signal line driver circuit and a scan line driver circuit utilizing the shift register, which are provided for the display device, are described.

Figure 8A:
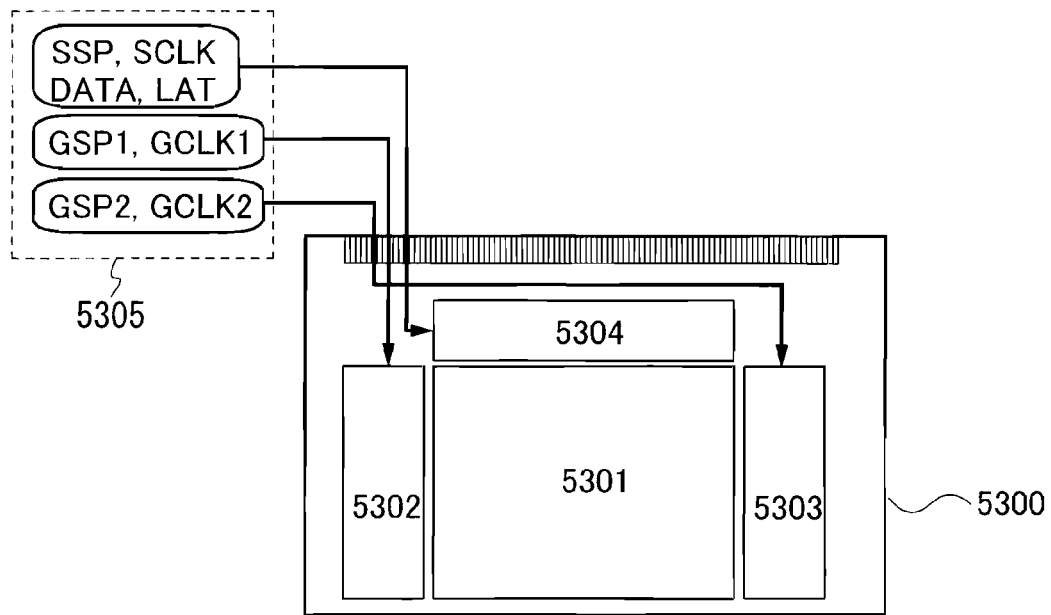
FIGS. 8A and 8B are block diagrams of semiconductor devices.

FIG. 8A illustrates an example of a block diagram of an active matrix display device. A pixel portion 5301, a first scan line driver circuit 5302, a second scan line driver circuit 5303, and a signal line driver circuit 5304 are provided over a substrate 5300 in the display device. In the pixel portion 5301, a plurality of signal lines extended from the signal line driver circuit 5304 is arranged and a plurality of scan lines extended from the first scan line driver circuit 5302 and the second scan line driver circuit 5303 is arranged. Note that in cross regions of the scan lines and the signal lines, pixels each having a display element are arranged in a matrix. The substrate 5300 of the display device is connected to a timing control circuit 5305 (also referred to as a controller or a control IC) through a connection portion such as a flexible printed circuit (FPC).

As a transistor disposed in the pixel portion 5301, a transistor of an embodiment described in Embodiment 1 or 2 can be employed. A bottom-gate transistor is preferably used in the pixel portion 5301, and the transistor 440 described in Embodiment 1 or the transistor 460 described in Embodiment 2 can be preferably used. Since a bottom-gate transistor has a small off-state current, contrast of a display image can be increased and further power consumption of the display device can be reduced.

Since the transistors described in Embodiments 1 and 2 are n-channel transistors, some of driver circuits that can be constituted by n-channel transistors among the driver circuits are formed over the substrate where the transistor of the pixel portion is formed.

In FIG. 8A, the first scan line driver circuit 5302, the second scan line driver circuit 5303, and the signal line driver circuit 5304 are formed over the substrate 5300 where the pixel portion 5301 is formed. Consequently, the number of components of a driver circuit and the like that are provided outside the display device is reduced, so that cost can be reduced. Further, if the driver circuit is provided outside the substrate 5300, wirings need to be extended and the number of connections of wirings is increased. However, by providing the driver circuit over the substrate 5300, the number of connections of the wirings can be reduced. Accordingly, an improvement in reliability or an increase in yield can be achieved.

Note that the timing control circuit 5305 supplies, for example, a first scan line driver circuit start signal (GSP1) and a scan line driver circuit clock signal (GCK1) to the first scan line driver circuit 5302. Furthermore, the timing control circuit 5305 supplies, for example, a second scan line driver circuit start signal (GSP2) (which is also referred to as a start pulse) and a scan line driver circuit clock signal (GCK2) to the second scan line driver circuit 5303. Moreover, the timing control circuit 5305 supplies a signal line driver circuit start signal (SSP), a signal line driver circuit clock signal (SCK), video signal data (DATA, also simply referred to as a video signal), and a latch signal (LAT) to the signal line driver circuit 5304. Each clock signal may be a plurality of clock signals with shifted phases or may be supplied together with a signal (CKB) obtained by inverting the clock signal. Note that it is possible to omit one of the first scan line driver circuit 5302 and the second scan line driver circuit 5303.

Figure 8B:
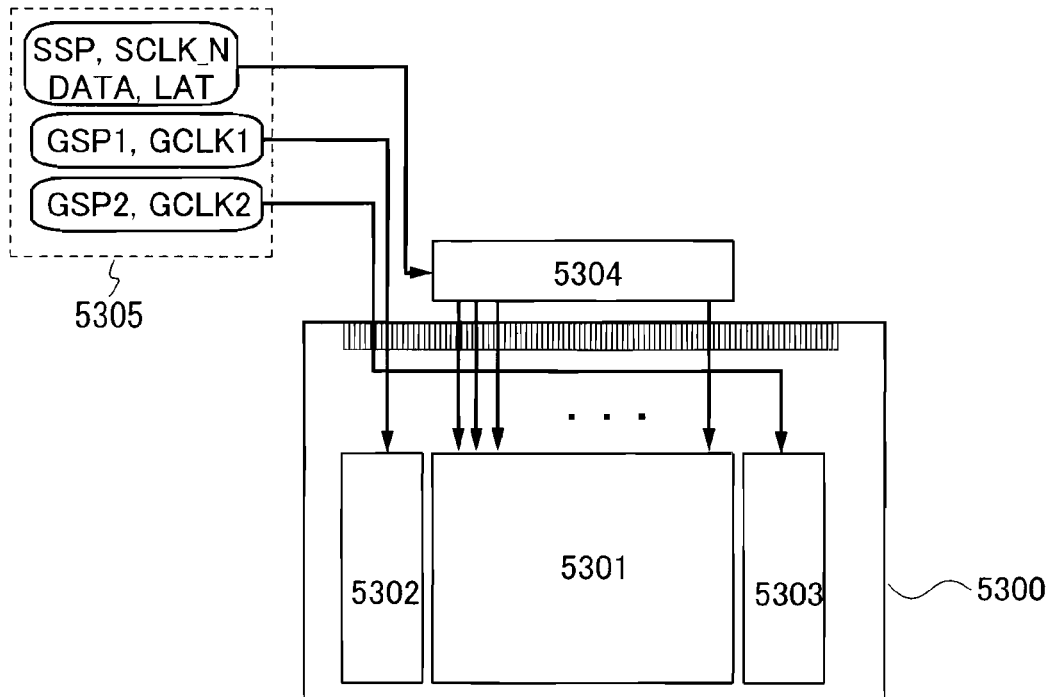

FIG. 8B illustrates a structure in which circuits with relatively low driving frequency (e.g., the first scan line driver circuit 5302 and the second scan line driver circuit 5303) are formed over the substrate 5300 where the pixel portion 5301 is formed, and the signal line driver circuit 5304 with relatively high driving frequency is formed over a substrate which is different from the substrate 5300 where the pixel portion 5301 is formed. For example, the signal line driver circuit 5304 with relatively high driving frequency can be formed over a different substrate with the use of a transistor in which a single crystal semiconductor is used. Thus, increase in size of the display device, reduction in the number of steps, reduction in cost, improvement in yield, or the like can be achieved.

In this embodiment, the signal line driver circuit 5304 with relatively high driving frequency is formed over the same substrate 5300 as the pixel portion 5301. By providing the driver circuit over the substrate 5300, the number of connections of wirings can be reduced. Accordingly, an improvement in reliability or an increase in yield can be achieved.

Next, an example of a structure and operation of a signal line driver circuit constituted by n-channel transistors will be described with reference to FIGS. 9A and 9B.

The signal line driver circuit includes a shift register 5601 and a switching circuit 5602. The switching circuit 5602 includes a plurality of switching circuits 5602_1 to 5602_N (N is a natural number). The switching circuits 5602_1 to 5602_N each include a plurality of transistors 5603_1 to 5603_k (k is a natural number). In this embodiment, a structure in which the transistors 5603_1 to 5603_k are n-channel transistors is described below.

Figure 9A:
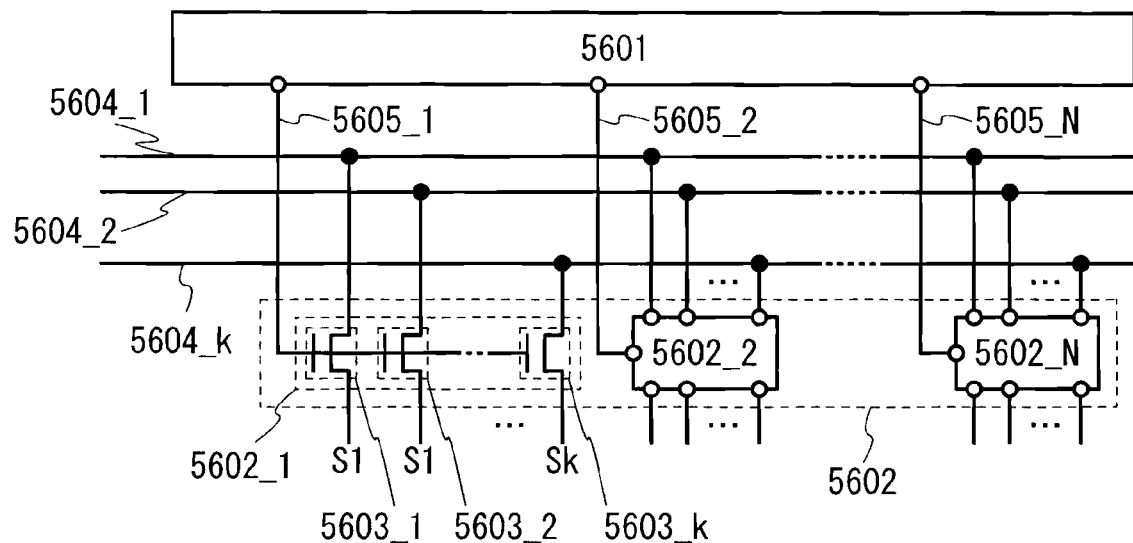
FIGS. 9A and 9B show a structure of a signal line driver circuit.
Figure 9B:
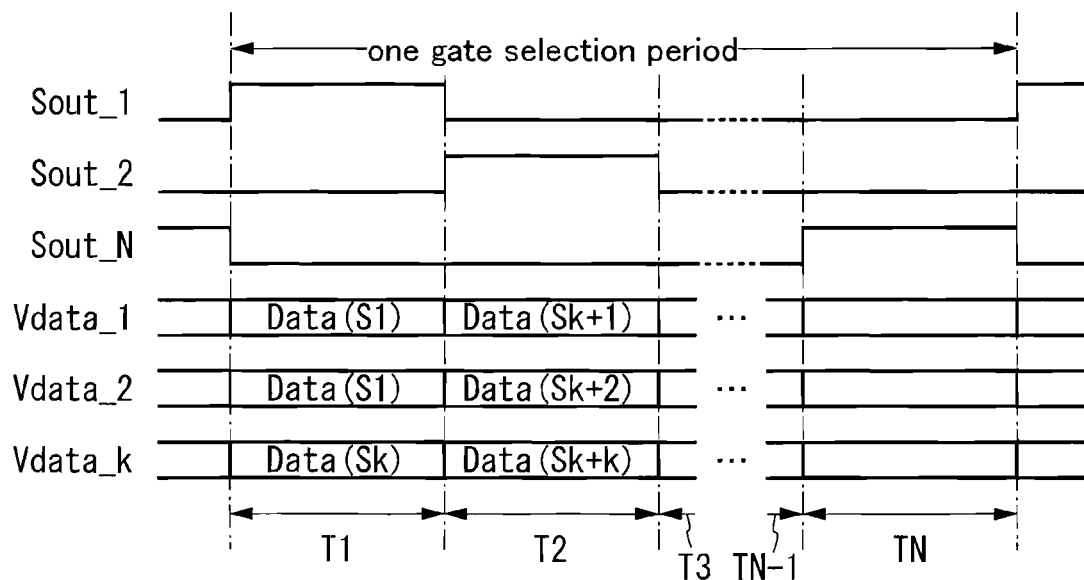

A connection relation in the signal line driver circuit is described using the switching circuit 5602_1 as an example with reference to FIG. 9A. First terminals of the transistors 5603_1 to 5603_k are connected to wirings 5604_1 to 5604_k, respectively. Second terminals of the transistors 5603_1 to 5603_k are connected to signal lines S1 to Sk, respectively. Gates of the transistors 5603_1 to 5603_k are connected to a wiring 5605_1.

The shift register 5601 has a function of sequentially selecting the switching circuits 5602_1 to 5602_N by sequentially outputting H-level signals to wirings 5605_1 to 5605_N. The shift register 5601 can be manufactured using the method described in Embodiment 4 and detailed description thereof is omitted here.

The switching circuit 5602_1 has a function of controlling electrical continuity between the wirings 5604_1 to 5604_k and the signal lines S1 to Sk (electrical continuity between the first terminals and the second terminals), that is, a function of controlling whether potentials of the wirings 5604_1 to 5604_k are supplied to the signal lines S1 to Sk. In this manner, the switching circuit 5602_1 functions as a selector. Moreover, the transistors 5603_1 to 5603_k have functions of controlling electrical continuity between the wirings 5604_1 to 5604_k and the signal lines S1 to Sk, respectively, that is, functions of supplying potentials of the wirings 5604_1 to 5604_k to the signal lines S1 to Sk, respectively. In this manner, each of the transistors 5603_1 to 5603_k functions as a switch.

In this embodiment, top-gate transistors in which a crystalline region of a purified oxide semiconductor layer is used for a channel formation region like the transistor 450 of Embodiment 1 for example are used as transistors in the switching circuit 5602. The top-gate transistor has excellent f characteristics and fast switching operation. Accordingly, the transistor can be used for high-speed writing which is required in a next-generation high-definition display device including many pixels. Note that since the transistor in which a purified oxide semiconductor layer is used for a channel formation region can be manufactured using the method described in Embodiment 1 or 2, detailed description thereof is omitted here.

The video signal data (DATA) is input to each of the wirings 5604_1 to 5604_k. The video signal data (DATA) is often an analog signal that corresponds to an image signal or image data.

Next, the operation of the signal line driver circuit in FIG. 9A is described with reference to a timing chart in FIG. 9B. FIG. 9B illustrates examples of signals Sout_1 to Sout_N and signals Vdata_1 to Vdata_k. The signals Sout_1 to Sout_N are examples of output signals from the shift register 5601. The signals Vdata_1 to Vdata_k are examples of signals input to the wirings 5604_1 to 5604_k. Note that one operation period of the signal line driver circuit corresponds to one gate selection period in a display device. For example, one gate selection period is divided into periods Ti to TN. Each of the periods Ti to TN is a period for writing the video signal data (DATA) into a pixel in a selected row.

Note that signal waveform distortion and the like in each structure illustrated in drawings and the like in this embodiment are exaggerated for simplicity in some cases. Therefore, this embodiment is not necessarily limited to the scale illustrated in the drawings and the like.

In the periods Ti to TN, the shift register 5601 sequentially outputs H-level signals to the wirings 5605_1 to 5605_N. For example, in the period Ti, the shift register 5601 outputs an H-level signal to the wiring 5605_1. Then, the transistors 5603_1 to 5603_k are turned on, so that the wirings 5604_1 to 5604_k and the signal lines S1 to Sk are brought into conduction. At this time, Data(S1) to Data(Sk) are input to the wirings 5604_1 to 5604_k, respectively. The Data(S1) to Data(Sk) are written into pixels in a first to kth columns in the selected row through the transistors 5603_1 to 5603_k, respectively. In such a manner, in the periods Ti to TN, the video signal data (DATA) are sequentially written into the pixels in the selected row by k columns.

The video signal data (DATA) are written into pixels by a plurality of columns as described above, whereby the number of video signal data (DATA) or the number of wirings can be reduced. Consequently, the number of connections with an external circuit can be reduced. Moreover, the time for writing can be extended when a video signal is written into pixels by a plurality of columns; thus, insufficient writing of a video signal can be prevented.

The shift register described in Embodiment 4 is employed as the shift register 5601 of the driver circuit in this embodiment; therefore, a malfunction is suppressed and the shift register has high reliability. By using a miniaturized shift register, the total size of the driver circuit can be reduced.

In addition, since top-gate transistors in which a crystalline region of a purified oxide semiconductor layer is used for a channel formation region are used in the switching circuit 5602 of the driver circuit in this embodiment, switching operation is fast. Accordingly, the driver circuit exemplified in this embodiment can perform high speed writing to pixels and is favorably used in a next-generation high-definition display device including many pixels.

The shift register described in Embodiment 4 can be applied to a scan line driver circuit as well. The scan line driver circuit includes a shift register. Additionally, the scan line driver circuit may include a level shifter, a buffer, or the like in some cases. In the scan line driver circuit, a clock signal (CLK) and a start pulse signal (SP) are input to the shift register, so that a selection signal is generated. The selection signal generated is buffered and amplified by the buffer, and the resulting signal is supplied to a corresponding scan line. Gate electrodes of transistors in pixels of one line are connected to the scan line. Since the transistors in the pixels of one line have to be turned on at the same time, a buffer that can supply large current is used.

The active matrix display device described in this embodiment is connected to an external device through a terminal portion. A protective circuit is provided in the driver circuit in order to prevent generation of problems such as the shift in threshold value of the transistor which is caused by abnormal input (e.g., static electricity) from the outside. Since the bottom-gate transistors described in Embodiment 1 and 2 have a high withstand voltage between the gate and the source and between the gate and the drain, they can be favorably used as transistors used in the protective circuit.

Embodiment 6

By manufacturing transistors described in Embodiment 1 or 2 and using the transistors for a pixel portion and driver circuits, a semiconductor device having a display function (also referred to as a display device) can be manufactured. Moreover, some or all of the driver circuits which include the transistors described in Embodiment 1 or 2 can be formed over a substrate where the pixel portion is formed, whereby a system-on-panel can be obtained.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, the display device may include a display medium whose contrast is changed by an electric effect, such as electronic ink.

In addition, the display device includes a panel in which the display element is sealed, and a module in which an IC and the like including a controller are mounted on the panel. Furthermore, an element substrate, which is one embodiment before the display element is completed in a manufacturing process of the display device, is provided with a means for supplying current to the display element in each of a plurality of pixels. Specifically, the element substrate may be in a state in which only a pixel electrode of the display element is formed, a state in which a conductive film to be a pixel electrode is formed but is not etched yet to form the pixel electrode, or any of the other states.

Note that a display device in this specification refers to an image display device, a display device, or a light source (including a lighting device). Further, the display device also includes any of the following modules in its category: a module to which a connector such as a flexible printed circuit (FPC), a tape automated bonding (TAB) tape, or a tape carrier package (TCP) is attached; a module having a TAB tape or a TCP at the end of which a printed wiring board is provided; and a module having an integrated circuit (IC) that is directly mounted on a display element by a chip on glass (COG) method.

In this embodiment, the appearance and a cross section of a liquid crystal display panel, which is one embodiment of a semiconductor device, will be described with reference to FIGS. 11A1, 11A2, and 11B. FIGS. 11A1 and 11A2 are plan views of panels, in which highly reliable transistors 4010 and 4011 each including an In—Ga—Zn—O-based film as an oxide semiconductor layer described in Embodiment 1 or 2 and a liquid crystal element 4013 are sealed between a first substrate 4001 and a second substrate 4006 with a sealant 4005. FIG. 11B is a cross-sectional view taken along M-N in FIGS. 11A1 and 11A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that there is no particular limitation on the connection method of the driver circuit which is separately formed, and a COG method, a wire bonding method, a TAB method, or the like can be used. FIG. 11A1 illustrates an example in which the signal line driver circuit 4003 is mounted by a COG method. FIG. 11A2 illustrates an example in which the signal line driver circuit 4003 is mounted by a TAB method.

The pixel portion 4002 and the scan line driver circuit 4004 provided over the first substrate 4001 include a plurality of transistors. FIG. 11B illustrates the transistor 4010 included in the pixel portion 4002 and the transistor 4011 included in the scan line driver circuit 4004, as an example. Insulating layers 4020, 4041 are provided over the transistor 4010, and an insulating layer 4021 is provided over the transistor 4011. The insulating layer 4020 functions as a gate insulating layer of the transistor 4011.

A conductive layer 4042 is provided over part of the insulating layer 4020, which overlaps with the channel formation region of the oxide semiconductor layer in the transistor 4010 in the pixel portion. The conductive layer 4042 is provided in the position overlapping with the channel formation region of the oxide semiconductor layer, whereby the amount of change in threshold voltage of the transistor 4010 before and after the BT test can be reduced. The potential of the conductive layer 4042 may be the same or different from that of a gate electrode layer of the transistor 4010. The conductive layer 4042 can also function as a second gate electrode layer. Further, the potential of the conductive layer 4042 may be GND or 0 V, or the conductive layer 4042 may be in a floating state. Note that the conductive layer 4042 can be formed using the same material and the same step as those of a gate electrode layer of the transistor 4011.

As the transistors 4010 and 4011, highly reliable transistors described in Embodiment 1 or 2, each of which includes an In—Ga—Zn—O-based film as an oxide semiconductor layer, can be employed. In this embodiment, the transistors 4010 and 4011 are n-channel transistors.

A pixel electrode layer 4030 included in the liquid crystal element 4013 is electrically connected to the transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 functioning as alignment films, respectively, and the liquid crystal layer 4008 is provided between the electrode layers with the insulating layers 4032 and 4033 arranged therebetween. Although not illustrated, a color filter may be provided either on the first substrate 4001 side or on the second substrate 4006 side.

Note that the first substrate 4001 and the second substrate 4006 can be formed of glass, metal (typically, stainless steel), ceramics, or plastics. As plastics, a fiberglass-reinforced plastics (FRP) plate, a polyvinyl fluoride (PVF) film, a polyester film, or an acrylic resin film can be used. Alternatively, a sheet having a structure in which an aluminum foil is arranged between PVF films or polyester films can be used.

A spacer 4035 is a columnar spacer obtained by selective etching of an insulating film and provided in order to control the distance (a cell gap) between the pixel electrode layer 4030 and the counter electrode layer 4031. Alternatively, a spherical spacer may be used. The counter electrode layer 4031 is electrically connected to a common potential line formed over the substrate where the transistor 4010 is formed. The counter electrode layer 4031 and the common potential line can be electrically connected to each other through conductive particles provided between the pair of substrates using the common connection portion. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase is only generated within a narrow range of temperature, a liquid crystal composition containing a chiral agent at 5 wt % or more is used for the liquid crystal layer 4008 in order to improve the temperature range. The liquid crystal composition including liquid crystal exhibiting a blue phase and a chiral agent has a short response time of 10 μsec to 100 μsec inclusive and is optically isotropic; therefore, alignment treatment is not necessary and viewing angle dependence is small.

Note that although a transmissive liquid crystal display device is described as an example in this embodiment, the present invention can also be applied to either a reflective liquid crystal display device or a transflective liquid crystal display device.

Although a polarizing plate is provided on the outer surface of the substrate (on the viewer side) and a coloring layer and an electrode layer used for a display element are sequentially provided on the inner surface of the substrate in the liquid crystal display device of this embodiment, the polarizing plate may be provided on the inner surface of the substrate. The stacked structure of the polarizing plate and the coloring layer is not limited to that in this embodiment and may be set as appropriate depending on materials of the polarizing plate and the coloring layer or conditions of the manufacturing process. Further, a light-blocking film functioning as a black matrix may be provided.

In this embodiment, in order to reduce the surface roughness due to the transistor and to improve the reliability of the transistor, the transistors obtained in Embodiment 1 or 2 are covered with insulating layers (the insulating layers 4020 and 4021) functioning as a protective film or a planarization insulating film. Note that the protective film is provided to prevent entry of contaminant impurities such as an organic substance, metal, and moisture existing in the air and is preferably a dense film. The protective film may be formed by a sputtering method to have a single-layer structure or a stacked structure including any of a silicon oxide film, a silicon nitride film, a silicon oxynitride film, a silicon nitride oxide film, an aluminum oxide film, an aluminum nitride film, an aluminum oxynitride film, and an aluminum nitride oxide film. Although an example in which the protective film is formed by a sputtering method is described in this embodiment, a variety of methods may be employed without limitation to the sputtering method.

In this embodiment, the insulating layer 4020 having a stacked structure is formed as a protective film. Here, a silicon oxide film is formed using a sputtering method as a first layer of the insulating layer 4020. The use of the silicon oxide film as the protective film has an effect of preventing a hillock of an aluminum film which is used as the source and drain electrode layers.

As a second layer of the protective film, an insulating layer is formed. Here, a silicon nitride film is formed using a sputtering method, as the second layer of the insulating layer 4020. The use of the silicon nitride film as the protective film can prevent mobile ions of sodium or the like from entering a semiconductor region, so that variation in electric characteristics of the transistor can be suppressed.

After the protective film is formed, annealing (at higher than or equal to 300° C. and lower than or equal to 400° C.) of the oxide semiconductor layers may be performed.

The insulating layer 4021 is formed as a planarization insulating film. The insulating layer 4021 can be formed using a heat-resistant organic material such as an acrylic resin, polyimide, a benzocyclobutene-based resin, polyamide, or an epoxy resin. Other than such organic materials, it is also possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating films formed using any of these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

The formation method of the insulating layer 4021 is not limited to a particular method, and the following method can be used depending on the material: a sputtering method, an SOG method, a spin coating method, a dipping method, a spray coating method, a droplet discharge method (such as an inkjet method, screen printing, offset printing, or the like), or the like. Further, the planarization insulating layer 4021 can be formed with a doctor knife, a roll coater, a curtain coater, a knife coater, or the like. When the baking step of the insulating layer 4021 and the annealing of the semiconductor layer are combined, a semiconductor device can be manufactured efficiently. In the case of forming the insulating layer 4021 with the use of a liquid material, annealing (at higher than or equal to 300° C. and lower than or equal to 400° C.) of the oxide semiconductor layers may be performed at the same time as a baking step. When the baking step of the insulating layer 4021 and the annealing of the oxide semiconductor layers are combined, a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter, referred to as ITO), indium zinc oxide, or indium tin oxide to which silicon oxide is added.

Alternatively, a conductive composition including a conductive high molecule (also referred to as a conductive polymer) can be used for the pixel electrode layer 4030 and the counter electrode layer 4031. The pixel electrode formed using the conductive composition preferably has a sheet resistance of 10000 ohms per square or less and a light transmittance of 70% or more at a wavelength of 550 nm. Further, the resistivity of the conductive high molecule included in the conductive composition is preferably 0.1 Ω·cm or less.

As the conductive high molecule, a so-called it-electron conjugated conductive polymer can be used. Examples are polyaniline and a derivative thereof, polypyrrole and a derivative thereof, polythiophene and a derivative thereof, and a copolymer of two or more of these materials.

Further, a variety of signals and potentials are supplied to the signal line driver circuit 4003 which is separately formed and the scan line driver circuit 4004 or the pixel portion 4002 from an FPC 4018.

In this embodiment, a connection terminal electrode 4015 is formed using the same conductive film as the pixel electrode layer 4030 included in the liquid crystal element 4013. A terminal electrode 4016 is formed using the same conductive film as source and drain electrode layers of the transistors 4010 and 4011.

The connection terminal electrode 4015 is electrically connected to a terminal included in the FPC 4018 via an anisotropic conductive film 4019.

Note that FIGS. 11A1, 11A2, and 11B illustrate the example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 12:
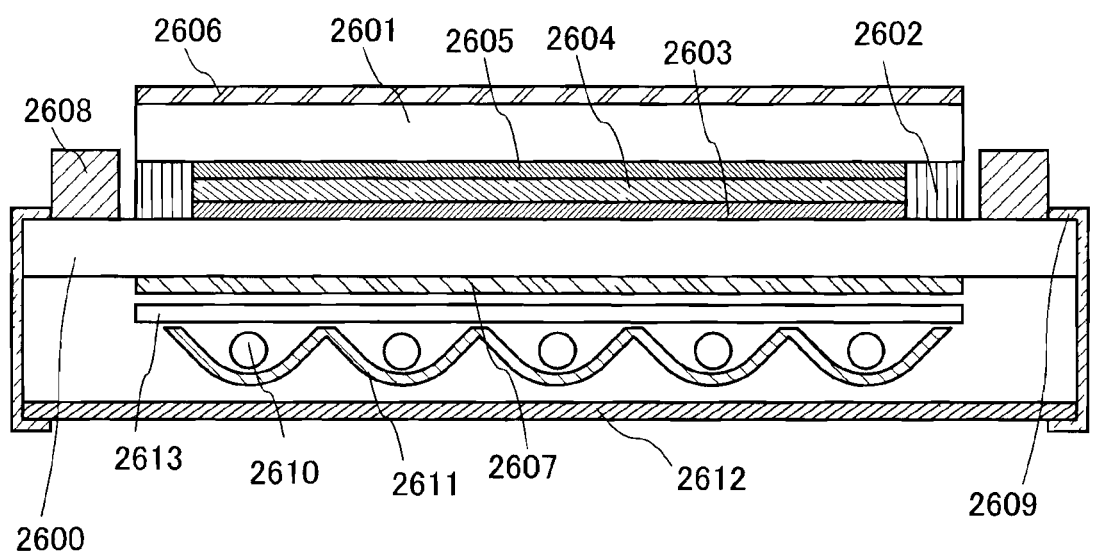
FIG. 12 is a cross-sectional view illustrating an embodiment of the present invention.

FIG. 12 illustrates an example of a liquid crystal display module which is formed as a semiconductor device using a transistor substrate 2600 to which the transistors described in Embodiment 1 or 2 are applied.

FIG. 12 illustrates an example of the liquid crystal display module, in which the transistor substrate 2600 and a counter substrate 2601 are bonded to each other with a sealant 2602, and a pixel portion 2603 including a transistor and the like, a display element 2604 including a liquid crystal layer, a coloring layer 2605, and the like are provided between the substrates to form a display region. The coloring layer 2605 is necessary to perform color display. In the RGB system, coloring layers corresponding to colors of red, green, and blue are provided for respective pixels. Polarizing plates 2606 and 2607 and a diffusion plate 2613 are provided outside the transistor substrate 2600 and the counter substrate 2601. A light source includes a cold cathode tube 2610 and a reflective plate 2611. A circuit board 2612 is connected to a wiring circuit portion 2608 of the transistor substrate 2600 by a flexible wiring board 2609 and includes an external circuit such as a control circuit or a power source circuit. The polarizing plate and the liquid crystal layer may be stacked with a retardation plate interposed therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be employed.

Through the above process, a highly reliable liquid crystal display panel as a semiconductor device can be manufactured.

Note that the structure described in this embodiment can be combined with any of the structures described in the other embodiments as appropriate.

Embodiment 7

In this embodiment, an example of electronic paper is described as a semiconductor device to which the transistors described in Embodiment 1 or 2 are applied.

Figure 13:
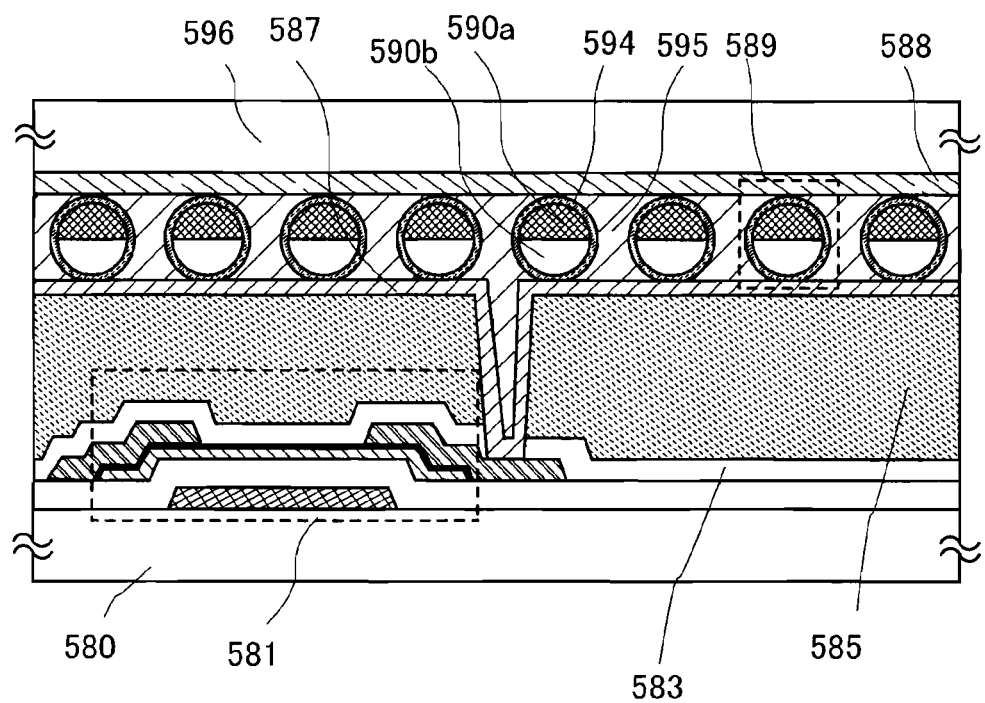
FIG. 13 is a cross-sectional view illustrating an embodiment of the present invention.

FIG. 13 illustrates active matrix electronic paper as an example of a semiconductor device. The transistor described in Embodiment 1 or 2 can be used as a transistor 581 used for the semiconductor device. The transistor described in Embodiments 1 and 2 can be used as a transistor 581 used for the semiconductor device.

The electronic paper in FIG. 13 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The transistor 581 sealed between a substrate 580 and a substrate 596 is a transistor with a bottom-gate structure, and a source electrode layer and a drain electrode layer thereof is in contact with a first electrode layer 587 at an opening formed in insulating layers 583 and 585, whereby the transistor 581 is electrically connected to the first electrode layer 587. Between the first electrode layer 587 and a second electrode layer 588, spherical particles 589 each having a black region 590a, a white region 590b, and a cavity 594 around the regions, which is filled with liquid, are provided. A space around the spherical particles 589 is filled with a filler 595 such as a resin (see FIG. 13). In this embodiment, the first electrode layer 587 and the second electrode layer 588 correspond to a pixel electrode and a common electrode, respectively. The second electrode layer 588 is electrically connected to a common potential line provided over the same substrate as the transistor 581. With the use of any one of the common connection portions described in Embodiment 1 or 2, the second electrode layer 588 and the common potential line can be electrically connected to each other through conductive particles provided between the pair of substrates.

Further, instead of the twisting ball, an electrophoretic element may be used. A microcapsule having a diameter approximately more than or equal to 10 μm and less than or equal to 200 μm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and black microparticles move to opposite sides from each other, so that white or black can be displayed. A display element using this principle is an electrophoretic display element and is generally called electronic paper. The electrophoretic display element has a higher reflectivity than a liquid crystal display element and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to as a display device simply or a semiconductor device provided with a display device) is distanced from a radio wave source.

Through the above process, highly reliable electronic paper as a semiconductor device can be manufactured.

Note that the structure described in this embodiment can be combined with any of the structures described in the other embodiments as appropriate.

Embodiment 8

In this embodiment, an example of a light-emitting display device will be described as a semiconductor device to which the transistors described in Embodiment 1 or 2 are applied. A light-emitting element utilizing electroluminescence will be described here as a display element included in the display device. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. Then, the carriers (electrons and holes) recombine, so that the light-emitting organic compound is excited. Then, light emission is caused when the light-emitting organic compound returns to a ground state from the excited state. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission which utilizes a donor level and an acceptor level. A thin-film inorganic EL element has a structure where a light-emitting layer is arranged between dielectric layers, which are further arranged between electrodes, and its light emission mechanism is localized type light emission that utilizes inner-shell electron transition of metal ions. Note that description is made in this embodiment using an organic EL element as a light-emitting element.

Figure 14:
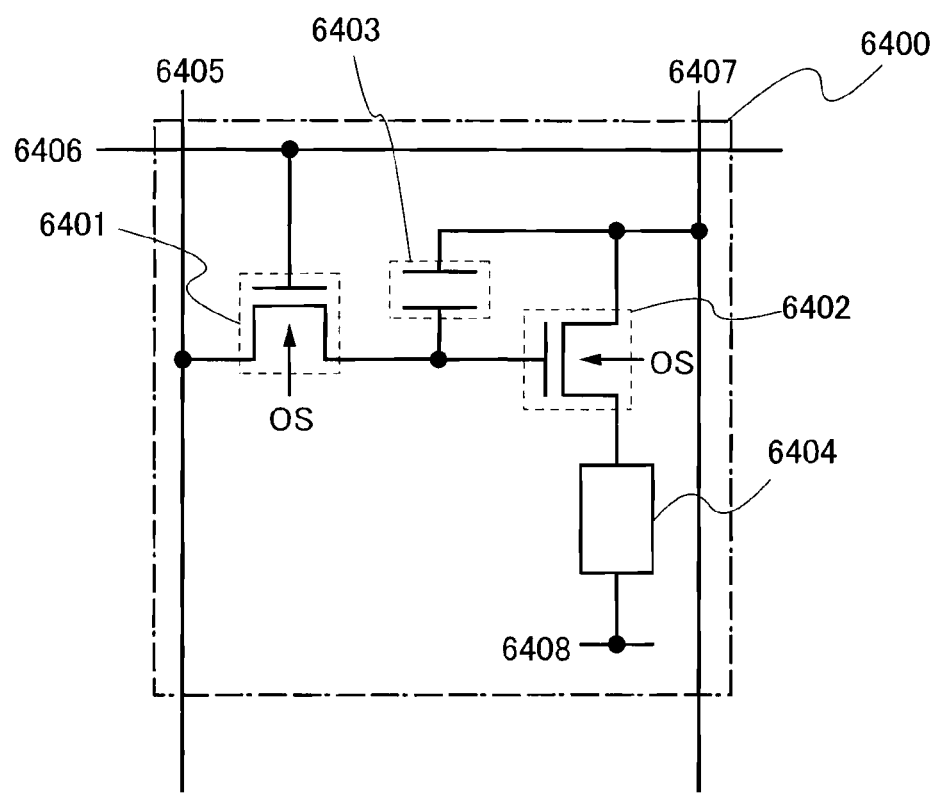
FIG. 14 shows an equivalent circuit of a pixel in a semiconductor device.

FIG. 14 illustrates an example of a pixel configuration to which digital time grayscale driving can be applied as an example of the semiconductor device to which the present invention is applied.

The configuration and operation of a pixel to which digital time grayscale driving can be applied will be described. An example is described here in which one pixel includes two n-channel transistors described in Embodiment 1 or 2, in each of which an oxide semiconductor layer (an In—Ga—Zn—O-based film) is used for a channel formation region.

A pixel 6400 includes a switching transistor 6401, a driving transistor 6402, a light-emitting element 6404, and a capacitor 6403. In the switching transistor 6401, a gate thereof is connected to a scan line 6406, a first electrode thereof (one of source and drain electrodes) is connected to a signal line 6405, and a second electrode thereof (the other of the source and drain electrodes) is connected to a gate of the driving transistor 6402. In the driving transistor 6402, the gate thereof is connected to a power supply line 6407 through the capacitor 6403, a first electrode thereof is connected to the power supply line 6407, and a second electrode thereof is connected to a first electrode (pixel electrode) of the light-emitting element 6404. A second electrode of the light-emitting element 6404 corresponds to a common electrode 6408. The common electrode 6408 is electrically connected to a common potential line provided over the same substrate, and the connection portion may be used as a common connection portion.

Note that the second electrode (common electrode 6408) of the light-emitting element 6404 is set to a low power supply potential. Note that the low power supply potential is a potential satisfying the low power supply potential <a high power supply potential with reference to the high power supply potential that is set on the power supply line 6407. As the low power supply potential, GND, 0 V, or the like may be employed, for example. The difference between the high power supply potential and the low power supply potential is applied to the light-emitting element 6404 so that current flows through the light-emitting element 6404, whereby the light-emitting element 6404 emits light. Thus, each potential is set so that the difference between the high power supply potential and the low power supply potential is greater than or equal to a forward threshold voltage of the light-emitting element 6404.

When the gate capacitance of the driving transistor 6402 is used as a substitute for the capacitor 6403, the capacitor 6403 can be omitted. The gate capacitance of the driving transistor 6402 may be formed between the channel region and the gate electrode.

In the case of using a voltage-input voltage driving method, a video signal is input to the gate of the driving transistor 6402 so that the driving transistor 6402 is in either of two states of being sufficiently turned on and turned off. That is, the driving transistor 6402 operates in a linear region, and thus a voltage higher than the voltage of the power supply line 6407 is applied to the gate of the driving transistor 6402. Note that a voltage higher than or equal to the following is applied to the signal line 6405: power supply line voltage +$V_{th}$ of the driving transistor 6402.

In the case of performing analog grayscale driving instead of digital time grayscale driving, the same pixel configuration as FIG. 14 can be employed by changing signal input.

In the case of performing analog grayscale driving, voltage higher than or equal to the following is applied to the gate of the driving transistor 6402: forward voltage of the light-emitting element 6404+$V_{th}$ of the driving transistor 6402. The forward voltage of the light-emitting element 6404 refers to voltage to obtain a desired luminance, and includes at least forward threshold voltage. By input of a video signal which enables the driving transistor 6402 to operate in a saturation region, it is possible to feed current to the light-emitting element 6404. In order that the driving transistor 6402 can operate in the saturation region, the potential of the power supply line 6407 is set higher than a gate potential of the driving transistor 6402. When an analog video signal is used, it is possible to feed current to the light-emitting element 6404 in accordance with the video signal and perform analog grayscale driving.

Note that the pixel configuration is not limited to that illustrated in FIG. 14. For example, the pixel illustrated in FIG. 14 may further include a switch, a resistor, a capacitor, a transistor, a logic circuit, or the like.

Next, structures of the light-emitting element will be described with reference to FIGS. 15A to 15C. A cross-sectional structure of a pixel will be described by taking an n-channel driving transistor as an example. A transistor 7011, a transistor 7021, and a transistor 7001 which are driving transistors used for semiconductor devices illustrated in FIGS. 15A, 15B, and 15C, respectively, can be manufactured in a manner similar to that of the transistor described in Embodiment 1 or 2, and are highly reliable transistors each including an In—Ga—Zn—O-based film as an oxide semiconductor layer.

In order to extract light emitted from the light-emitting element, at least one of the anode and the cathode is required to transmit light. A transistor and a light-emitting element are formed over a substrate. A light-emitting element can have a top emission structure in which light is extracted through the surface opposite to the substrate, a bottom emission structure in which light is extracted through the surface on the substrate side, or a dual emission structure in which light is extracted through the surface opposite to the substrate and the surface on the substrate side. The pixel configuration of the present invention can be applied to a light-emitting element having any of these emission structures.

A light-emitting element having a bottom emission structure will be described with reference to FIG. 15A.

FIG. 15A is a cross-sectional view of a pixel in the case where the driving transistor 7011 is of an n-type and light is emitted from a light-emitting element 7012 to a first electrode 7013 side. In FIG. 15A, the first electrode 7013 of the light-emitting element 7012 is formed over a light-transmitting conductive film 7017 which is electrically connected to a drain electrode layer of the driving transistor 7011, and an EL layer 7014 and a second electrode 7015 are stacked in that order over the first electrode 7013.

As the light-transmitting conductive film 7017, a light-transmitting conductive film such as a film of indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added can be used.

The first electrode 7013 of the light-emitting element can be formed using various materials. For example, in the case where the first electrode 7013 is used as a cathode, a material having a low work function, for example, an alkali metal such as Li or Cs, an alkaline-earth metal such as Mg, Ca, or Sr, an alloy containing any of these (Mg: Ag, Al: Li, or the like), a rare-earth metal such as Yb or Er, or the like, is preferably used. In FIG. 15A, the thickness of the first electrode 7013 is such that the first electrode transmits light (preferably, approximately 5 nm to 30 nm). For example, an aluminum film having a thickness of 20 nm is used for the first electrode 7013.

Note that the light-transmitting conductive film and the aluminum film may be stacked and then selectively etched, so that the light-transmitting conductive film 7017 and the first electrode 7013 may be formed. In this case, the etching can be performed using the same mask, which is preferable.

A partition 7019 is formed on the light-transmitting conductive film 7017 in a contact hole which is formed in a protective insulating layer 7035 and an insulating layer 7032 and reaches the drain electrode layer. Note that the peripheral portion of the first electrode 7013 may be covered with a partition. The partition 7019 is formed using an organic resin film such as polyimide, an acrylic resin, polyamide, or an epoxy resin, an inorganic insulating film, or organic polysiloxane. It is particularly preferable that the partition 7019 be formed using a photosensitive resin material to have an opening over the first electrode 7013 so that a sidewall of the opening is formed as an inclined surface with continuous curvature. In the case where a photosensitive resin material is used for the partition 7019, a step of forming a resist mask can be omitted.

The EL layer 7014 formed over the first electrode 7013 and the partition 7019 may be formed using a single layer or a plurality of layers stacked as long as it includes at least a light-emitting layer. When the EL layer 7014 is formed using a plurality of layers, the EL layer 7014 is formed by stacking an electron-injection layer, an electron-transport layer, a light-emitting layer, a hole-transport layer, and a hole-injection layer in that order over the first electrode 7013 functioning as a cathode. Note that not all of these layers need to be provided.

The stacking order is not limited to the above stacking order. The first electrode 7013 may function as an anode, and a hole-injection layer, a hole-transport layer, a light-emitting layer, an electron-transport layer, and an electron-injection layer may be stacked in that order over the first electrode 7013. However, when power consumption is compared, it is preferable that the first electrode 7013 function as a cathode and an electron-injection layer, an electron-transport layer, a light-emitting layer, a hole-transport layer, and a hole-injection layer be stacked in that order over the first electrode 7013, because an increase in voltage in the driver circuit portion can be suppressed and power consumption can be reduced.

As the second electrode 7015 formed over the EL layer 7014, various materials can be employed. For example, in the case where the second electrode 7015 is used as an anode, a material having a high work function such as ZrN, Ti, W, Ni, Pt, or Cr; or a light-transmitting conductive material such as ITO, IZO, or ZnO is preferably used. A light-blocking film 7016 is formed over the second electrode 7015 using, for example, a metal which blocks light, a metal which reflects light, or the like. In this embodiment, an ITO film is used for the second electrode 7015, and a Ti film is used for the light-blocking film 7016.

The light-emitting element 7012 corresponds to a region where the EL layer 7014 including a light-transmitting layer is provided between the first electrode 7013 and the second electrode 7015. In the case of the element structure illustrated in FIG. 15A, light is emitted from the light-emitting element 7012 to the first electrode 7013 side as indicated by an arrow.

Note that in FIG. 15A, light emitted from the light-emitting element 7012 passes through a color filter layer 7033, the insulating layer 7032, an oxide insulating layer 7031, a gate insulating layer 7030, and a substrate 7010 and then is emitted.

The color filter layer 7033 is formed by a droplet discharge method such as an ink-jet method, a printing method, an etching method with the use of a photolithography technique, or the like.

The color filter layer 7033 is covered with an overcoat layer 7034, and also covered with the protective insulating layer 7035. Note that the overcoat layer 7034 having a thin thickness is illustrated in FIG. 15A; however, the overcoat layer 7034 is formed using a resin material such as an acrylic resin and has a function of planarizing a surface having unevenness due to the color filter layer 7033.

Next, a light-emitting element having a dual emission structure will be described with reference to FIG. 15B.

In FIG. 15B, a first electrode 7023 of a light-emitting element 7022 is formed over a light-transmitting conductive film 7027 which is electrically connected to a drain electrode layer of the driving transistor 7021, and an EL layer 7024 and a second electrode 7025 are stacked in that order over the first electrode 7023.

For the light-transmitting conductive film 7027, a light-transmitting conductive film of indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like can be used.

The first electrode 7023 can be formed using various materials. For example, in the case where the first electrode 7023 is used as a cathode, a material having a low work function, specifically, an alkali metal such as Li or Cs; an alkaline-earth metal such as Mg, Ca, or Sr; an alloy containing any of these (Mg: Ag, Al: Li, or the like); a rare-earth metal such as Yb or Er; or the like is preferable. In this embodiment, the first electrode 7023 is used as a cathode and the first electrode 7023 is formed to a thickness such that the first electrode 7023 can transmit light (preferably, approximately 5 nm to 30 nm). For example, a 20-nm-thick aluminum film is used as the cathode.

Note that the light-transmitting conductive film and the aluminum film may be stacked and then selectively etched, so that the light-transmitting conductive film 7027 and the first electrode 7023 may be formed. In that case, etching can be performed with the use of the same mask, which is preferable.

A partition 7029 is formed on the light-transmitting conductive film 7027 in a contact hole which is formed in a protective insulating layer 7045 and an insulating layer 7042 and reaches the drain electrode layer. Note that the peripheral portion of the first electrode 7023 may be covered with a partition. The partition 7029 is formed using an organic resin film such as polyimide, an acrylic resin, polyamide, or an epoxy resin; an inorganic insulating film; or organic polysiloxane. It is particularly preferable that the partition 7029 be formed using a photosensitive resin material to have an opening over the first electrode 7023 so that a sidewall of the opening is formed as an inclined surface with continuous curvature. In the case where a photosensitive resin material is used for the partition 7029, a step of forming a resist mask can be omitted.

The EL layer 7024 formed over the first electrode 7023 and the partition 7029 may be formed using either a single layer or a plurality of layers stacked as long as it includes at least a light-emitting layer. When the EL layer 7024 is formed using a plurality of layers, the EL layer 7024 is formed by stacking an electron-injection layer, an electron-transport layer, a light-emitting layer, a hole-transport layer, and a hole-injection layer in that order over the first electrode 7023 functioning as a cathode. Note that not all of these layers need to be provided.

The stacking order is not limited to the above. The first electrode 7023 may be used as an anode, and a hole-injection layer, a hole-transport layer, a light-emitting layer, an electron-transport layer, and an electron-injection layer may be stacked in that order over the anode. However, for lower power consumption, it is preferable that the first electrode 7023 be used as a cathode and an electron-injection layer, an electron-transport layer, a light-emitting layer, a hole-transport layer, and a hole-injection layer be stacked in this order over the cathode.

In addition, the second electrode 7025 formed over the EL layer 7024 can be formed using a variety of materials. For example, when the second electrode 7025 is used as an anode, a material with a high work function or a transparent conductive material such as ITO, IZO, or ZnO is preferable. In this embodiment, the second electrode 7025 is formed using an ITO film including silicon oxide and is used as an anode.

The light-emitting element 7022 corresponds to a region where the EL layer 7024 including a light-emitting layer is provided between the first electrode 7023 and the second electrode 7025. In the case of the element structure illustrated in FIG. 15B, light emitted from the light-emitting element 7022 is emitted to both the second electrode 7025 side and the first electrode 7023 side as indicated by arrows.

Note that in FIG. 15B, light emitted from the light-emitting element 7022 to the first electrode 7023 side passes through a color filter layer 7043, the insulating layer 7042, an oxide insulating layer 7041, a gate insulating layer 7040, and a substrate 7020 and then is emitted.

The color filter layer 7043 is formed by a droplet discharge method such as an ink-jet method, a printing method, an etching method with the use of a photolithography technique, or the like.

The color filter layer 7043 is covered with an overcoat layer 7044, and also covered with the protective insulating layer 7045.

Note that when a light-emitting element having a dual emission structure is used and full color display is performed on both display surfaces, light from the second electrode 7025 side does not pass through the color filter layer 7043; therefore, a sealing substrate provided with another color filter layer is preferably provided over the second electrode 7025.

Next, a light-emitting element having a top emission structure is described with reference to FIG. 15C.

FIG. 15C is a cross-sectional view of a pixel in the case where the transistor 7001, which is a driving transistor, is of n-type and light is emitted from a light-emitting element 7002 to a second electrode 7005 side. In FIG. 15C, a first electrode 7003 of the light-emitting element 7002 is formed to be electrically connected to the drain electrode layer of the driving transistor 7001, and an EL layer 7004 and the second electrode 7005 are stacked in that order over the first electrode 7003.

The first electrode 7003 can be formed using a variety of materials. For example, in the case where the first electrode 7003 is used as a cathode, a material having a low work function, for example, an alkali metal such as Li or Cs, an alkaline-earth metal such as Mg, Ca, or Sr, an alloy containing any of these (Mg: Ag, Al: Li, or the like), a rare-earth metal such as Yb or Er, or the like, is preferably used.

A partition 7009 is formed on the first electrode 7003 in a contact hole which is formed in a protective insulating layer 7052 and an insulating layer 7055 and reaches the drain electrode layer. Note that the peripheral portion of the first electrode 7013 may be covered with a partition. The partition 7009 is formed using an organic resin film such as polyimide, an acrylic resin, polyamide, or an epoxy resin; an inorganic insulating film; or organic polysiloxane. It is particularly preferable that the partition 7009 be formed using a photosensitive resin material to have an opening over the first electrode 7003 so that a sidewall of the opening is inclined with continuous curvature. When the partition 7009 is formed using a photosensitive resin material, a step of forming a resist mask can be omitted.

The EL layer 7004 formed over the first electrode 7003 and the partition 7009 may be formed using either a single layer or a plurality of layers stacked as long as it includes at least a light-emitting layer. When the EL layer 7004 is formed using a plurality of layers, the EL layer 7004 is formed by stacking an electron-injection layer, an electron-transport layer, a light-emitting layer, a hole-transport layer, and a hole-injection layer in that order over the first electrode 7003 used as a cathode. Note that not all of these layers need to be provided.

The stacking order is not limited to the above stacking order, and a hole-injection layer, a hole-transport layer, a light-emitting layer, an electron-transport layer, and an electron-injection layer may be stacked in that order over the first electrode 7003 used as an anode.

In FIG. 15C, a hole-injection layer, a hole-transport layer, a light-emitting layer, an electron-transport layer, and an electron-injection layer are stacked in that order over a stacked film in which a Ti film, an aluminum film, and a Ti film are stacked in that order, and thereover, a stacked layer of a Mg:Ag alloy thin film and ITO is formed.

However, in the case where the transistor 7001 is of an n-type, it is preferable that an electron-injection layer, an electron-transport layer, a light-emitting layer, a hole-transport layer, and a hole-injection layer be stacked in that order over the first electrode 7003, because an increase in voltage in the driver circuit can be suppressed and power consumption can be reduced.

The second electrode 7005 is formed using a light-transmitting conductive material through which light can pass, and for example, a light-transmitting conductive film of indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like can be used.

The light-emitting element 7002 corresponds to a region where the EL layer 7004 is provided between the first electrode 7003 and the second electrode 7005. In the case of the pixel illustrated in FIG. 15C, light is emitted from the light-emitting element 7002 to the second electrode 7005 side as indicated by an arrow.

A planarizing insulating layer 7053 can be formed using a resin material such as polyimide, an acrylic resin, benzo-cyclobutene, polyamide, or an epoxy resin. In addition to such resin materials, it is also possible to use a low-dielectric constant material (low-k material), a siloxane-based resin, phosphosilicate glass (PSG), borophosphosilicate glass (BPSG), or the like. Note that the planarization insulating layer 7053 may be formed by stacking a plurality of insulating films formed of these materials. There is no particular limitation on the method for forming the planarization insulating layer 7053, and the planarization insulating layer 7053 can be formed, depending on the material, using a method such as a sputtering method, an SOG method, spin coating, dip coating, spray coating, or a droplet discharge method (such as an inkjet method, screen printing, offset printing, or the like), or a tool (equipment) such as a doctor knife, a roll coater, a curtain coater, or a knife coater.

In the structure of FIG. 15C, when full color display is performed, for example, the light-emitting element 7002 is used as a green light-emitting element, one of adjacent light-emitting elements is used as a red light-emitting element, and the other is used as a blue light-emitting element. Alternatively, a light-emitting display device capable of full color display may be manufactured using four kinds of light-emitting elements, which include white light-emitting elements in addition to three kinds of light-emitting elements.

In the structure of FIG. 15C, a light-emitting display device capable of full color display may be manufactured in such a way that all of a plurality of light-emitting elements which is arranged is white light-emitting elements and a sealing substrate having a color filter or the like is arranged on the light-emitting element 7002. A material which exhibits light of a single color such as white can be formed and combined with a color filter or a color conversion layer, whereby full color display can be performed.

Needless to say, display of monochromatic light can also be performed. For example, a lighting device may be formed with the use of white light emission, or an area-color light-emitting device may be formed with the use of a single color light emission.

If necessary, an optical film such as a polarizing film including a circularly polarizing plate may be provided.

Although an organic EL element is described here as a light-emitting element, an inorganic EL element can also be provided as a light-emitting element.

Note that the example is described in which a transistor which controls the driving of a light-emitting element (a driving transistor) is electrically connected to the light-emitting element; however, a structure may be employed in which a transistor for current control is connected between the driving transistor and the light-emitting element.

A semiconductor device described in this embodiment is not limited to the structures illustrated in FIGS. 15A to 15C and can be modified in various ways based on the technical spirit of the present invention.

Figure 16A:
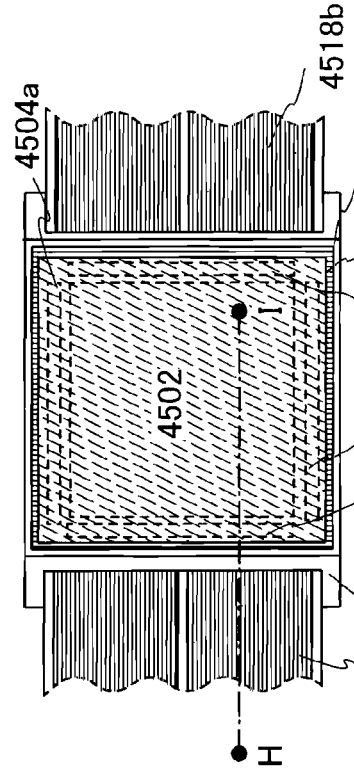
FIGS. 16A and 16B are a cross-sectional view and a plan view, respectively, illustrating an embodiment of the present invention.
Figure 16B:
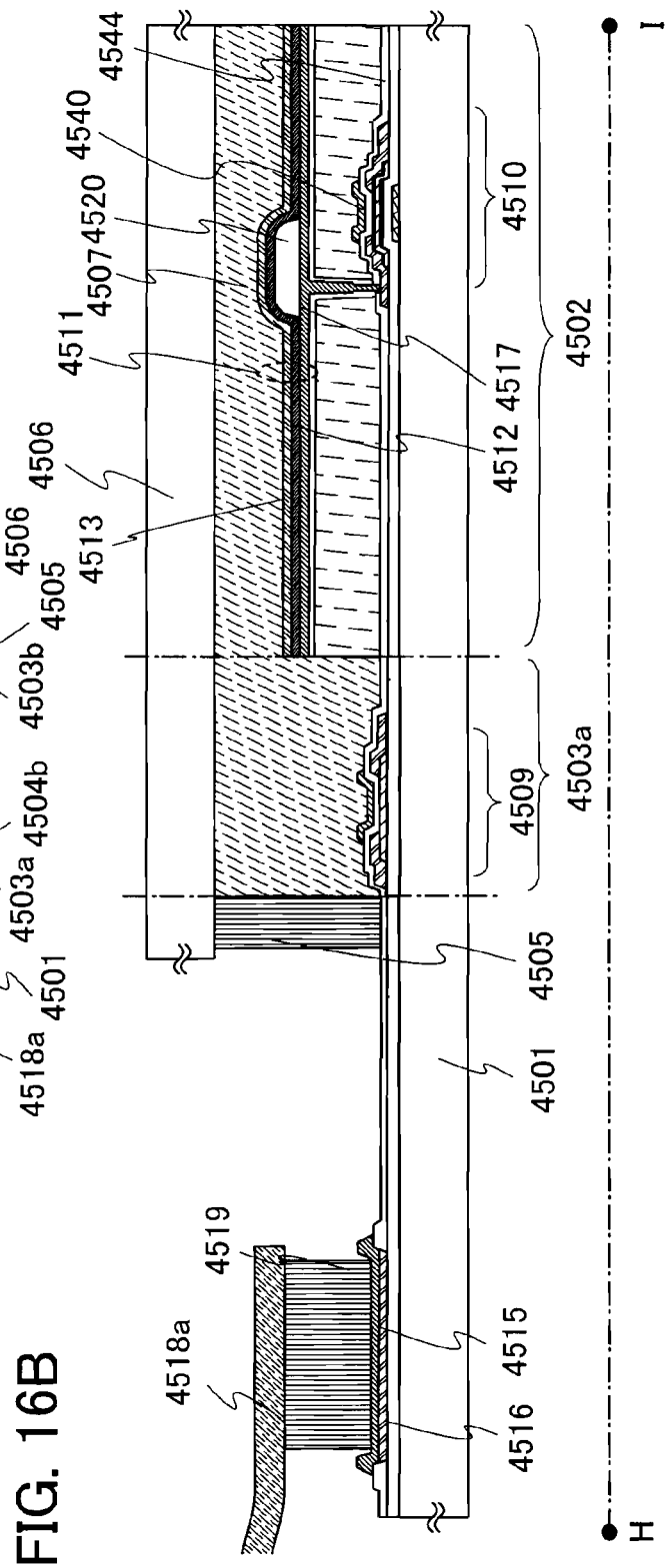

Next, the appearance and a cross section of a light-emitting display panel (also referred to as a light-emitting panel) which is an embodiment of a semiconductor device to which the transistors described in Embodiment 1 or 2 are applied will be described with reference to FIGS. 16A and 16B. FIG. 16A is a plan view of a panel in which a transistor and a light-emitting element are sealed between a first substrate and a second substrate with a sealant. FIG. 16B is a cross-sectional view taken along line H-I of FIG. 16A.

A sealant 4505 is provided to surround a pixel portion 4502, a signal line driver circuit 4503a, a signal line driver circuit 4503b, a scan line driver circuit 4504a, and a scan line driver circuit 4504b, which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a display device be thus packaged (sealed) with a protective film (such as a bonding film or an ultraviolet curable resin film) or a cover material with high air-tightness and little degasification so that the display device is not exposed to the outside air.

The pixel portion 4502, the signal line driver circuits 4503a and 4503b, and the scan line driver circuits 4504a and 4504b formed over the first substrate 4501 each include a plurality of transistors, and a transistor 4510 included in the pixel portion 4502 and a transistor 4509 included in the signal line driver circuit 4503a are illustrated as an example in FIG. 16B.

For each of the transistors 4509 and 4510, the highly reliable transistor described in Embodiment 1 or 2 which includes an In—Ga—Zn—O-based film as an oxide semiconductor layer can be applied. In this embodiment, the transistors 4509 and 4510 are n-channel transistors.

A conductive layer 4540 is provided over an insulating layer 4544 in a portion which overlaps with the channel formation region of the oxide semiconductor layer of the transistor 4510 in the pixel portion. When the conductive layer 4540 is provided in a portion which overlaps with the channel formation region of the oxide semiconductor layer, the amount of shift in the threshold voltage of the transistor 4510 between before and after a BT test can be reduced. The conductive layer 4540 may have a potential which is the same as or different from that of the gate electrode layer of the transistor 4510, and can function as a second gate electrode layer. The potential of the conductive layer 4540 may be GND, 0 V or in a floating state.

Reference numeral 4511 denotes a light-emitting element, and a first electrode layer 4517 that is a pixel electrode included in the light-emitting element 4511 is electrically connected to a source electrode layer or a drain electrode layer of the transistor 4510. Note that the structure of the light-emitting element 4511 is not limited to the structure described in this embodiment, which includes the first electrode layer 4517, an electroluminescent layer 4512, and a second electrode layer 4513. The structure of the light-emitting element 4511 can be changed as appropriate depending on the direction in which light is extracted from the light-emitting element 4511, or the like.

A partition 4520 is formed using an organic resin film, an inorganic insulating film, or organic polysiloxane. It is particularly preferable that the partition 4520 be formed of a photosensitive material to have an opening over the first electrode layer 4517 so that a sidewall of the opening is formed as an inclined surface with continuous curvature.

The electroluminescent layer 4512 may be formed using a single layer or a plurality of layers stacked.

A protective film may be formed over the second electrode layer 4513 and the partition 4520 in order to prevent oxygen, hydrogen, moisture, carbon dioxide, or the like from entering the light-emitting element 4511. As the protective film, a silicon nitride film, a silicon nitride oxide film, a DLC (diamond-like carbon) film, or the like can be formed.

In addition, a variety of signals and potentials are supplied to the signal line driver circuits 4503a and 4503b, the scan line driver circuits 4504a and 4504b, or the pixel portion 4502 from an FPC 4518a and an FPC 4518b.

In this embodiment, a connection terminal electrode 4515 is formed from the same conductive film as the first electrode layer 4517 included in the light-emitting element 4511, and a terminal electrode 4516 is formed from the same conductive film as the source and drain electrode layers included in the transistors 4509 and 4510.

The connection terminal electrode 4515 is electrically connected to a terminal included in the FPC 4518a through an anisotropic conductive film 4519.

The substrate located in the direction in which light is extracted from the light-emitting element 4511 needs to have a light-transmitting property. In that case, a light-transmitting material such as a glass plate, a plastic plate, a polyester film, or an acrylic resin film is used.

As the filler 4507, an ultraviolet curable resin or a thermosetting resin can be used, in addition to an inert gas such as nitrogen or argon. For example, PVC (polyvinyl chloride), an acrylic resin, polyimide, an epoxy resin, a silicone resin, PVB (polyvinyl butyral), or EVA (ethylene vinyl acetate) can be used. In this embodiment, nitrogen is used as the filler.

In addition, if needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scan line driver circuits 4504a and 4504b may be mounted as driver circuits formed using a single crystal semiconductor film or a polycrystalline semiconductor film over a substrate separately prepared. Alternatively, only the signal line driver circuits or part thereof, or only the scan line driver circuits or part thereof may be separately formed and mounted. This embodiment is not limited to the structure illustrated in FIGS. 16A and 16B.

Through the above process, a highly reliable light-emitting display device (display panel) as a semiconductor device can be manufactured.

Note that the structure described in this embodiment can be combined with any of the structures described in the other embodiments as appropriate.

Embodiment 9

A semiconductor device to which the transistors described in Embodiment 1 or 2 are applied can be used as electronic paper. Electronic paper can be used for electronic devices of a variety of fields as long as they can display data. For example, electronic paper can be applied to an electronic book reader (e-book), a poster, an advertisement in a vehicle such as a train, displays of various cards such as a credit card, and the like. Examples of the electronic devices are illustrated in FIGS. 17A and 17B and FIG. 18.

Figure 17A:
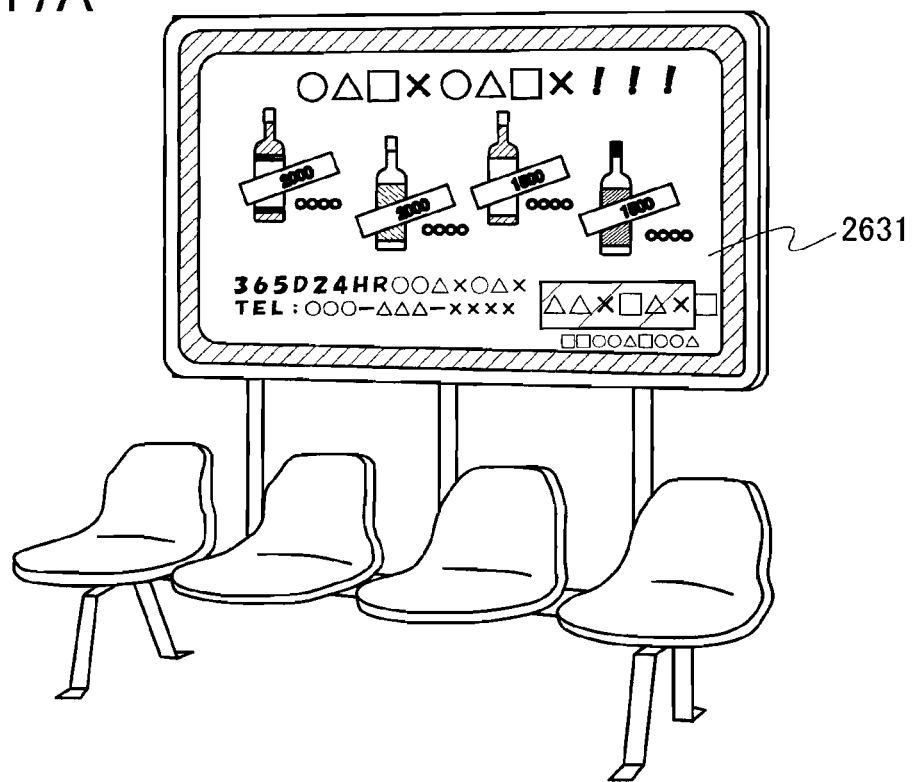
FIGS. 17A and 17B each illustrate an example of a usage mode of electronic paper.

FIG. 17A illustrates a poster 2631 formed using electronic paper. In the case where an advertising medium is printed paper, the advertisement is replaced by manpower; however, by using electronic paper, the advertising display can be changed in a short time. Further, an image can be stably displayed without display deterioration. Note that the poster may have a configuration capable of wirelessly transmitting and receiving data.

Figure 17B:
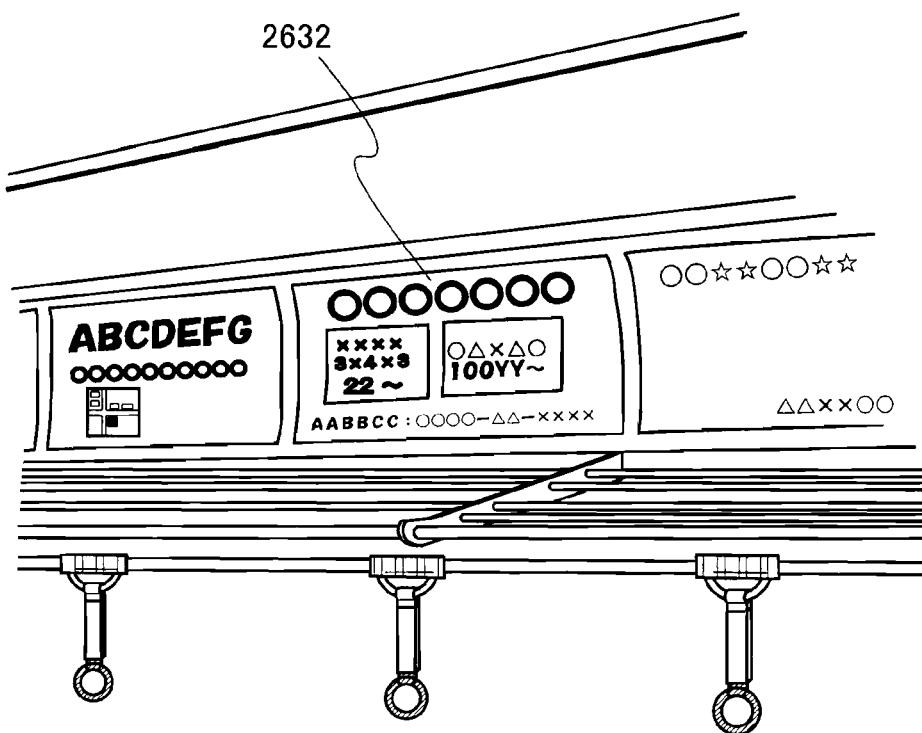

FIG. 17B illustrates an advertisement 2632 in a vehicle such as a train. In the case where an advertising medium is printed paper, the advertisement is replaced by manpower; however, by using electronic paper, the advertising display can be changed in a short time without a lot of manpower. Further an image can be stably displayed without display deterioration. Note that the advertisement in a vehicle may have a configuration capable of wirelessly transmitting and receiving data.

Figure 18:
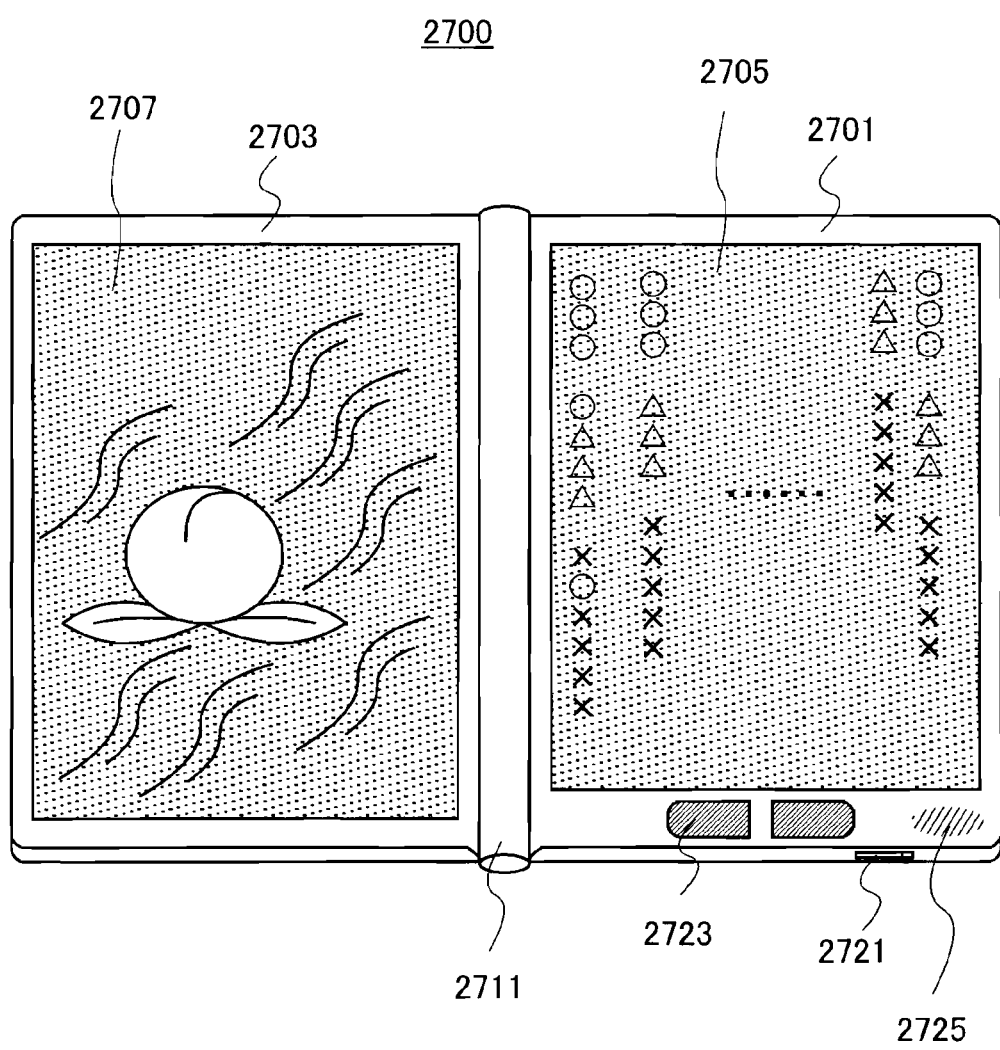
FIG. 18 is an external view illustrating an example of an electronic book reader.

FIG. 18 illustrates an example of an electronic book reader. For example, an electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can be operated like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 18) can display text and a display portion on the left side (the display portion 2707 in FIG. 18) can display graphics.

FIG. 18 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Further, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Further, the electronic book reader 2700 may have a function of an electronic dictionary.

The electronic book reader 2700 may have a configuration capable of wirelessly transmitting and receiving data. A structure may be employed in which a desired book data or the like is purchased and downloaded from an electronic book server wirelessly.

Note that the structure described in this embodiment can be combined with any of the structures described in the other embodiments as appropriate.

Embodiment 10

The semiconductor device including the transistors described in Embodiment 1 or 2 can be applied to a variety of electronic devices (including game machines). Examples of such electronic devices are a television device (also referred to as a television or a television receiver), a monitor of a computer or the like, a camera such as a digital camera or a digital video camera, a digital photo frame, a mobile phone (also referred to as a cellular phone or a mobile phone device), a portable game console, a portable information terminal, an audio playback device, a large-sized game machine such as a pinball machine, and the like.

Figure 19A:
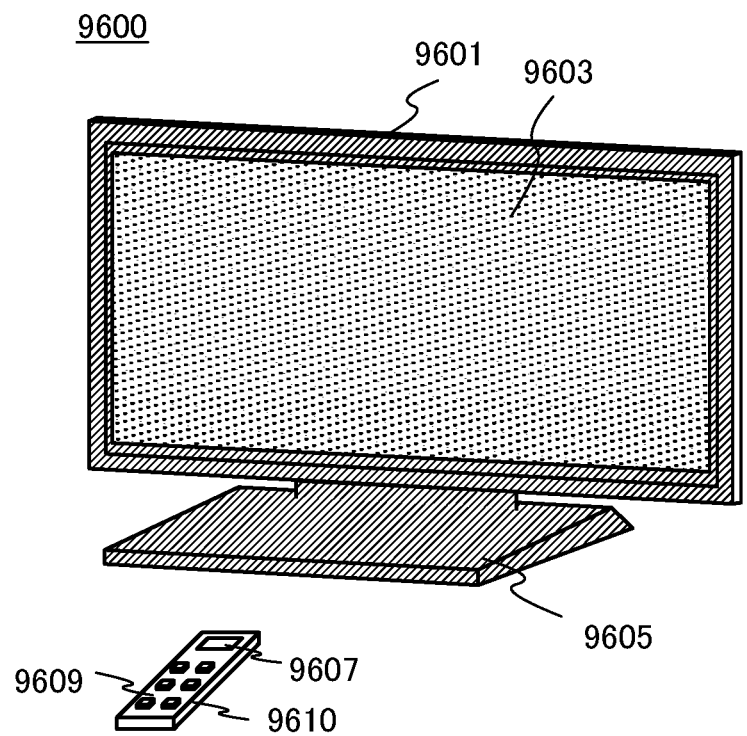
FIGS. 19A and 19B are external views illustrating examples of a television device and a digital photo frame, respectively.

FIG. 19A illustrates an example of a television device. In a television device 9600, a display portion 9603 is incorporated in a housing 9601. The display portion 9603 can display images. Here, the housing 9601 is supported by a stand 9605.

The television device 9600 can be operated with an operation switch of the housing 9601 or a separate remote controller 9610. Channels can be switched and volume can be controlled with operation keys 9609 of the remote controller 9610, whereby an image displayed on the display portion 9603 can be controlled. Moreover, the remote controller 9610 may be provided with a display portion 9607 for displaying data output from the remote controller 9610.

Note that the television device 9600 is provided with a receiver, a modem, and the like. With the receiver, general TV broadcasts can be received. Moreover, when the display device is connected to a communication network with or without wires via the modem, one-way (from a sender to a receiver) or two-way (e.g., between a sender and a receiver or between receivers) information communication can be performed.

Figure 19B:
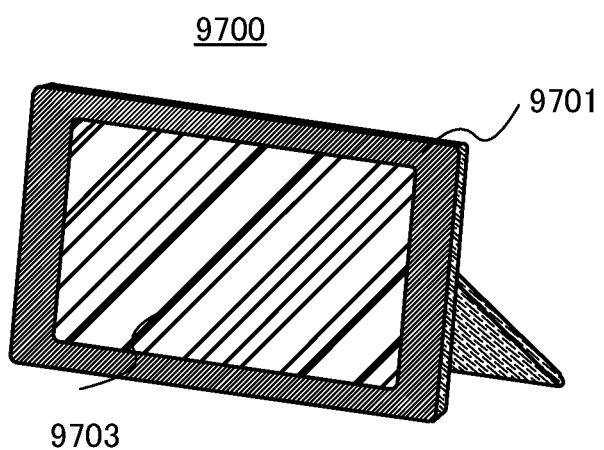

FIG. 19B illustrates an example of a digital photo frame. For example, in a digital photo frame 9700, a display portion 9703 is incorporated in a housing 9701. The display portion 9703 can display a variety of images. For example, the display portion 9703 can display image data taken with a digital camera or the like and function as a normal photo frame.

Note that the digital photo frame 9700 is provided with an operation portion, an external connection terminal (a USB terminal, a terminal connectable to a variety of cables such as a USB cable), a recording medium insertion portion, and the like. Although these components may be provided on the same surface as the display portion, it is preferable to provide them on the side surface or the back surface for design aesthetics. For example, a memory that stores image data taken with a digital camera is inserted into the recording medium insertion portion of the digital photo frame 9700 and the data is loaded, whereby the image can be displayed on the display portion 9703.

The digital photo frame 9700 may be configured to transmit and receive data wirelessly. Through wireless communication, desired image data can be loaded to be displayed.

Figure 20A:
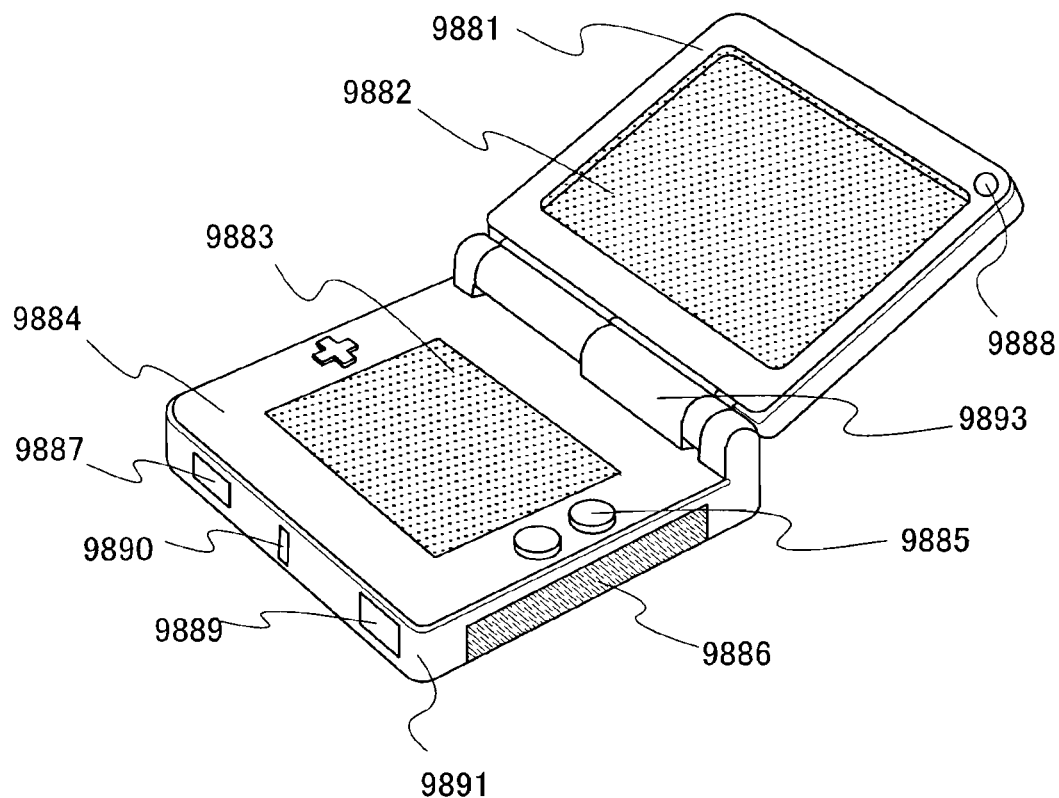
FIGS. 20A and 20B are external views illustrating examples of game machines.

FIG. 20A illustrates a portable game console including two housings, a housing 9881 and a housing 9891 which are jointed with a joint portion 9893 so that the portable game console can be opened or folded. A display portion 9882 and a display portion 9883 are incorporated in the housing 9881 and the housing 9891, respectively. In addition, the portable game console illustrated in FIG. 20A is provided with a speaker portion 9884, a recording medium insertion portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, smell, or infrared ray), and a microphone 9889), and the like. Needless to say, the structure of the portable game console is not limited to the above and another structure which is provided with at least a semiconductor device according to the present invention can be employed. The portable game console may include an additional accessory as appropriate. The portable game console illustrated in FIG. 20A has a function of reading a program or data stored in a recording medium to display it on the display portion, and a function of sharing data with another portable game console via wireless communication. Note that a function of the portable game console illustrated in FIG. 20A is not limited to those described above, and the portable game console can have a variety of functions.

Figure 20B:
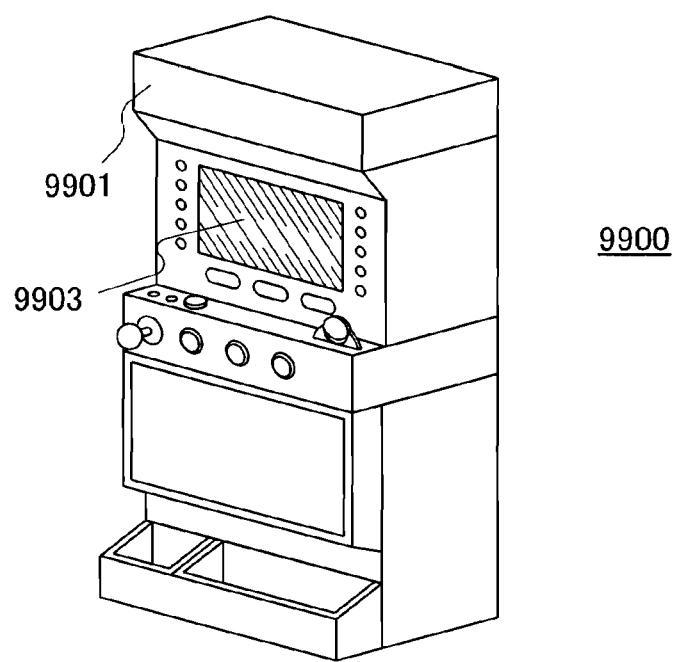

FIG. 20B illustrates an example of a slot machine which is a large-sized game machine. In a slot machine 9900, a display portion 9903 is incorporated in a housing 9901. In addition, the slot machine 9900 includes an operation means such as a start lever or a stop switch, a coin slot, a speaker, and the like. Needless to say, the structure of the slot machine 9900 is not limited to the above and another structure which is provided with at least the semiconductor device according to the present invention may be employed. The slot machine 9900 may include an additional accessory as appropriate.

Figure 21A:
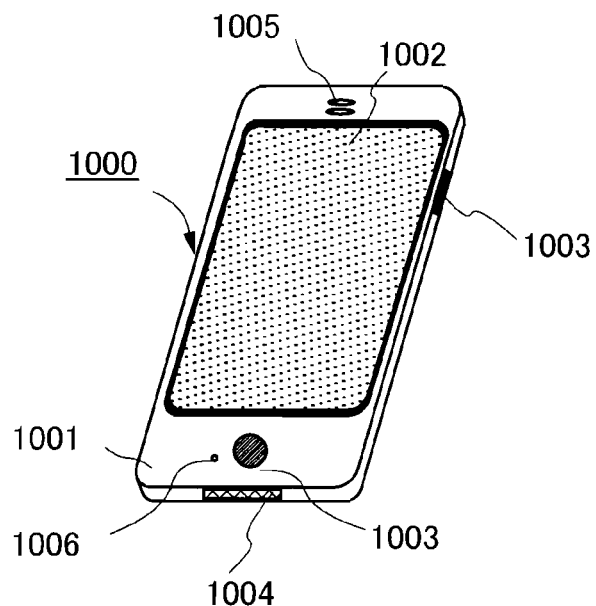
FIGS. 21A and 21B are external views illustrating examples of mobile phones.

FIG. 21A illustrates an example of a mobile phone. A mobile phone 1000 includes a housing 1001 in which a display portion 1002 is incorporated, an operation button 1003, an external connection port 1004, a speaker 1005, a microphone 1006, and the like.

Information can be input to the mobile phone 1000 illustrated in FIG. 21A by touching the display portion 1002 with a finger or the like. Moreover, users can make a call or write an e-mail by touching the display portion 1002 with their fingers or the like.

There are mainly three screen modes of the display portion 1002. The first mode is a display mode mainly for displaying images. The second mode is an input mode mainly for inputting information such as text. The third mode is a display-and-input mode in which two modes of the display mode and the input mode are combined.

For example, in the case of making a call or writing an e-mail, the display portion 1002 may be placed into a text input mode mainly for inputting text, and characters displayed on a screen can be input. In this case, it is preferable to display a keyboard or number buttons on almost the entire area of the screen of the display portion 1002.

When a detection device including a sensor which detects inclination, such as a gyroscope or an acceleration sensor, is provided inside the mobile phone 1000, display on the screen of the display portion 1002 can be automatically switched by detecting the direction of the mobile phone 1000 (whether the mobile phone 1000 is placed horizontally or vertically for a landscape mode or a portrait mode).

Further, the screen modes are switched by touching the display portion 1002 or operating the operation button 1003 of the housing 1001. Alternatively, the screen modes can be switched depending on the kinds of image displayed on the display portion 1002. For example, when a signal for an image displayed on the display portion is data of moving images, the screen mode is switched to the display mode. When the signal is text data, the screen mode is switched to the input mode.

Further, in the input mode, a signal is detected by an optical sensor in the display portion 1002 and if input by touching the display portion 1002 is not performed for a certain period, the screen mode may be controlled so as to be switched from the input mode to the display mode.

The display portion 1002 can also function as an image sensor. For example, an image of a palm print, a fingerprint, or the like is taken when the display portion 1002 is touched with the palm or the finger, whereby personal authentication can be performed. Moreover, when a backlight or sensing light source which emits near-infrared light is provided in the display portion, an image of finger veins, palm veins, or the like can be taken.

Figure 21B:
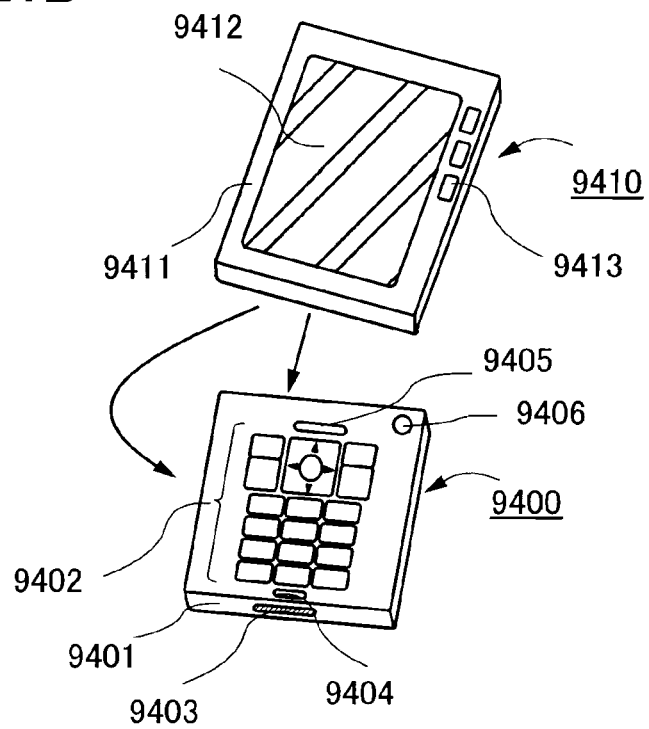

FIG. 21B illustrates another example of a mobile phone. The mobile phone in FIG. 21B has a display device 9410 provided with a housing 9411 including a display portion 9412 and operation buttons 9413, and a communication device 9400 provided with a housing 9401 including operation buttons 9402, an external input terminal 9403, a microphone 9404, a speaker 9405, and a light-emitting portion 9406 that emits light when a phone call is received. The display device 9410 having a display function can be detachably attached to the communication device 9400 having a phone function in two directions represented by the arrows. Thus, the display device 9410 and the communication device 9400 can be attached to each other along their short sides or long sides. In addition, when only the display function is needed, the display device 9410 can be detached from the communication device 9400 and used alone. Images or input information can be transmitted or received by wireless or wire communication between the communication device 9400 and the display device 9410, each of which has a rechargeable battery.

Note that the structure described in this embodiment can be combined with any of the structures described in the other embodiments as appropriate.

This application is based on Japanese Patent Application serial no. 2009-255315 filed with Japan Patent Office on Nov. 6, 2009, the entire contents of which are hereby incorporated by reference.

EXPLANATION OF REFERENCE

10: pulse output circuit, 11: wiring, 12: wiring, 13: wiring, 14: wiring, 15: wiring, 16: wiring, 17: wiring, 21: input terminal, 22: input terminal, 23: input terminal, 24: input terminal, 25: input terminal, 26: output terminal, 27: output terminal, 31: transistor, 32: transistor, 33: transistor, 34: transistor, 35: transistor, 36: transistor, 37: transistor, 38: transistor, 39: transistor, 40: transistor, 41: transistor, 51: power supply line, 52: power supply line, 53: power supply line, 61: period, 62: period, 63: period, 64: period, 65: period, 400: substrate, 402: insulating layer, 403: oxide semiconductor film, 404*a*: oxide semiconductor layer, 404*b*: oxide semiconductor layer, 405*a*: crystalline region, 405*b*: crystalline region, 411: terminal, 412: connection electrode, 414: terminal, 415: conductive layer, 416: electrode layer, 418: conductive layer, 421: gate electrode layer, 428: insulating layer, 440: transistor, 442: connection electrode layer, 450: transistor, 451: gate electrode layer, 455*a*: source electrode layer, 455*b*: drain electrode layer, 455*c*: source electrode layer, 455*d*: drain electrode layer, 460: transistor, 470: transistor, 480: oxide conductive layer, 482: metal conductive film, 484*a*: source electrode layer, 484*b*: drain electrode layer, 486*a*: oxide conductive layer, 486*b*: oxide conductive layer, 486*c*: source electrode layer, 486*d*: drain electrode layer, 580: substrate, 581: transistor, 583: insulating layer, 585: insulating layer, 587: electrode layer, 588: electrode layer, 589: spherical particle, 590*a*: black region, 590*b*: white region, 594: cavity, 595: filler, 596: substrate, 1000: mobile phone, 1001: housing, 1002: display portion, 1003: operation button, 1004: external connection port, 1005: speaker, 1006: microphone, 2600: transistor substrate, 2601: counter substrate, 2602: sealant, 2603: pixel portion, 2604: display element, 2605: coloring layer, 2606: polarizing plate, 2607: polarizing plate, 2608: wiring circuit portion, 2609: flexible wiring board, 2610: cold cathode tube, 2611: reflective plate, 2612: circuit board, 2613: diffusion plate, 2631: poster, 2632: advertisement in a vehicle, 2700: electronic book reader, 2701: housing, 2703: housing, 2705: display portion, 2707: display portion, 2711: hinge, 2721: power switch, 2723: operation key, 2725: speaker, 4001: substrate, 4002: pixel portion, 4003: signal line driver circuit, 4004: scan line driver circuit, 4005: sealant, 4006: substrate, 4008: liquid crystal layer, 4010: transistor, 4011: transistor, 4013: liquid crystal element, 4015: connection terminal electrode, 4016: terminal electrode, 4018: FPC, 4019: anisotropic conductive film, 4020: insulating layer, 4021: insulating layer, 4030: pixel electrode layer, 4031: counter electrode layer, 4032: insulating layer, 4033: insulating layer, 4035: spacer, 4040: conductive layer, 4042: conductive layer, 4501: substrate, 4502: pixel portion, 4503*a*: signal line driver circuit, 4503*b*: signal line driver circuit, 4504*a*: scan line driver circuit, 4504*b*: scan line driver circuit, 4505: sealant, 4506: substrate, 4507: filler, 4509: transistor, 4510: transistor, 4511: light-emitting element, 4512: electroluminescent layer, 4513: electrode layer, 4515: connection terminal electrode, 4516: terminal electrode, 4517: electrode layer, 4518*a*: FPC, 4518*b*: FPC, 4519: anisotropic conductive film, 4520: partition, 4540: conductive layer, 4544: insulating layer, 5300: substrate, 5301: pixel portion, 5302: scan line driver circuit, 5303: scan line driver circuit, 5304: signal line driver circuit, 5305: timing control circuit, 5601: shift register, 5602: switching circuit, 5603: transistor, 5604: wiring, 5605: wiring, 6400: pixel, 6401: switching transistor, 6402: driving transistor, 6403: capacitor, 6404: light-emitting element, 6405: signal line, 6406: scan line, 6407: power supply line, 6408: common electrode, 7001: transistor, 7002: light-emitting element, 7003: electrode, 7004: EL layer, 7005: electrode, 7009: partition, 7010: substrate, 7011: driving transistor, 7012: light-emitting element, 7013: electrode, 7014: EL layer, 7015: electrode, 7016: light-blocking film, 7017: conductive film, 7019: partition, 7020: substrate, 7021: driving transistor, 7022: light-emitting element, 7023: electrode, 7024: EL layer, 7025: electrode, 7027: conductive film, 7029: partition, 7030: gate insulating layer, 7031: oxide insulating layer, 7032: insulating layer, 7033: color filter layer, 7034: overcoat layer, 7035: protective insulating layer, 7040: gate insulating layer, 7041: oxide insulating layer, 7042: insulating layer, 7043: color filter layer, 7044: overcoat layer, 7045: protective insulating layer, 7051: oxide insulating layer, 7052: protective insulating layer, 7053: planarization insulating layer, 7055: insulating layer, 9400: communication device, 9401: housing, 9402: operation buttons, 9403: external input terminal, 9404: microphone, 9405: speaker, 9406: light-emitting portion, 9410: display device, 9411: housing, 9412: display portion, 9413: operation buttons, 9600: television device, 9601: housing, 9603: display portion, 9605: stand, 9607: display portion, 9609: operation keys, 9610: remote controller, 9700: digital photo frame, 9701: housing, 9703: display portion, 9881: housing, 9882: display portion, 9883: display portion, 9884: speaker portion, 9885: operation keys, 9886: recording medium insertion portion, 9887: connection terminal, 9888: sensor, 9889: microphone, 9890: LED lamp, 9891: housing, 9893: joint portion, 9900: slot machine, 9901: housing, and 9903: display portion.

The invention claimed is:

1. A semiconductor device comprising:
   a first transistor and a second transistor;
   the first transistor comprising:
      a first conductive layer over a substrate;
      a first insulating layer over the first conductive layer;
      a first oxide semiconductor layer over the first insulating layer;
      a first source electrode layer and a first drain electrode layer each of which has a region overlapping with part of the first oxide semiconductor layer; and
      a second insulating layer having a region in contact with part of the first oxide semiconductor layer;
   the second transistor comprising:
      the first insulating layer over the substrate;
      a second oxide semiconductor layer over the first insulating layer;
      a second source electrode layer and a second drain electrode layer each of which has a region overlapping with part of the second oxide semiconductor layer; and
      the second insulating layer having a region in contact with part of the second oxide semiconductor layer; and
   a second conductive layer over the second insulating layer,
   wherein a surface portion of the first oxide semiconductor layer comprises a crystal region,
   wherein the crystal region comprises a first region in contact with the first source electrode layer, a second region in contact with the first drain electrode layer, and a third region, which is sandwiched between the first region and the second region and overlaps with the first conductive layer, in contact with the second insulating layer, and
   wherein the crystal region is c-axis-aligned.

2. The semiconductor device according to claim 1, wherein the first oxide semiconductor layer comprises indium.

3. The semiconductor device according to claim 2, wherein the first oxide semiconductor layer further comprises gallium and zinc.

4. The semiconductor device according to claim 1, wherein the crystal region contains a crystal having a particle size greater than or equal to 1 nm and less than or equal to 20 nm.

5. The semiconductor device according to claim 1, wherein each of the first conductive layer, the first source electrode layer, the first drain electrode layer, the second source electrode layer, and the second drain electrode layer is a conductive layer having a light transmitting property.

6. The semiconductor device according to claim 1, wherein the first source electrode layer, the second source electrode layer, the first drain electrode layer, and the second drain electrode layer comprise titanium.

7. The semiconductor device according to claim 1, wherein the first source electrode layer, the second source electrode layer, the first drain electrode layer, and the second drain electrode layer comprise an element selected from chromium, tantalum, molybdenum, tungsten, and a combination thereof.

8. The semiconductor device according to claim 1,
wherein the first oxide semiconductor layer comprises a channel formation region, and
wherein a donor concentration of the channel formation region is lower than or equal to $1 \times 10^{18}/cm^3$.

9. A semiconductor device comprising:
a first transistor and a second transistor;
the first transistor comprising:
a first conductive layer over a substrate;
a first insulating layer over the first conductive layer;
a first oxide semiconductor layer over the first insulating layer;
a first source electrode layer and a first drain electrode layer each of which has a region overlapping with part of the first oxide semiconductor layer; and
a second insulating layer having a region in contact with part of the first oxide semiconductor layer;
the second transistor comprising:
the first insulating layer over the substrate;
a second oxide semiconductor layer over the first insulating layer;
a second source electrode layer and a second drain electrode layer each of which has a region overlapping with part of the second oxide semiconductor layer; and
the second insulating layer having a region in contact with part of the second oxide semiconductor layer; and
a second conductive layer over the second insulating layer,
wherein a surface portion of the first oxide semiconductor layer comprises a first crystal region,
wherein the first crystal region comprises a first region in contact with the first source electrode layer, a second region in contact with the first drain electrode layer, and a third region, which is sandwiched between the first region and the second region and overlaps with the first conductive layer, in contact with the second insulating layer,
wherein a surface portion of the second oxide semiconductor layer comprises a second crystal region,
wherein the second crystal region comprises a fourth region in contact with the second source electrode layer, a fifth region in contact with the second drain electrode layer, and a sixth region, which is sandwiched between the fourth region and the fifth region and overlaps with the second conductive layer, in contact with the second insulating layer, and
wherein each of the first crystal region and the second crystal region is c-axis-aligned.

10. The semiconductor device according to claim 9, wherein the first oxide semiconductor layer comprises indium.

11. The semiconductor device according to claim 10, wherein the first oxide semiconductor layer further comprises gallium and zinc.

12. The semiconductor device according to claim 9, wherein each of the first and the second crystal region contains a crystal having a particle size greater than or equal to 1 nm and less than or equal to 20 nm.

13. The semiconductor device according to claim 9, wherein each of the first conductive layer, the first source electrode layer, the first drain electrode layer, the second source electrode layer, and the second drain electrode layer is a conductive layer having a light transmitting property.

14. The semiconductor device according to claim 9, wherein the first source electrode layer, the second source electrode layer, the first drain electrode layer, and the second drain electrode layer comprise titanium.

15. The semiconductor device according to claim 9, wherein the first source electrode layer, the second source electrode layer, the first drain electrode layer, and the second drain electrode layer comprise an element selected from chromium, tantalum, molybdenum, tungsten, and a combination thereof.

16. The semiconductor device according to claim 9,
wherein the first oxide semiconductor layer comprises a channel formation region, and
wherein a donor concentration of the channel formation region is lower than or equal to $1 \times 10^{18}/cm^3$.

17. A display device comprising:
a first transistor and a second transistor each of which is over a substrate,
the first transistor comprising:
a first conductive layer;
a first oxide semiconductor layer over the first conductive layer;
a first source electrode layer and a first drain electrode layer each of which comprises a region overlapping with the first oxide semiconductor layer; and
a second conductive layer over the first oxide semiconductor layer,
the second transistor comprising:
a second oxide semiconductor layer;
a second source electrode layer and a second drain electrode layer each of which comprises a region overlapping with the second oxide semiconductor layer; and
a third conductive layer over the second oxide semiconductor layer,
wherein the first oxide semiconductor layer comprises a region including a nanocrystal,
wherein the first oxide semiconductor layer comprises a region overlapping with the first conductive layer and the second conductive layer between the first source electrode layer and the first drain electrode layer, and
wherein the second oxide semiconductor layer comprises a region overlapping with the third conductive layer between the second source electrode layer and the second drain electrode layer.

18. The display device according to claim 17, wherein the nanocrystal has a particle size greater than or equal to 1 nm and less than or equal to 20 nm.

19. The display device according to claim 17, wherein an end portion of the first oxide semiconductor layer has a tapered shape.

20. The display device according to claim 17, wherein the first conductive layer contains an element selected from Al, Cr, Ta, Ti, Mo, and W.

21. The display device according to claim 17, wherein the first source electrode layer and the first drain electrode layer contain an element selected from Al, Cu, Cr, Ta, Ti, Mo, and W.

22. The display device according to claim 17, wherein the first oxide semiconductor layer has a thickness greater than or equal to 5 nm and less than or equal to 200 nm.

23. The display device according to claim 17,
wherein the first oxide semiconductor layer comprises a first region including a first crystal and a second region including a second crystal, and
wherein a crystal state of the first region is different from the crystal state of the second region.

24. The display device according to claim 17,
wherein the first oxide semiconductor layer comprises a region overlapping with the first conductive layer with a first insulating layer provided therebetween, and
wherein the first insulating layer comprises silicon oxide.

25. The display device according to claim 17,
wherein the first oxide semiconductor layer comprises a region overlapping with the second conductive layer with a second insulating layer provided therebetween, and
wherein the second insulating layer comprises silicon oxide.

26. A display device comprising:
a first transistor and a second transistor each of which is over a substrate,
the first transistor comprising:
a first conductive layer;
a first oxide semiconductor layer over the first conductive layer;
a first source electrode layer and a first drain electrode layer each of which comprises a region overlapping with the first oxide semiconductor layer; and
a second conductive layer over the first oxide semiconductor layer,
the second transistor comprising:
a second oxide semiconductor layer;
a second source electrode layer and a second drain electrode layer each of which comprises a region overlapping with the second oxide semiconductor layer; and
a third conductive layer over the second oxide semiconductor layer,
wherein the first oxide semiconductor layer comprises a region including a crystal with a particle size greater than or equal to 1 nm and less than or equal to 20 nm,
wherein the first oxide semiconductor layer comprises a region overlapping with the first conductive layer and the second conductive layer between the first source electrode layer and the first drain electrode layer, and
wherein the second oxide semiconductor layer comprises a region overlapping with the third conductive layer between the second source electrode layer and the second drain electrode layer.

27. The display device according to claim 26, wherein an end portion of the first oxide semiconductor layer has a tapered shape.

28. The display device according to claim 26, wherein the first conductive layer contains an element selected from Al, Cr, Ta, Ti, Mo, and W.

29. The display device according to claim 26, wherein the first source electrode layer and the first drain electrode layer contain an element selected from Al, Cu, Cr, Ta, Ti, Mo, and W.

30. The display device according to claim 26, wherein the first oxide semiconductor layer has a thickness greater than or equal to 5 nm and less than or equal to 200 nm.

31. The display device according to claim 26,
wherein the first oxide semiconductor layer comprises a first region including a first crystal and a second region including a second crystal, and
wherein a crystal state of the first region is different from the crystal state of the second region.

32. The display device according to claim 26,
wherein the first oxide semiconductor layer comprises a region overlapping with the first conductive layer with a first insulating layer provided therebetween, and
wherein the first insulating layer comprises silicon oxide.

33. The display device according to claim 26,
wherein the first oxide semiconductor layer comprises a region overlapping with the second conductive layer with a second insulating layer provided therebetween, and
wherein the second insulating layer comprises silicon oxide.

* * * * *